(12) United States Patent
Chae et al.

(10) Patent No.: US 12,176,378 B2
(45) Date of Patent: Dec. 24, 2024

(54) LED DISPLAY PANEL AND LED DISPLAY APPARATUS HAVING THE SAME

(71) Applicant: SEOUL VIOSYS CO., LTD., Ansan-si (KR)

(72) Inventors: Jong Hyeon Chae, Ansan-si (KR); Seom Geun Lee, Ansan-si (KR); Seong Kyu Jang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 16/943,373

(22) Filed: Jul. 30, 2020

(65) Prior Publication Data

US 2021/0043678 A1 Feb. 11, 2021

Related U.S. Application Data

(60) Provisional application No. 62/883,773, filed on Aug. 7, 2019.

(51) Int. Cl.
*H01L 27/15* (2006.01)
(52) U.S. Cl.
CPC .................. *H01L 27/153* (2013.01)
(58) Field of Classification Search
CPC .................................................. H01L 27/153
See application file for complete search history.

(56) References Cited

U.S. PATENT DOCUMENTS

| 10,170,666 B2* | 1/2019 | Cha ..................... H01L 33/08 |
| 2006/0027820 A1* | 2/2006 | Cao ..................... H01L 33/382 257/89 |
| 2008/0107863 A1* | 5/2008 | Ikeda .................. H01L 21/4857 428/137 |
| 2009/0078955 A1 | 3/2009 | Fan et al. |

(Continued)

FOREIGN PATENT DOCUMENTS

| JP | 2015-012244 A | 1/2015 |
| KR | 10-2009-0004403 | 1/2009 |
| KR | 10-2017-0115142 | 10/2017 |

OTHER PUBLICATIONS

International Search Report dated Nov. 18, 2020, issued in International Patent Application No. PCT/KR2020/010276 (with English translation).

(Continued)

*Primary Examiner* — Monica D Harrison
*Assistant Examiner* — Christopher A Culbert
(74) *Attorney, Agent, or Firm* — Oblon, McClelland, Maier & Neustadt, L.L.P.

(57) ABSTRACT

A display panel including a circuit board having pads thereon, and a plurality of pixel regions arranged on the circuit board, each of the pixel regions including a first LED stack disposed on the circuit board, a first bonding layer disposed between the first LED stack and the circuit board, a second LED stack disposed on the first LED stack, a third LED stack disposed on the second LED stack, first through-vias passing through the first LED stack and the first bonding (Continued)

layer, second through-vias passing through the second LED stack, and third through-vias passing through the third LED stack, in which the first through-vias pass through the first LED stack and the first bonding layer, and are connected to the pads of the circuit board.

22 Claims, 48 Drawing Sheets

(56) References Cited

U.S. PATENT DOCUMENTS

| | | | |
|---|---|---|---|
| 2009/0272989 A1 | 11/2009 | Shum et al. | |
| 2015/0001561 A1* | 1/2015 | Katsuno | H01L 33/382 |
| | | | 257/90 |
| 2016/0336482 A1 | 11/2016 | Lu et al. | |
| 2018/0158752 A1* | 6/2018 | Choi | H01L 23/3677 |
| 2018/0182699 A1* | 6/2018 | Lai | H01L 23/5383 |
| 2019/0097088 A1* | 3/2019 | Huppmann | H01L 24/00 |
| 2019/0165037 A1 | 5/2019 | Chae et al. | |
| 2019/0165207 A1 | 5/2019 | Kim et al. | |
| 2019/0189596 A1* | 6/2019 | Chae | H01L 33/50 |
| 2019/0189681 A1 | 6/2019 | Chae et al. | |
| 2019/0198485 A1 | 6/2019 | Chae et al. | |

OTHER PUBLICATIONS

Extended European Search Report dated Aug. 7, 2023, issued to European Patent Application No. 20849057.3.

Japanese Office Action issued in Japanese Patent Application No. 2022-506893 on May 26, 2024, citing documents 1-3 and 15 therein.

* cited by examiner

LED DISPLAY PANEL AND LED DISPLAY APPARATUS HAVING THE SAME

CROSS-REFERENCE TO RELATED APPLICATION

This application claims the benefit of U.S. Provisional Patent Application No. 62/883,773 filed on Aug. 7, 2019, which is hereby incorporated by reference for all purposes as if fully set forth herein.

BACKGROUND

Field

Exemplary embodiments of the invention relate generally to an LED display panel and an LED display apparatus having the same.

Discussion of the Background

As an inorganic light source, light emitting diodes have been used in various fields including displays, vehicular lamps, general lighting, and the like. With various advantages of light emitting diodes, such as longer lifespan, lower power consumption, and rapid response than conventional light sources, light emitting diodes have been replacing conventional light sources.

Light emitting diodes have been generally used as backlight light sources in display apparatuses. However, LED displays that directly display images using the light emitting diodes have been recently developed.

In general, a display apparatus realizes various colors through mixture of blue, green, and red light. In order to display various images, the display apparatus includes a plurality of pixels, each of which includes sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, it is possible to provide a display apparatus by arranging individual LED chips emitting blue, green, and red light on a two-dimensional plane.

Since LEDs used in the conventional large-sized electronic display are manufactured in packages, and the LED packages are arranged in units of pixels, packages are individually mounted on a circuit board. However, a display of a small electronic product, such as a smart watch or a mobile phone, a VR headset, or AR glasses, or a display such as a TV may utilize micro LEDs of a smaller size than those in a conventional LED package to implement clear image quality.

Small-sized LEDs are typically difficult to handle, and thus, it is difficult to mount them individually on a circuit board. As such, a method of forming a plurality of LEDs using semiconductor layers that are grown on a substrate, and transferring the LEDs onto a display circuit board in a group at pixel intervals has been studied. However, while transferring multiple LEDs in a group, a failure may occur in some of the LEDs. For example, due to a difference in thermal expansion coefficients between the display circuit board and a support substrate supporting the LEDs, some of LEDs being transferred may not be electrically connected to pads of the display circuit board. In this case, the defective LEDs may need to be replaced good LEDs, but it is extremely difficult to replace the defective LEDs due to their small size.

Meanwhile, since the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, which may deteriorate the brightness of the pixels.

The above information disclosed in this Background section is only for understanding of the background of the inventive concepts, and, therefore, it may contain information that does not constitute prior art.

SUMMARY

LED display panels constructed according to exemplary embodiments of the invention are capable of providing reliable electrical connection between a plurality of LEDs for a display and pads on a circuit board.

Exemplary embodiments also provide an LED display panel that does not need to transfer LEDs to a circuit board and a display apparatus having the same.

Exemplary embodiments further provide an LED display panel capable of increasing an area of each sub-pixel in a restricted pixel area, and a method of manufacturing a display apparatus having the same.

Additional features of the inventive concepts will be set forth in the description which follows, and in part will be apparent from the description, or may be learned by practice of the inventive concepts.

A display panel according to an exemplary embodiment includes a circuit board having pads thereon, and a plurality of pixel regions arranged on the circuit board, each of the pixel regions including a first LED stack disposed on the circuit board, a first bonding layer disposed between the first LED stack and the circuit board, a second LED stack disposed on the first LED stack, a third LED stack disposed on the second LED stack, first through-vias passing through the first LED stack and the first bonding layer, second through-vias passing through the second LED stack, and third through-vias passing through the third LED stack, in which the first through-vias pass through the first LED stack and the first bonding layer, and are connected to the pads of the circuit board.

The display panel may further include a reflection layer disposed between the first LED stack and the circuit board.

The reflection layer may be spaced apart from the pads, and located in a region surrounded by the pads of the circuit board under the first LED stack.

The display panel may further include a second bonding layer disposed between the first LED stack and the second LED stack, and a third bonding layer disposed between the second LED stack and the third LED stack, in which the second through-vias may pass through the third bonding layer, and the third through-vias may pass through the third bonding layer.

The display panel may further include first connection pads disposed between the first LED stack and the second LED stack, in which a first one of the first connection pads may electrically connect a first one of the first through-vias to a first conductivity type semiconductor layer of the first LED stack, and a second one of the first connection pads may electrically connect a second one of the first through-vias to a second conductivity type semiconductor layer of the first LED stack.

The display panel may further include a first ohmic electrode in ohmic contact with the first conductivity type semiconductor layer of the first LED stack, in which the first one of the first connection pads may be electrically connected to the first conductivity type semiconductor layer of the first LED stack through the first ohmic electrode.

The display panel may further include a first transparent electrode in ohmic contact with the second conductivity type semiconductor layer of the first LED stack between the first LED stack and the second LED stack, in which the second one of the first connection pads may be electrically connected to the second conductivity type semiconductor layer of the first LED stack through the first transparent electrode.

The display panel may further include a lower electrode in ohmic contact with the second conductivity type semiconductor layer of the first LED stack between the first LED stack and the circuit board, in which the second one of the first connection pads may be electrically connected to the second conductivity type semiconductor layer of the first LED stack through the lower electrode.

The lower electrode may include a reflection layer covering substantially an entire surface of the second conductivity type semiconductor layer of the first LED stack.

A third one of the first through-vias may pass through the first LED stack and electrically connected to the lower electrode, and the second one of the first connection pads may be connected to the third one of the first through-vias.

The display panel may further include second connection pads disposed between the second LED stack and the third LED stack, in which a first one of the second connection pads may electrically connect a first one of the second through-vias to a first conductivity type semiconductor layer of the second LED stack, and a second one of the second connection pads may electrically connect a second one of the second through-vias to a second conductivity type semiconductor layer of the second LED stack.

The display panel may further include a second ohmic electrode in ohmic contact with the first conductivity type semiconductor layer of the second LED stack, in which the first one of the second connection pads may be electrically connected to the first conductivity type semiconductor layer of the second LED stack through the second ohmic electrode.

The display panel may further include a second transparent electrode in ohmic contact with the second conductivity type semiconductor layer of the second LED stack, in which the second one of the second connection pads may be electrically connected to the second conductivity type semiconductor layer of the second LED stack through the second transparent electrode.

The second transparent electrode may be disposed between the first LED stack and the second LED stack, a third one of the second through-vias may pass through the second LED stack and electrically connected to the second transparent electrode, and the second one of the second connection pads may be connected to the third one of the second through-vias.

The display panel may further include third connection pads disposed on the third LED stack, in which a first one of the third connection pads may electrically connect a first one of the third through-vias to a first conductivity type semiconductor layer of the third LED stack, and a second one of the third connection pads may electrically connect a second one of the third through-vias to a second conductivity type semiconductor layer of the third LED stack.

The display panel may further include a third ohmic electrode in ohmic contact with the first conductivity type semiconductor layer of the third LED stack, in which the first one of the third connection pads may be electrically connected to the first conductivity type semiconductor layer of the third LED stack through the third ohmic electrode.

The display panel may further include a third transparent electrode in ohmic contact with the second conductivity type semiconductor layer of the third LED stack, in which the second one of the third connection pads may be electrically connected to the second conductivity type semiconductor layer of the third LED stack through the third transparent electrode.

The third transparent electrode may be disposed between the second LED stack and the third LED stack, a third one of the third through-vias may pass through the third LED stack and electrically connected to the third transparent electrode, and the second one of the third connection pads may be connected to the third one of the through-vias.

The display panel may further include a lower insulation layer disposed between the first LED stack and the second LED stack, an intermediate insulation layer disposed between the second LED stack and the third LED stack, and an upper insulation layer disposed on the third LED stack, in which the lower insulation layer, the intermediate insulation layer, and the upper insulation layer may be disposed in upper regions of the first LED stack, the second LED stack, and the third LED stack, respectively.

The first, second, and third LED stacks may be configured to be driven independently, light generated in the first LED stack may be configured to be emitted to the outside through the second LED stack and the third LED stack, and light generated in the second LED stack may be configured to be emitted to the outside through the third LED stack.

The circuit board may include active circuits for active matrix driving.

A display apparatus according to another exemplary embodiment includes a display panel including a circuit board having pads thereon and a plurality of pixel regions arranged on the circuit board, each of the pixel regions including a first LED stack disposed on the circuit board, a first bonding layer disposed between the first LED stack and the circuit board, a second LED stack disposed on the first LED stack, a third LED stack disposed on the second LED stack, first through-vias passing through the first LED stack and the first bonding layer, second through-vias passing through the second LED stack, and third through-vias passing through the third LED stack, in which the first through-vias pass through the first LED stack and the first bonding layer, and are connected to the pads on the circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
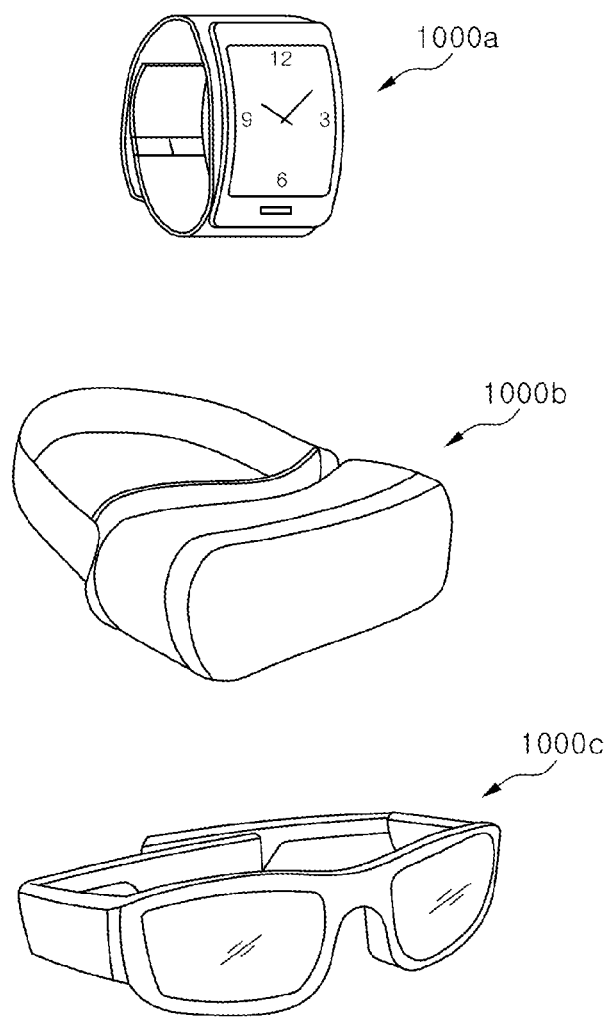
FIG. 1 shows schematic perspective views illustrating display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display panel according to an exemplary embodiment includes: a circuit board having pads thereon; and a plurality of pixel regions arranged on the circuit board, in which each of the pixel regions includes: a first LED stack disposed on the circuit board; a first bonding layer disposed between the first LED stack and the circuit board; a second LED stack disposed on the first LED stack; a third LED stack disposed on the second LED stack; first through vias passing through the first LED stack and the first bonding layer; second through vias passing through the second LED stack; and third through vias passing through the third LED stack, in which the first through vias pass through the first LED stack and the first bonding layer, and are connected to the pads on the circuit board.

The display panel may include a reflection layer disposed between the first LED stack and the circuit board. The reflection layer may be spaced apart from the pads, and located in a region surrounded by the pads on the circuit board under the first LED stack.

The display panel may further include: a second bonding layer disposed between the first LED stack and the second LED stack; and a third bonding layer disposed between the second LED stack and the third LED stack, in which the second through vias may pass through the third bonding layer, and the third through vias may pass through the third bonding layer.

The display panel may further include first connection pads disposed between the first LED stack and the second LED stack, in which one of the first connection pads may electrically connect one of the first through vias to a first conductivity type semiconductor layer of the first LED stack, and another one of the first connection pads may electrically connect another one of the first through vias to a second conductivity type semiconductor layer of the first LED stack.

The display panel may also further include a first ohmic electrode in ohmic contact with the first conductivity type semiconductor layer of the first LED stack, in which one of the first connection pads may be electrically connected to the first conductivity type semiconductor layer of the first LED stack through the first ohmic electrode.

In an exemplary embodiment, the display panel may further include a first transparent electrode in ohmic contact with the second conductivity type semiconductor layer of the first LED stack between the first LED stack and the second LED stack, in which another one of the first connection pads may be electrically connected to the second conductivity type semiconductor layer of the first LED stack through the first transparent electrode.

In another exemplary embodiment, the display panel may further include a lower electrode in ohmic contact with the second conductivity type semiconductor layer of the first LED stack between the first LED stack and the circuit board, in which another one of the first connection pads may be electrically connected to the second conductivity type semiconductor layer of the first LED stack through the lower electrode.

The lower electrode may include a reflection layer.

The first through vias may include a first through via passing through the first LED stack and electrically connected to the lower electrode, and another one of the first connection pads may be connected to the first through via electrically connected to the lower electrode.

The display panel may further include second connection pads disposed between the second LED stack and the third LED stack, in which one of the second connection pads may electrically connect one of the second through vias to a first conductivity type semiconductor layer of the second LED stack, and another one of the second connection pads may electrically connect another one of the second through vias to a second conductivity type semiconductor layer of the second LED stack.

The display panel may also further include a second ohmic electrode in ohmic contact with the first conductivity type semiconductor layer of the second LED stack, in which one of the second connection pads may be electrically connected to the first conductivity type semiconductor layer of the second LED stack through the second ohmic electrode.

The display panel may further include a second transparent electrode in ohmic contact with the second conductivity type semiconductor layer of the second LED stack, in which another one of the second connection pads may be electrically connected to the second conductivity type semiconductor layer of the second LED stack through the second transparent electrode.

In an exemplary embodiment, the second transparent electrode may be disposed between the first LED stack and the second LED stack;

In another exemplary embodiment, the second transparent electrode may be disposed between the first LED stack and the second LED stack, the second through vias may include a second through via passing through the second LED stack and electrically connected to the second transparent electrode, and another one of the second connection pads may be connected to the second through via electrically connected to the second transparent electrode.

The display panel may further include third connection pads disposed on the third LED stack, in which one of the third connection pads may electrically connect one of the third through vias to a first conductivity type semiconductor layer of the third LED stack, and another one of the third connection pads may electrically connect another one of the third through vias to a second conductivity type semiconductor layer of the third LED stack.

The display panel may further include a third ohmic electrode in ohmic contact with the first conductivity type semiconductor layer of the third LED stack, in which one of the third connection pads may be electrically connected to the first conductivity type semiconductor layer of the third LED stack through the third ohmic electrode.

The display panel may further include a third transparent electrode in ohmic contact with the second conductivity type semiconductor layer of the third LED stack, in which another one of the third connection pads may be electrically connected to the second conductivity type semiconductor layer of the third LED stack through the third transparent electrode.

In an exemplary embodiment, the third transparent electrode may be disposed on the third LED stack.

In another exemplary embodiment, the third transparent electrode may be disposed between the second LED stack and the third LED stack, the third through vias may include a third through via passing through the third LED stack and electrically connected to the third transparent electrode, and another one of the third connection pads may be connected to the third through via electrically connected to the third transparent electrode.

The display panel may further include: a lower insulation layer disposed between the first LED stack and the second LED stack; an intermediate insulation layer disposed between the second LED stack and the third LED stack; and an upper insulation layer disposed on the third LED stack, in which the lower insulation layer, the intermediate insulation layer, and the upper insulation layer may be disposed in upper regions of the first LED stack, the second LED stack, and the third LED stack, respectively.

The first, second, and third LED stacks can be driven independently, light generated in the first LED stack may be emitted to the outside through the second LED stack and the third LED stack, and light generated in the second LED stack may be emitted to the outside through the third LED stack.

In an exemplary embodiment, the circuit board may include active circuits for driving an active matrix.

A display apparatus according to an exemplary embodiment includes a display panel, in which the display panel is the display panel described above.

Hereinafter, exemplary embodiments of the invention will be described in detail with reference to the accompanying drawings.

FIG. 1 shows schematic perspective views illustrating display apparatuses according to exemplary embodiments.

The light emitting device according to exemplary embodiments may be used in a VR display apparatus such as a smart watch 1000*a* or a VR headset 1000*b*, or an AR display apparatus such as augmented reality glasses 1000*c*, without being limited thereto. In particular, the AR display apparatus has a very narrow interval between pixels of about 10 μm or less, and the light emitting device according to the exemplary embodiments is suitable for solving a problem that may occur in a display apparatus having such narrow pitch pixels. However, the light emitting device according to exemplary embodiments is not limited to a display apparatus having pixels with a narrow pitch, and may be applied to a display apparatus having pixels with a relatively wide pitch.

Figure 2:
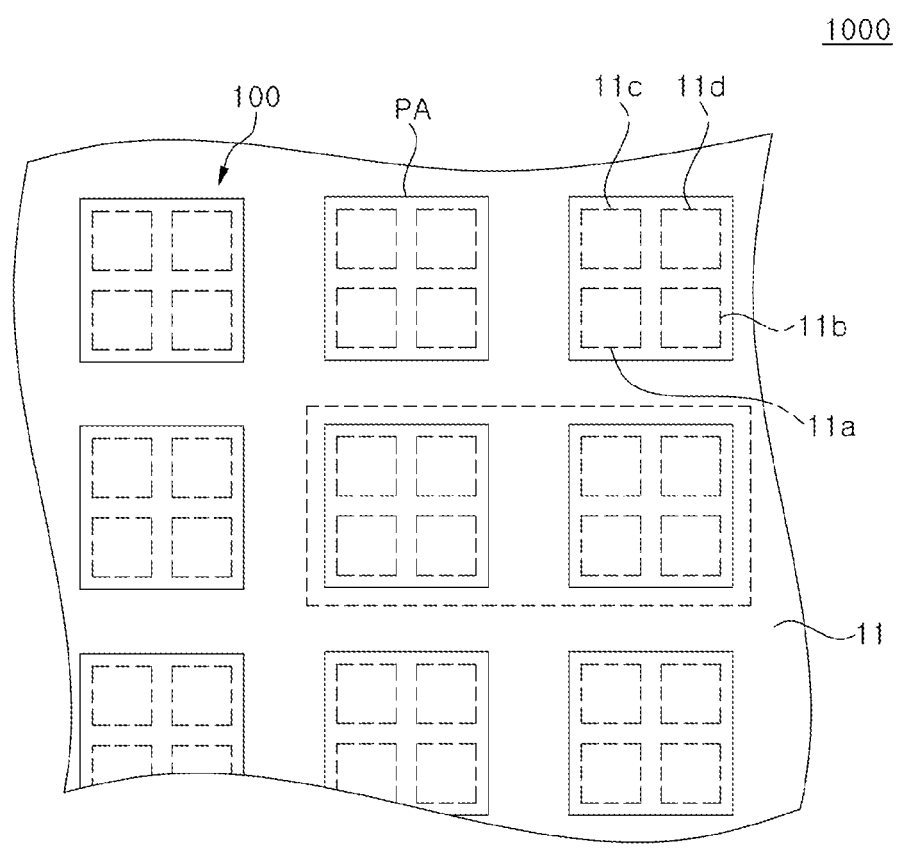
FIG. 2 is a schematic plan view illustrating a display panel according to an exemplary embodiment.
Figure 3A:
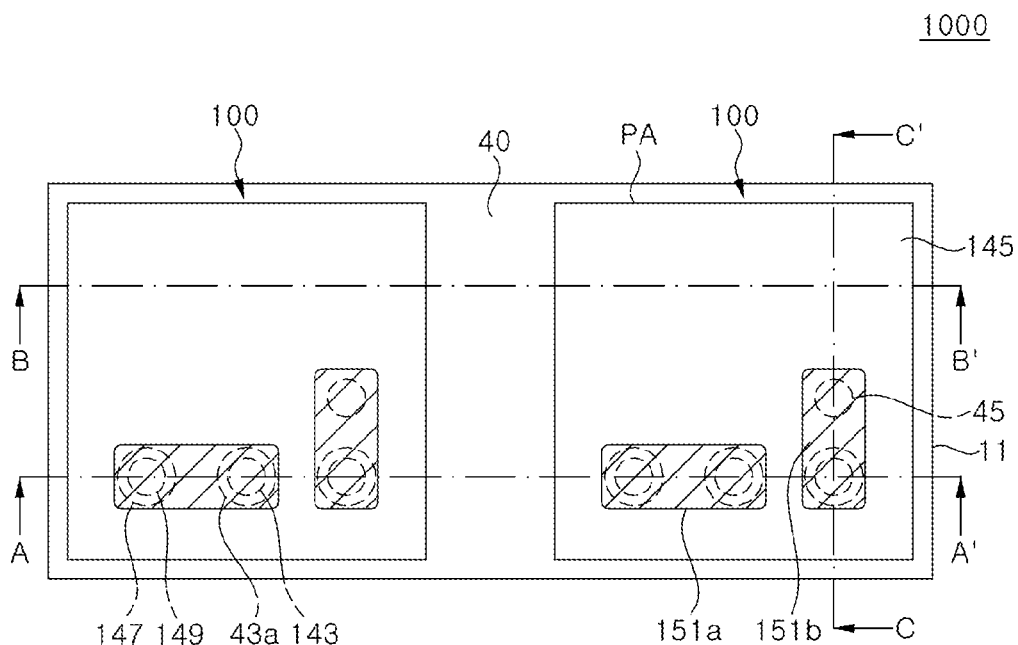
FIG. 3A is a schematic enlarged plan view of a portion of a display panel according to an exemplary embodiment.
Figure 3B:
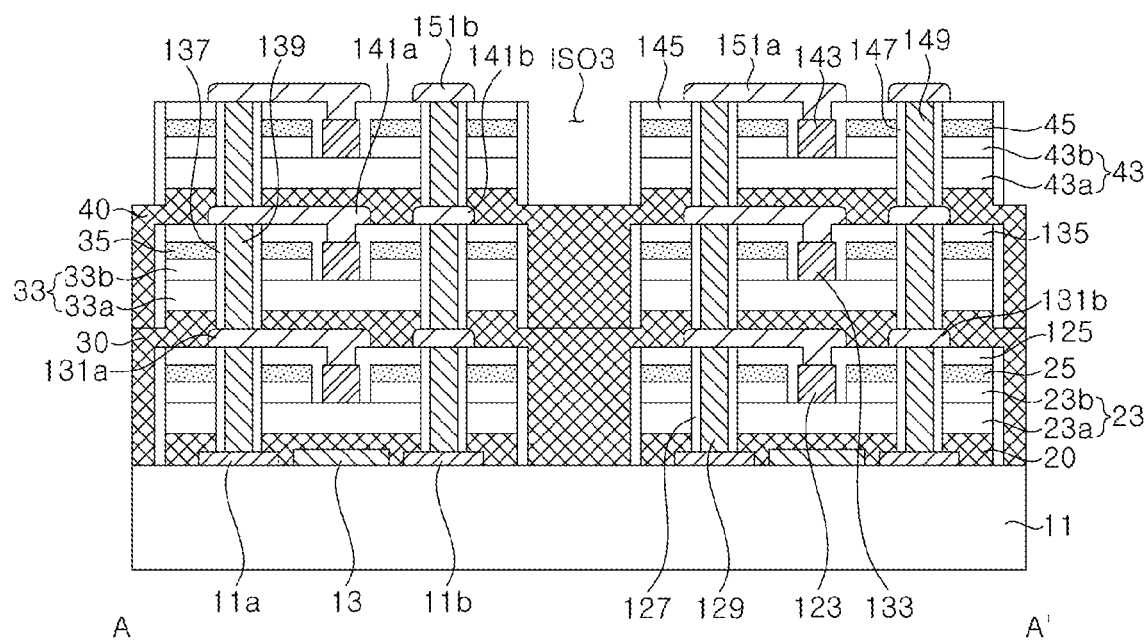
FIG. 3B is a schematic cross-sectional view taken along line A-A' of FIG. 3A.
Figure 3C:
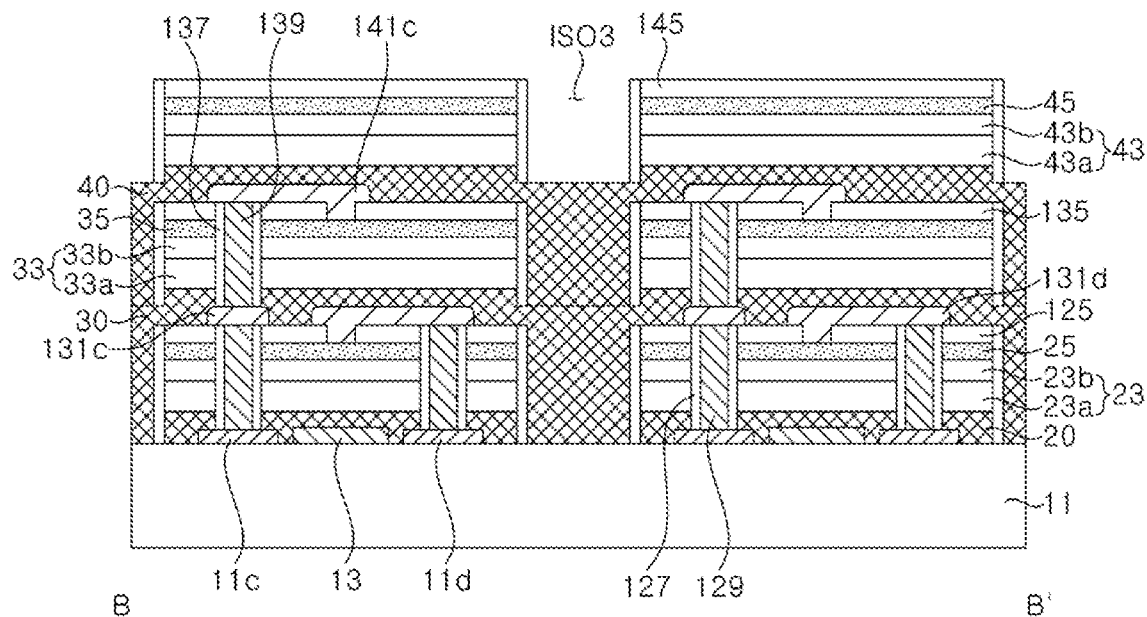
FIG. 3C is a schematic cross-sectional view taken along line B-B' of FIG. 3A.
Figure 3D:
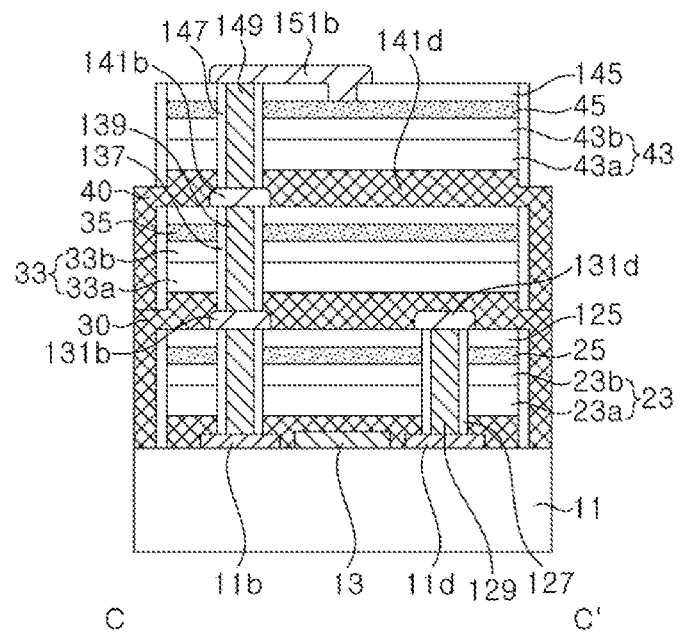
FIG. 3D is a schematic cross-sectional view taken along line C-C' of FIG. 3A.

A display panel for displaying an image is mounted in the display apparatus. FIG. 2 is a schematic plan view illustrating a display panel 1000 according to an exemplary embodiment, FIG. 3A is an enlarged plan view of two pixel regions indicated by dotted lines in FIG. 2 to illustrate the display panel 1000 according to an exemplary embodiment, and FIG. 3B, FIG. 3C, and FIG. 3D are cross-sectional views taken along lines A-A', B-B', and C-C' of FIG. 3A, respectively.

Referring to FIG. 2, the display panel 1000 includes a circuit board 11 and a plurality of pixel regions PA. A light emitting device 100 is disposed in each pixel region PA.

The circuit board 11 may include circuits for passive matrix driving or active matrix driving. In an exemplary embodiment, the circuit board 11 may include interconnection lines and resistors therein. In another exemplary embodiment, the circuit board 11 may include interconnection lines, transistors, and capacitors. In the illustrated exemplary embodiment, the circuit board 11 may include active circuits such as a transistor for driving an active matrix.

The circuit board 11 may have pads 11*a*, 11*b*, 11*c*, and 11*d* on an upper surface thereof for allowing electrical connection to the circuits disposed therein. Each of the light emitting devices 100 is electrically connected to the circuit board 11 through the pads 11*a*, 11*b*, 11*c*, and 11*d*.

In an exemplary embodiment, a distance between the pixel regions PA, more particularly, a distance between the light emitting devices 100 may be less than a width of one light emitting device 100. In particular, the distance between the light emitting devices 100 may be less than ½ of the width of the light emitting device 100. For example, the width of the light emitting device 100 may be about 7 μm or less, and the distance between the light emitting devices 100 may be about 3 μm or less.

Referring to FIG. 3A, FIG. 3B, FIG. 3C, and FIG. 3D, a display panel 1000 includes light emitting devices 100 disposed on a circuit board 11, and may include a first LED stack 23, a second LED stack 33, a third LED stack 43, a first transparent electrode 25, a second transparent electrode 35, a third transparent electrode 45, a first ohmic electrode 123, a second ohmic electrode 133, a third ohmic electrode 143, a first bonding layer 20, a second bonding layer 30, a third bonding layer 40, a lower insulation layer 125, an intermediate insulation layer 135, an upper insulation layer 145, a first sidewall insulation layer 127, a second sidewall insulation layer 137, a third sidewall insulation layer 147, first through vias 129, second through vias 139, third through vias 149, first connection pads 131*a*, 131*b*, 131*c*, and 131*d*, second connection pads 141*a*, 141*b*, and 141*c*, and third connection pads 151*a* and 151*b*.

As described above, the circuit board 11 includes an active or passive circuit, and may include the pads 11*a*, 11*b*, 11*c*, and 11*d* on the upper surface thereof. At least four pads 11*a*, 11*b*, 11*c*, and 11*d* may be disposed in a lower region of each of the light emitting devices 100. The first pad 11*a* may be a common pad that is electrically connected to the first, second, and third LED stacks 23, 33, and 43. The second pad 11*b*, the third pad 11*c*, and the fourth pad 11*d* may be individual pads that are electrically connected to the third LED stack 43, the second LED stack 33, and the first LED stack 23, respectively. In this manner, the first, second, and third LED stacks 23, 33, and 43 may be independently driven using the common pad 11*a* and individual pads 11*b*, 11*c*, and 11*d*. In an exemplary embodiment, the first pad 11*a* may be commonly electrically connected to the first conductivity type semiconductor layers of the first, second, and third LED stacks 23, 33, and 43 as a common pad, and the second, third, and fourth pads 11*b*, 11*c*, and 11*d* may be individually electrically connected to the second conductivity type semiconductor layers of the first, second, and third LED stacks 23, 33, and 43. In another exemplary embodiment, the first pad 11*a* may be commonly electrically connected to the second conductivity type semiconductor layers of the first, second, and third LED stacks 23, 33, and 43 as a common pad, and the second, third, and fourth pads 11*b*, 11*c*, and 11*d* may be individually electrically connected to the first conductivity type semiconductor layers of the first, second, and third LED stacks 23, 33, and 43. Hereinafter, the first pad 11*a* will be exemplarily described as being commonly connected to the first conductivity type semiconductor layers of the first, second, and third LED stacks 23, 33, and 43. However, the inventive concepts are not limited thereto, and as described above, in some exemplary embodiments, the first pad 11*a* may be commonly connected to the second conductivity type semiconductor layers of the first, second, and third LED stacks 23, 33, and 43.

The circuit board 11 may further include a reflection layer 13 in a region between the light emitting devices 100 and the circuit board 11. The reflection layer 13 may include a reflective metal layer, such as Al, Ag, Au, or the like. However, the inventive concepts are not limited thereto, and in some exemplary embodiments, the reflection layer 13 may include a distributed Bragg reflector, for example. In an exemplary embodiment, the reflection layer 13 may be located in a region surrounded by the pads 11*a*, 11*b*, 11*c*, and 11*d* under the first LED stack 23.

The light emitting devices 100 are disposed in the pixel region PA. The first, second, and third LED stacks 23, 33 and 43 are stacked in the vertical direction. Each of the LED stacks 23, 33, and 43 is grown on different growth substrates, and the growth substrates are removed without being retrained in a final light emitting device 100. As such, the light emitting device 100 according to the illustrated exemplary embodiment does not include the growth substrate. However, the inventive concepts are not limited thereto, and in some exemplary embodiments, at least one growth substrate may be included in a final light emitting device 100.

The first LED stack 23, the second LED stack 33, and the third LED stack 43 include a first conductivity type semiconductor layer 23*a*, 33*a*, and 43*a*, a second conductivity type semiconductor layer 23*b*, 33*b*, and 43*b*, and active layers interposed therebetween, respectively. The active layers may have multiple quantum well structures, for example.

The first LED stack 23 is disposed on the circuit board 11, the second LED stack 33 is disposed on the first LED stack 23, and the third LED stack 43 is disposed on the second LED stack 33. Light generated in the first, second, and third LED stacks 23, 33, and 43 is emitted to the outside through the third LED stack 43.

In an exemplary embodiment, the first, second, and third LED stacks 23, 33, and 43 may emit light having a longer wavelength as being disposed closer to the circuit board 11. For example, the first LED stack 23 may be an inorganic light emitting diode emitting red light, the second LED stack 33 may be an inorganic light emitting diode emitting green light, and the third LED stack 43 may be an inorganic light emitting diode emitting blue light. The first LED stack 23 may include an AlGaInP-based well layer, the second LED stack 33 may include an AlGaInP-based or AlGaInN-based well layer, and the third LED stack 43 may include an AlGaInN-based well layer.

In another exemplary embodiment, the second LED stack 33 may emit light of a shorter wavelength than that of the third LED stack 43. For example, the second LED stack 33 may be an inorganic light emitting diode emitting blue light, and the third LED stack 43 may be an inorganic light emitting diode emitting green light.

The first conductivity type semiconductor layers 23*a*, 33*a*, and 43*a* of each of the LED stacks 23, 33 or 43 may be n-type semiconductor layers, respectively, and the second conductivity type semiconductor layers 23*b*, 33*b*, and 43*b* may be p-type semiconductor layers. In the illustrated exemplary embodiment, although lower surfaces of the first, second, and third LED stacks 23, 33, and 43 are illustrated and described as being n-type semiconductor layers, the inventive concepts are not limited thereto.

The first LED stack 23, the second LED stack 33, and the third LED stack 43 may have through holes, and first, second, and third through vias 129, 139, and 149 may be formed in the through holes. The first, second, and third through vias 129, 139, and 149 may be insulated from the LED stacks 23, 33, and 43 by the first, second, and third sidewall insulation layers 127, 137, and 147, respectively.

In the illustrated exemplary embodiment, the surfaces of the first, second, and third LED stacks 23, 33, and 43 may be textured to improve light extraction efficiency. In particular, surfaces of the first conductivity type semiconductor layers 23*a*, 33*a*, and 43*a* may be textured. In some exemplary embodiments, a surface of the second conductivity type semiconductor layer 23*b* may also be textured to improve light extraction of the first LED stack 23.

The first LED stack 23, the second LED stack 33, and the third LED stack 43 may overlap with one another, and may have a light emitting area of a similar size. Furthermore, in each of the LED stacks 23, 33, and 43, each of the first conductivity type semiconductor layers 23*a*, 33*a*, and 43*a* may have substantially the same area as that of the second conductivity type semiconductor layers 23*b*, 33*b*, and 43*b*. However, in the first, second, and third LED stacks 23, 33 and 43, since portions of the second conductivity type semiconductor layers 23*b*, 33*b*, and 43*b* are etched to expose the first conductivity type semiconductor layer 43*a* to form the ohmic electrodes 123, 133, and 143, the first conductivity type semiconductor layers 23*a*, 33*a*, and 43*a* may have a slightly larger area than that of the second conductivity type semiconductor layers 23*b*, 33*b*, and 43*b*.

The first transparent electrode 25 is disposed between the first LED stack 23 and the second LED stack 33. The first transparent electrode 25 is in ohmic contact with the second conductivity type semiconductor layer 23*b* of the first LED stack 23, and transmits light generated in the first LED stack 23. The first transparent electrode 25 may be formed using a transparent oxide layer or a metal layer, such as tin oxide ($SnO_2$), indium oxide ($InO_2$), zinc oxide (ZnO), indium tin oxide (ITO), indium zinc oxide (IZO), indium tin oxide zinc (ITZO), or the like.

The second transparent electrode 35 is in ohmic contact with the second conductivity type semiconductor layer 33b of the second LED stack 33. As shown in the drawing, the second transparent electrode 35 may contact an upper surface of the second LED stack 33 between the second LED stack 33 and the third LED stack 43. For example, the second transparent electrode 35 may be formed of a metal layer or a conductive oxide layer that is transparent to red light and green light.

The third transparent electrode 45 is in ohmic contact with the second conductivity type semiconductor layer 43b of the third LED stack 43. The third transparent electrode 45 may be located above the third LED stack 43, and contacts an upper surface of the third LED stack 43. The third transparent electrode 45 may be formed of, for example, a metal layer or a conductive oxide layer that is transparent to red light, green light, and blue light. The first transparent electrode 25, the second transparent electrode 35, and the third transparent electrode 45 may be in ohmic contact with the p-type semiconductor layer of each of the LED stacks 23, 33, and 43 to assist current spread. The conductive oxide layer used for the second and third transparent electrodes 35 and 45 may include $SnO_2$, $InO_2$, ITO, ZnO, IZO, ITZO, or the like.

The first ohmic electrode 123 is in ohmic contact with the first conductivity type semiconductor layer 23a. As shown in FIG. 3B, the first ohmic electrode 123 may be in ohmic contact with the first conductivity type semiconductor layer 23a exposed through the first transparent electrode 25 and the second conductivity type semiconductor layer 23b. The first ohmic electrode 123 may include an alloy including Au, such as AuGe or AuTe.

The second ohmic electrode 133 is in ohmic contact with the first conductivity type semiconductor layer 33a. The second ohmic electrode 133 may be in ohmic contact with the first conductivity type semiconductor layer 33a exposed through the second transparent electrode 35 and the second conductivity type semiconductor layer 33b. The second ohmic electrode 133 may include an ohmic metal, such as Ti, Cr, Ni, Al or the like.

The third ohmic electrode 143 is in ohmic contact with the first conductivity type semiconductor layer 43a. The third ohmic electrode 143 may be in ohmic contact with the first conductivity type semiconductor layer 43a exposed through the third transparent electrode 45 and the second conductivity type semiconductor layer 43b. The third ohmic electrode 143 may include an ohmic metal, such as Ti, Cr, Ni, Al or the like.

The first, second, and third ohmic electrodes 123, 133, and 143 may be disposed to overlap with one another in the vertical direction. As such, light generated in the first, second, and third LED stacks 23, 33, and 43 may be blocked by the first, second, and third ohmic electrodes 123, 133, and 143, thereby reducing light loss. However, the inventive concepts are not limited thereto, and in some exemplary embodiments, the first, second, and third ohmic electrodes 123, 133, and 143 may be spaced apart from one another in the lateral direction.

The first, second, and third ohmic electrodes 123, 133, and 143 are electrically connected to the common pad 11a, and thus, the first, second, and third ohmic electrodes 123, 133, and 143 may be disposed closer to the common pad 11a than the individual pads 11b, 11c, and 11d.

The lower insulation layer 125 may cover the first transparent electrode 25 and the first ohmic electrode 123. The lower insulation layer 125 may be disposed over the first conductivity type semiconductor layer 23a, and may expose at least one side surface of the first conductivity type semiconductor layer 23a and at least one side surface of the second conductivity type semiconductor layer 23b. The lower insulation layer 125 may have an opening exposing the first ohmic electrode 123, and may also have an opening exposing the first transparent electrode 25.

The intermediate insulation layer 135 may cover the second transparent electrode 35 and the second ohmic electrode 133. The intermediate insulation layer 135 may be disposed over the first conductivity type semiconductor layer 33a, and may expose at least one side surface of the first conductivity type semiconductor layer 33a and at least one side surface of the second conductivity type semiconductor layer 33b. The intermediate insulation layer 135 may have an opening exposing the second ohmic electrode 133, and may also have an opening exposing the second transparent electrode 35.

The upper insulation layer 145 may cover the third transparent electrode 45 and the third ohmic electrode 143. The upper insulation layer 145 may be disposed over the first conductivity type semiconductor layer 43a, and may expose at least one side surface of the first conductivity type semiconductor layer 43a and at least one side surface of the second conductivity type semiconductor layer 43b. The upper insulation layer 145 may have an opening exposing the third ohmic electrode 143, and may also have an opening exposing the third transparent electrode 45.

The lower insulation layer 125, the intermediate insulation layer 135, and the upper insulation layer 145 may be formed of, for example, $SiO_2$, $Si_3N_4$, or the like.

The first bonding layer 20 couples the first LED stack 23 to the circuit board 11. In particular, the first bonding layer 20 may bond the first conductivity type semiconductor layer 23a of the first LED stack 23 to the circuit board 11. The first bonding layer 20 may be disposed within a lower region of the first LED stack 23, but the inventive concepts are not limited thereto. For example, in some exemplary embodiments, the first bonding layer 20 may be retained in the region between the light emitting devices 100.

The second bonding layer 30 couples the second LED stack 33 to the first LED stack 23. The second bonding layer 30 may couple the lower insulation layer 125 to the first conductivity type semiconductor layer 33a between the lower insulation layer 125 and the first conductivity type semiconductor layer 33a. In some exemplary embodiments, the second bonding layer 30 may also be disposed in the region between the light emitting devices 100.

The third bonding layer 40 couples the third LED stack 43 to the first LED stack 23. The third bonding layer 40 may couple the intermediate insulation layer 135 to the first conductivity type semiconductor layer 43a between the intermediate insulation layer 135 and the first conductivity type semiconductor layer 43a. In some exemplary embodiments, the third bonding layer 40 may also be disposed in the region between the light emitting devices 100.

The first bonding layer 20, the second bonding layer 30, or the third bonding layer 40 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 20, the second bonding layer 30, or the third bonding layer 40 may be formed of spin-on-glass (SOG).

The first through vias 129 pass through the first LED stack 23. The first through vias 129 may also pass through the lower insulation layer 125, the first transparent electrode 25, and the first bonding layer 20, and may be electrically connected to the common pad 11a and the individual pads 11b, 11c, and 11d, respectively. The first through vias 129 may include, for example, a Cu plating layer. The first through vias 129 may also include a capping layer thereon, or a treatment such as ENIG, ENEPIG, or the like may be performed on the Cu layer to prevent oxidation of Cu.

The first sidewall insulation layer 127 insulates the first through vias 129 from the first LED stack 23 in the through holes. The first sidewall insulation layer 127 covers sidewalls of the through holes, and has openings exposing bottoms of the through holes. The first sidewall insulation layer 127 may be formed using, for example, a chemical vapor deposition technique or an atomic layer deposition technique, and may be formed of, for example, $Al_2O_3$, $SiO_2$, $Si_3N_4$, or the like.

The first connection pads 131a, 131b, 131c, and 131d may be located between the first LED stack 23 and the second LED stack 33. The first connection pads 131a, 131b, 131c, and 131d may be disposed on the lower insulation layer 125, and may be covered with the second bonding layer 30.

The first connection pad 131a, as shown in FIG. 3B, electrically connects the first through via 129 electrically connected to the common pad 11a to the first ohmic electrode 123. The first connection pad 131d, as shown in FIG. 3C, electrically connects the first through via 129 electrically connected to the pad 11d to the first transparent electrode 25 exposed through the opening of the lower insulation layer 125.

The first connection pads 131b and 131c cover the first through vias 129 electrically connected to the pads 11c and 11d, respectively, and are electrically connected to the first through vias 129.

The second through vias 139 pass through the second LED stack 33. The second through vias 139 may also pass through the intermediate insulation layer 135, the second transparent electrode 35, and the second bonding layer 30, and may be electrically connected to the first connection pads 131a, 131b, and 131c, respectively. The second through vias 139 may include, for example, a Cu plating layer. The second through vias 139 may also include a capping layer thereon, or a treatment such as ENIG, ENEPIG, or the like may be performed on the Cu layer to prevent oxidation of Cu.

The second sidewall insulation layer 137 insulates the second through vias 139 from the second LED stack 33 in the through holes. The second sidewall insulation layer 137 covers the sidewalls of the through holes, and has openings exposing bottoms of the through holes, for example, the first connection pads 131a, 131b, and 131c. The second sidewall insulation layer 137 may be formed using, for example, a chemical vapor deposition technique or an atomic layer deposition technique, and may be formed of, for example, $Al_2O_3$, $SiO_2$, $Si_3N_4$, or the like.

The second connection pads 141a, 141b, and 141c may be located between the second LED stack 33 and the third LED stack 43. The second connection pads 141a, 141b, and 141c may be disposed on the intermediate insulation layer 135, and may be covered with the third bonding layer 40.

The second connection pad 141a, as shown in FIG. 3B, electrically connects the second through via 139 electrically connected to the first connection pad 131a to the second ohmic electrode 133. The second connection pad 141c, as shown in FIG. 3C, electrically connects the second through via 139 electrically connected to the first connection pad 131c to the second transparent electrode 35 exposed through the opening of the intermediate insulation layer 135.

The second connection pad 141b covers the second through via 139 electrically connected to the first connection pad 131b, and is electrically connected to the second through via 139.

The third through vias 149 pass through the third LED stack 43. The third through vias 149 may also pass through the upper insulation layer 145, the third transparent electrode 45, and the third bonding layer 40, and may be electrically connected to the second connection pads 141a and 141b, respectively. The third through vias 149 may include, for example, a Cu plating layer. The third through vias 149 may also include a capping layer thereon, or a treatment such as ENIG, ENEPIG, or the like may be performed on the Cu layer to prevent oxidation of Cu.

The third sidewall insulation layer 147 insulates the third through vias 149 from the third LED stack 43 in the through holes. The third side wall insulation layer 147 covers the sidewalls of the through holes, and has openings exposing bottoms of the through holes, for example, the second connection pads 141a and 141b. The third sidewall insulation layer 147 may be formed using, for example, a chemical vapor deposition technique or an atomic layer deposition technique, and may be formed of, for example, $Al_2O_3$, $SiO_2$, $Si_3N_4$, or the like.

The third connection pads 151a and 151b may be located on the third LED stack 43. Furthermore, the third connection pads 151a and 151b may be disposed on the upper insulation layer 145.

The third connection pad 151a, as shown in FIG. 3B, electrically connects the third through via 139 electrically connected to the second connection pad 141a to the third ohmic electrode 143. The third connection pad 151b, as shown in FIG. 3D, electrically connects the third through via 149 electrically connected to the second connection pad 141b to the third transparent electrode 45 exposed through the opening of the upper insulation layer 145.

The first, second, and third through vias 129, 139, and 149 may be formed using a chemical mechanical polishing technique. For example, after forming a seed layer and filling the through holes using a plating technique, the through vias may be formed using a chemical mechanical polishing technique to remove metal layers on the insulation layers 125, 135, and 145.

According to the illustrated exemplary embodiment, each of the first conductivity type semiconductor layer 23a of the first LED stack 23, the first conductivity type semiconductor layer 33a of the second LED stack 33, the first conductivity type semiconductor layers 43a of the third LED stack 43 are electrically connected to the common pad 11a. Meanwhile, the second conductivity type semiconductor layer 23b of the first LED stack 23 is electrically connected to the individual pad 11d, and the second conductivity type semiconductor layer 33b of the second LED stack 33 is electrically connected to the individual pad 11c, and the second conductivity type semiconductor layer 43b of the third LED stack 43 is electrically connected to the individual pad 11b. As such, the first LED stack 23 may be driven by supplying power to the pads 11a and 11d, the second LED stack 33 may be driven by supplying power to the pads 11*a* and 11*c*, and the third LED stack 43 may be driven by supplying power to the pads 11*a* and 11*b*.

According to the illustrated exemplary embodiment, the first through vias 129 passing through the first LED stack 23 may be directly connected to the pads 11*a*, 11*b*, 11*c*, and 11*d* on the circuit board 11. The first through vias 129 may be formed using Cu CMP technology. In this manner, the first through vias 129 may be formed on the pads 11*a*, 11*b*, 11*c*, and 11*d* without using a separate bonding layer. Since the light emitting devices 100 are not transferred to the circuit board 11, but are formed on the circuit board 11, reliability problems that may otherwise be caused by transferring LEDs may be prevented.

Figure 4A:
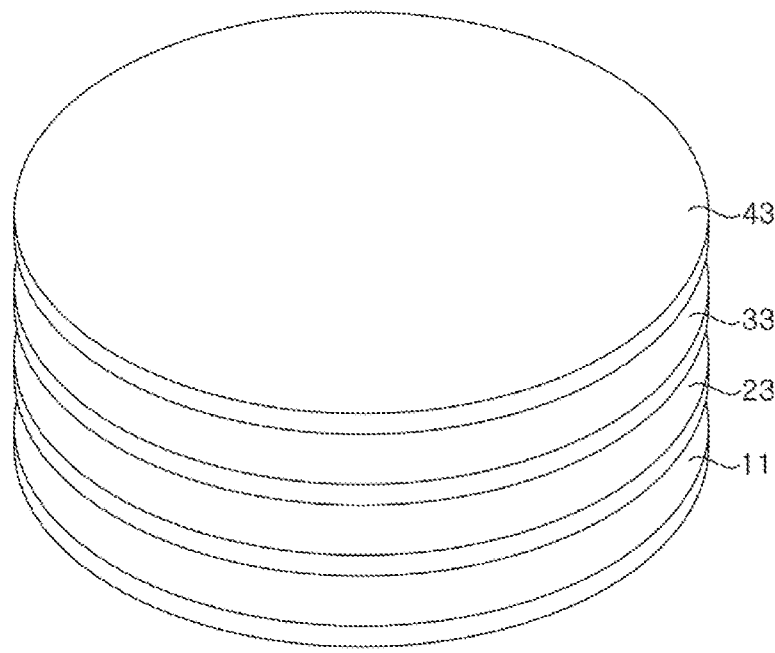
FIG. 4A is a schematic perspective view illustrating a method of manufacturing a display panel according to an exemplary embodiment.
Figure 4B:
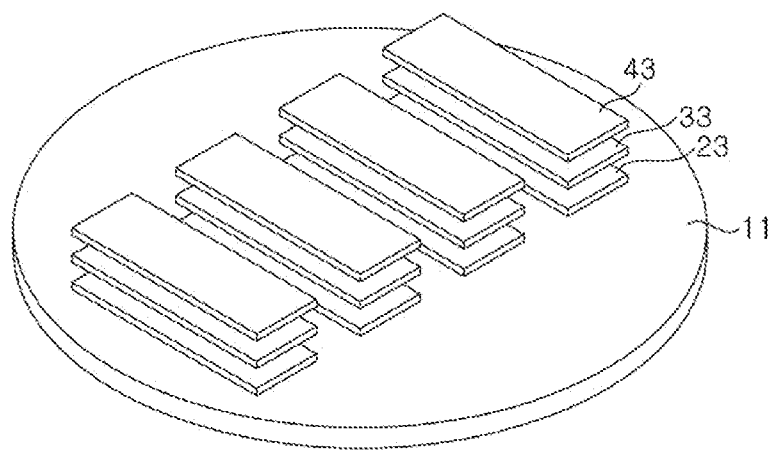
FIG. 4B is a schematic perspective view illustrating a method of manufacturing a display panel according to another exemplary embodiment.

FIG. 4A is a schematic perspective view illustrating a method of manufacturing a display panel according to an exemplary embodiment, and FIG. 4B is a schematic perspective view illustrating a method of manufacturing a display panel according to another exemplary embodiment.

The display panel according to an exemplary embodiment is manufactured through a process of individually bonding and processing a first LED stack 23, a second LED stack 33, and a third LED stack 43, which are separately manufactured, on a circuit board 11.

In this case, as shown in FIG. 4A, the first LED stack 23, the second LED stack 33, and the third LED stack 43 may be provided in a size similar to that of the circuit board 11. The LED stacks 23, 33, and 43 may be sequentially bonded to the circuit board 11, and processes may be applied to these LED stacks 23, 33, and 43.

Alternatively, as shown in FIG. 4B, the first, second, and third LED stacks 23, 33, and 43 may be provided in a relatively smaller size than that of the circuit board 11, and a plurality of LED stacks 23, 33 and 43 may be sequentially formed on the circuit board 11.

When the first, second, and third LED stacks 23, 33, and 43 are manufactured to have a similar size as that of the circuit board 11, the manufacturing process may be facilitated by bonding the LED stacks 23, 33, and 43 without tiling on a single circuit board 11 as shown in FIG. 4A. However, in general, since silicon wafers used as the circuit board 11 are provided in a relatively large size and the LED stacks 23, 33, and 43 using compound semiconductors are manufactured in a relatively small size, the plurality of LED stacks is tiled and disposed, as shown in FIG. 4B, and thus, a large number of light emitting devices may be manufactured at a time.

After the plurality of light emitting devices is manufactured on the circuit board 11, the circuit board 11 may be divided into an appropriate size.

Hereinafter, a method of manufacturing a display panel 1000 will be described in detail. The method of manufacturing the display panel described below may be implemented in a manner shown in FIG. 4A or FIG. 4B. A structure of the light emitting device 100 will be described in more detail through the manufacturing method described below.

FIG. 5A, FIG. 5B, FIG. 6A, FIG. 6B, FIG. 6C, FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 12C, FIG. 13A, FIG. 13B, FIG. 13C, FIG. 14A, FIG. 14B, FIG. 15A, FIG. 15B, FIG. 16A, FIG. 16B, FIG. 17A, FIG. 17B, FIG. 18A, FIG. 18B, FIG. 18C, FIG. 19A, FIG. 19B, FIG. 20A, FIG. 20B, FIG. 21A, FIG. 21B, FIG. 22A, FIG. 22B, FIG. 22C, and FIG. 22D are schematic plan views and cross-sectional views illustrating a method of manufacturing a display panel according to an exemplary embodiment.

Hereinafter, although a region including two light emitting devices 100 is exemplarily illustrated and described as that in FIG. 3A, a much greater number of light emitting devices 100 may be manufactured on a single circuit board 11.

Figure 5A:
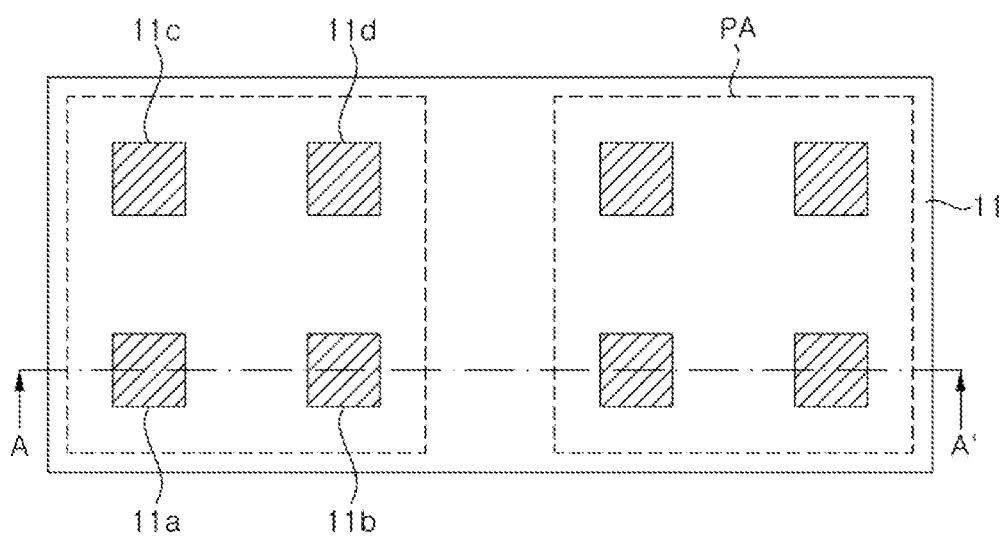
FIG. 5A, FIG. 5B, FIG. 6A, FIG. 6B, FIG. 6C, FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 12C, FIG. 13A, FIG. 13B, FIG. 13C, FIG. 14A, FIG. 14B, FIG. 15A, FIG. 15B, FIG. 16A, FIG. 16B, FIG. 17A, FIG. 17B, FIG. 18A, FIG. 18B, FIG. 18C, FIG. 19A, FIG. 19B, FIG. 20A, FIG. 20B, FIG. 21A, FIG. 21B, FIG. 22A, FIG. 22B, FIG. 22C, and FIG. 22D are schematic plan views and cross-sectional views illustrating a method of manufacturing a display panel according to an exemplary embodiment.
Figure 5B:
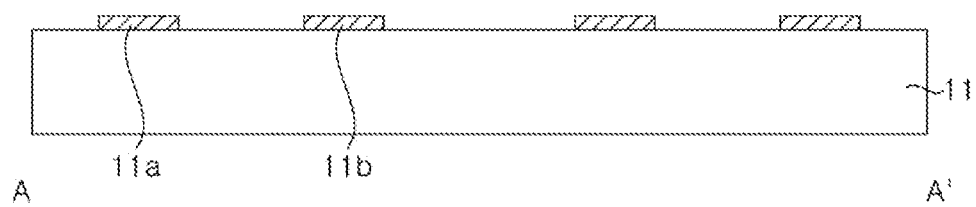

First, referring to FIG. 5A and FIG. 5B, the circuit board 11 is provided. The circuit board 11 may include circuits for active matrix driving or passive matrix driving therein. The circuit board 11 may be, for example, a silicon-based circuit board 11, and in particular, may include active circuits.

The circuit board 11 also includes pads 11*a*, 11*b*, 11*c*, and 11*d* exposed on an upper surface thereof. The pads 11*a*, 11*b*, 11*c*, and 11*d* may be disposed in each region in which the light emitting device 100 is to be formed, in particular, in each pixel region PA. The pads 11*a*, 11*b*, 11*c*, and 11*d* are electrically connected to the active circuits inside the circuit board 11.

Figure 6A:
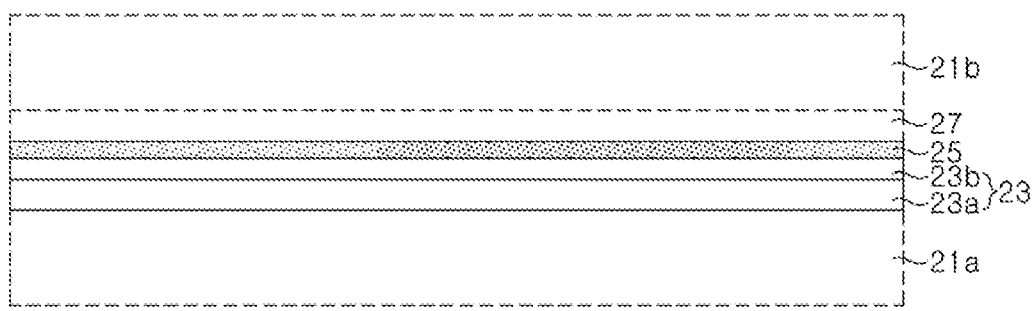
Figure 6B:
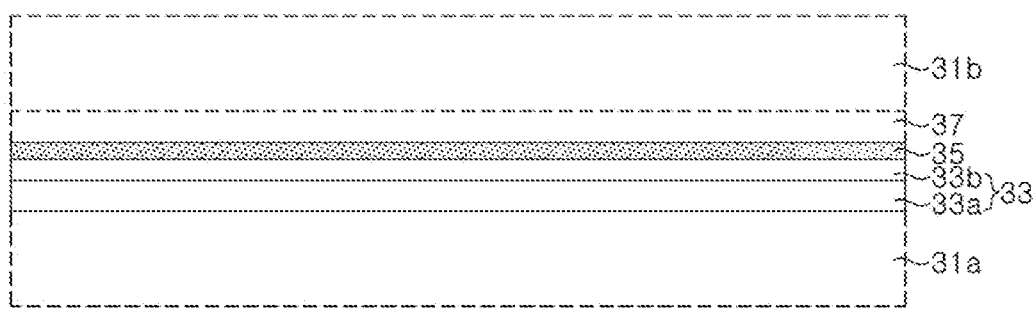
Figure 6C:
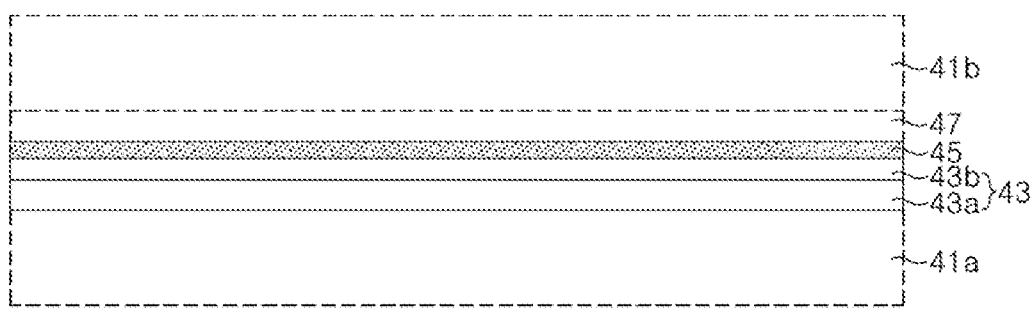

Referring to FIG. 6A, FIG. 6B, and FIG. 6C, first, second, and third LED stacks 23, 33, and 43 are provided separately from the circuit board 11.

Referring to FIG. 6A, the first LED stack 23 may include a first conductivity type semiconductor layer 23*a* and a second conductivity type semiconductor layer 23*b*, which may be grown on a first substrate 21*a* with an active layer interposed therebetween.

The first substrate 21*a* may be a substrate that may be capable of growing the first LED stack 23 thereon, such as a GaAs substrate. The first conductivity type semiconductor layer 23*a* and the second conductivity type semiconductor layer 23*b* may be formed of an AlGaInAs-based or AlGaInP-based semiconductor layer, and the active layer may include, for example, an AlGaInP-based well layer. A composition ratio of AlGaInP may be determined in the first LED stack 23 to emit red light, for example.

A first transparent electrode 25 may be formed on the second conductivity type semiconductor layer 23*b*. As described above, the first transparent electrode 25 may be formed of a metal layer or a conductive oxide layer that transmits light generated in the first LED stack 23, for example, red light. Before the first transparent electrode 25 is formed, a surface of the second conductivity type semiconductor layer 23*b* may be textured to form a roughened surface.

A first temporary substrate 21*b* may be bonded to the first LED stack 23 through an adhesive 27, and the first substrate 21*a* may be removed from the first LED stack 23. After the first substrate 21*a* is removed, a surface of the exposed first conductivity type semiconductor layer 23*a* may be textured to form a roughened surface.

Referring to FIG. 6B, the second LED stack 33 may include a first conductivity type semiconductor layer 33*a* and a second conductivity type semiconductor layer 33*b*, which may be grown on a second substrate 31*a* with an active layer interposed therebetween.

The second substrate 31*a* may be a substrate capable of growing the second LED stack 33 thereon, such as a sapphire substrate, a GaN substrate, or a GaAs substrate. The first conductivity type semiconductor layer 33*a* and the second conductivity type semiconductor layer 33*b* may be formed of an AlGaInAs-based or AlGaInP-based semiconductor layer, or an AlGaInN-based semiconductor layer. The active layer may include, for example, an AlGaInP-based well layer or AlGaInN-based well layer. A composition ratio of AlGaInP or AlGaInN may be determined in the second LED stack 33 to emit green light, for example.

A second transparent electrode 35 may be formed on the second conductivity type semiconductor layer 33*b*. As described above, the second transparent electrode 35 may be formed of a metal layer or a conductive oxide layer that transmits light generated in the first LED stack 23, for example, green light.

A second temporary substrate 31b may be bonded to the second LED stack 33 through an adhesive 37, and the second substrate 31a may be removed from the second LED stack 33. After the second substrate 31a is removed, a surface of the exposed first conductivity type semiconductor layer 33a may be textured to form a roughened surface.

Referring to FIG. 6C, the third LED stack 43 includes a first conductivity type semiconductor layer 43a and a second conductivity type semiconductor layer 43b, which may be grown on a third substrate 41a with an active layer interposed therebetween.

The third substrate 41a may be a substrate capable of growing the third LED stack 43 thereon, such as a sapphire substrate, a SiC substrate, or a GaN substrate. In an exemplary embodiment, the third substrate 41a may be a flat sapphire substrate, but may also be a patterned sapphire substrate. The first conductivity type semiconductor layer 43a and the second conductivity type semiconductor layer 43b may be formed of an AlGaInN-based semiconductor layer, and the active layer may include, for example, an AlGaInN-based well layer. A composition ratio of AlGaInN may be determined in the third LED stack 43 to emit blue light, for example.

A third transparent electrode 45 may be formed on the second conductivity type semiconductor layer 43b. As described above, the third transparent electrode 45 may be formed of a metal layer or a conductive oxide layer that transmits light generated in the first, second, and third LED stacks 23, 33, and 43, such as red light, green light, and blue light.

A third temporary substrate 41b may be bonded to the third LED stack 43 through an adhesive 47, and the third substrate 41a may be removed from the third LED stack 43. After the third substrate 41a is removed, a surface of the exposed first conductivity type semiconductor layer 43a may be textured to form a roughened surface.

The first, second, and third LED stacks 23, 33, and 43 are grown on different growth substrates 21a, 31a, and 41a, respectively, and thus, an order of the manufacturing process is not particularly limited.

Hereinafter, a method of manufacturing the display panel 1000 using the first, second, and third LED stacks 23, 33, and 43 grown on the growth substrates 21a, 31a, and 41a will be described.

Figure 7A:
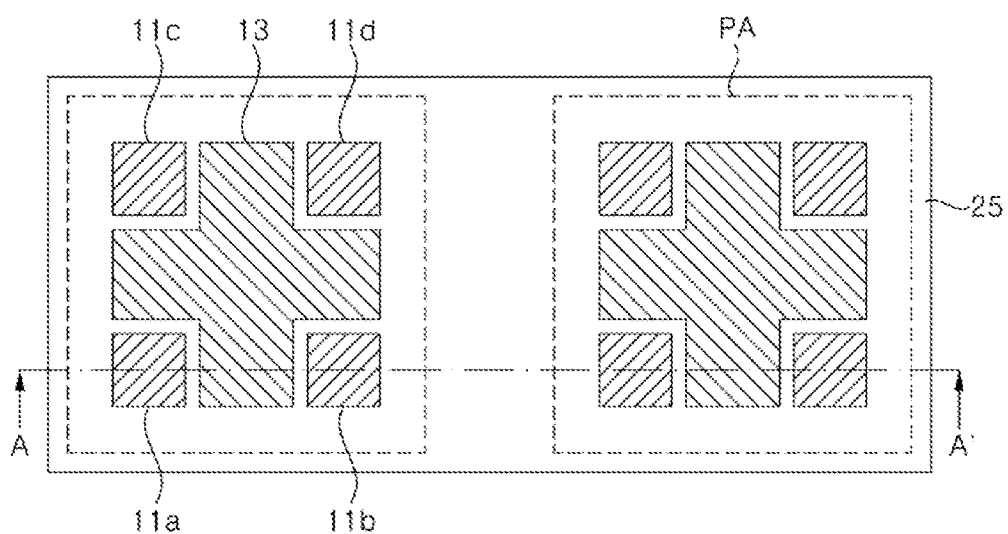
Figure 7B:
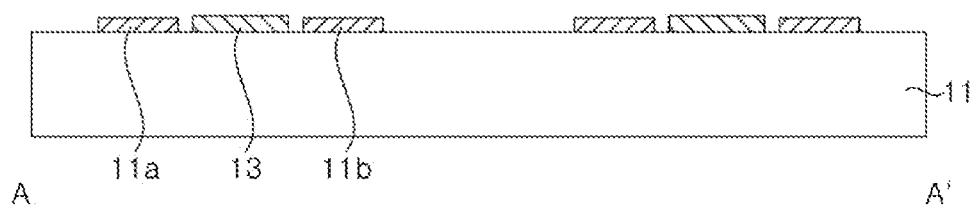

First, referring to FIG. 7A and FIG. 7B, a reflection layer 13 may be formed on the circuit board 11 having the pads 11a, 11b, 11c, and 11d. The reflection layer 13 may be formed of a reflective metal layer or a distributed Bragg reflector. When the reflection layer 13 includes the metal reflection layer, the reflection layer 13 is spaced apart from the pads 11a, 11b, 11c, and 11d. When the reflection layer 13 includes the distributed Bragg reflector, the reflection layer 13 may contact the pads 11a, 11b, 11c, and 11d.

Figure 8A:
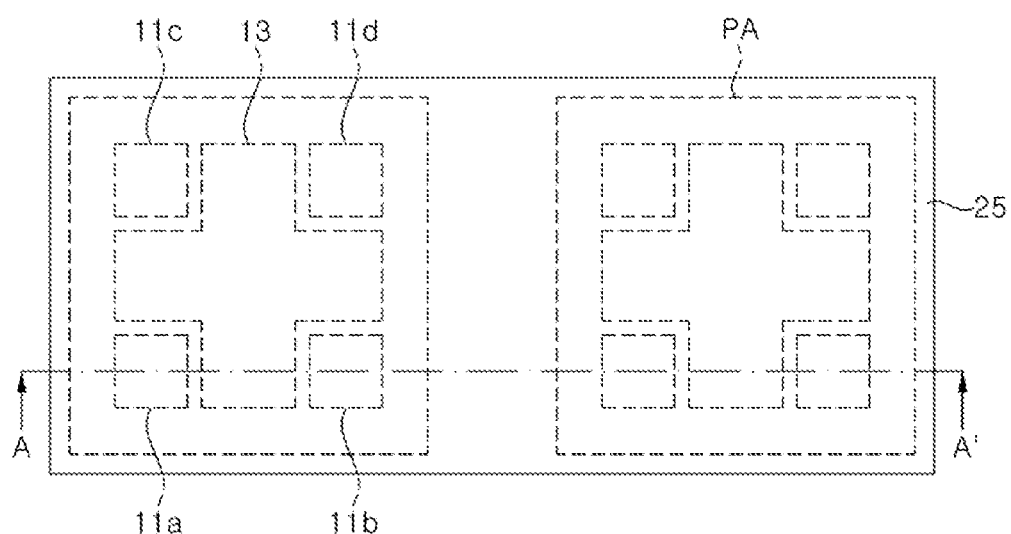
Figure 8B:
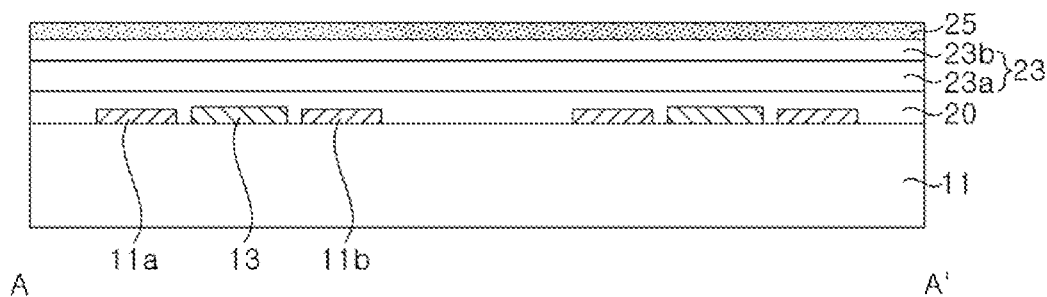

Referring to FIG. 8A and FIG. 8B, the first LED stack 23 is bonded to the circuit board 11 through a first bonding layer 20. The first LED stack 23 may be bonded to the circuit board 11 while being attached to the first temporary substrate 21b, and thereafter, the first temporary substrate 21b and the adhesive 27 may be removed from the first LED stack 23.

As described with reference to FIG. 4A, the first LED stack 23 having the size similar to that of the circuit board 11 may be bonded on the circuit board 11. Alternatively, as described with reference to FIG. 4B, the plurality of first LED stacks 23 may be tiled on the circuit board 11.

Figure 9A:
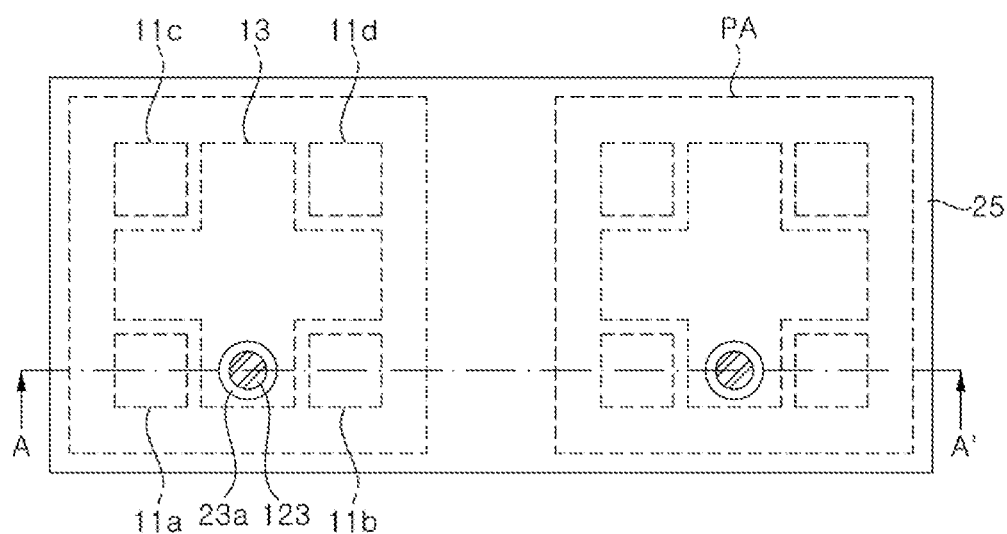
Figure 9B:
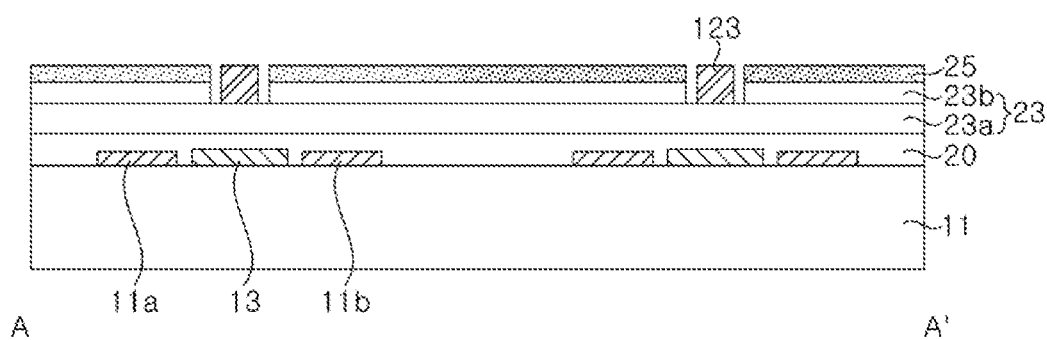

Referring to FIG. 9A and FIG. 9B, the first transparent electrode 25 and the second conductivity type semiconductor layer 23b are patterned using photolithography and etching techniques to expose the first conductivity type semiconductor layer 23a. This process corresponds to, for example, a mesa etching process, and may be performed using a photoresist pattern as an etching mask. For example, after forming the etching mask, the first transparent electrode 25 and the second conductivity type semiconductor layer 23b may be etched. The first transparent electrode 25 and the second conductivity type semiconductor layer 23b may be etched using the same dry etching process, or may be etched using different etching processes from each other. For example, the first transparent electrode 25 may be first etched using a wet etching technique, and then, the second conductivity type semiconductor layer 23b may be etched using a dry etching technique using the same etching mask.

Thereafter, first ohmic electrodes 123 are formed on the exposed first conductivity type semiconductor layer 23a.

Figure 10A:
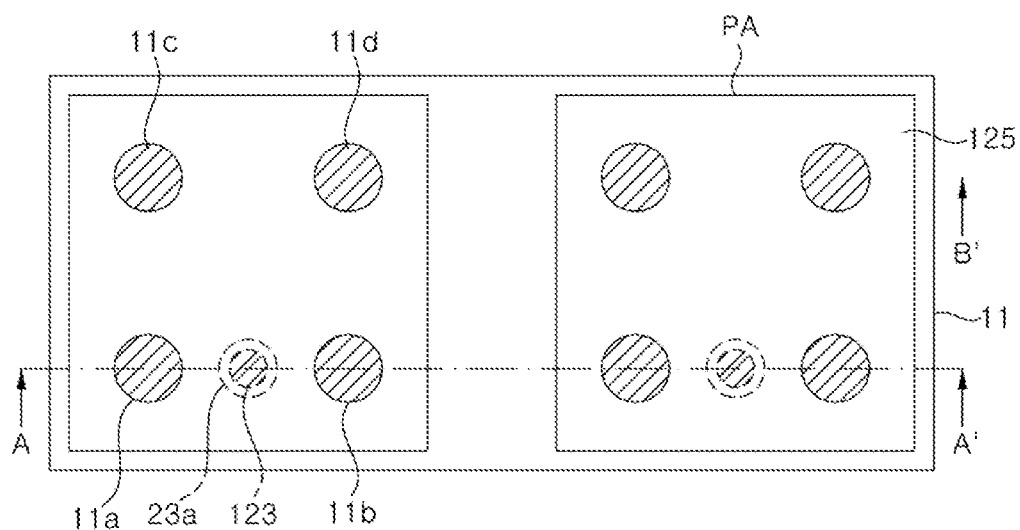
Figure 10B:
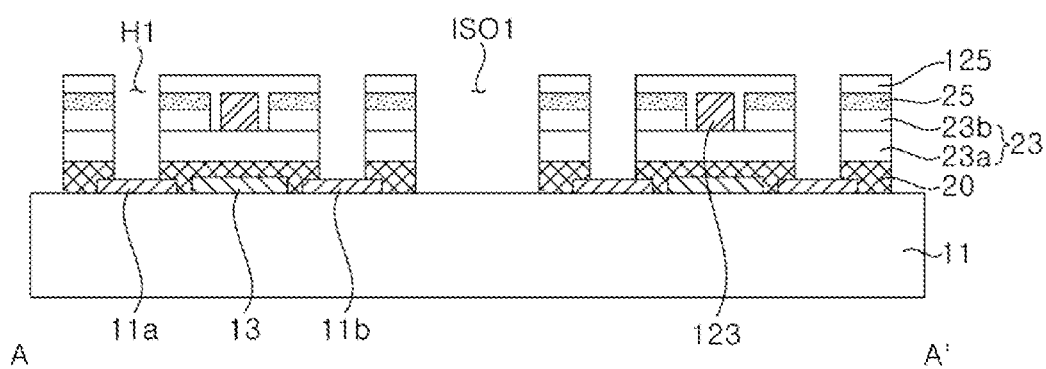

Referring to FIG. 10A and FIG. 10B, a lower insulation layer 125 is formed, and through holes H1 are formed. A device isolation region ISO1 may be formed together with the through holes H1.

The lower insulation layer 125 covers the first transparent electrode 25 and the first ohmic electrode 123. The lower insulation layer 125 may also function as a hard mask for forming the through holes H1.

The through holes H1 pass through the lower insulation layer 125, the first transparent electrode 25, the first LED stack 23, and the first bonding layer 20, and expose the pads 11a, 11b, 11c, and 11d. The device isolation region ISO1 may be formed together while forming the through holes H1. The device isolation region ISO1 separates regions between the light emitting devices 100.

Figure 11A:
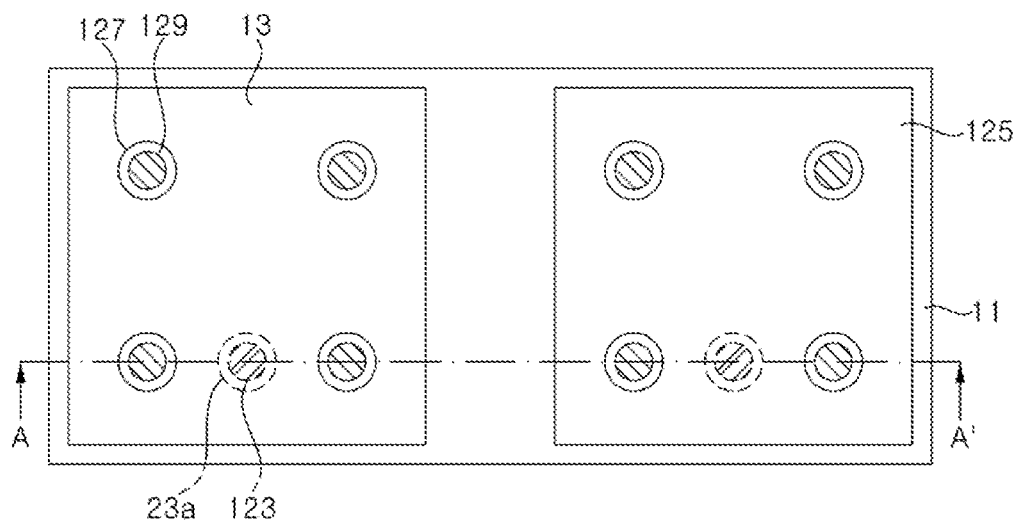
Figure 11B:
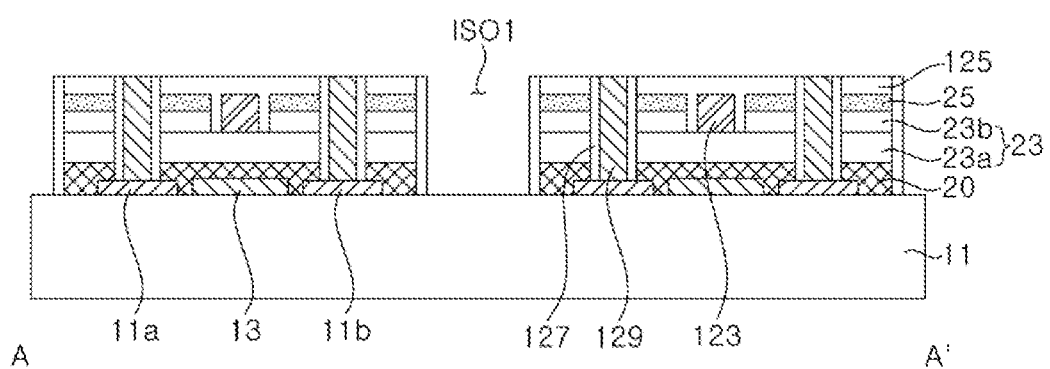

Referring to FIG. 11A and FIG. 11B, a first sidewall insulation layer 127 and first through vias 129 are formed. First, the first sidewall insulation layer 127 is formed on the lower insulation layer 125 on which the through holes H1 are formed. The first sidewall insulation layer 127 may be formed using, for example, atomic layer deposition technology. The first sidewall insulation layer 127 may cover an upper surface of the lower insulation layer 125, and may further cover sidewalls and bottom surfaces of the through holes H1. The first sidewall insulation layer 127 formed on the bottom surfaces of the through holes H1 may be removed through a blanket etching process to expose the pads 11a, 11b, 11c, and 11d. The first sidewall insulation layer 127 covering the upper surface of the lower insulation layer 125 may be removed during the blanket etching process. The first sidewall insulation layer 127 may also be formed on a sidewall of the device isolation region ISO1.

Subsequently, after forming a seed layer on an entire surface thereof and forming a metal layer using a plating technique, a photoresist pattern is removed. The metal layers formed on the upper surface of the lower insulation layer 125 are removed using a chemical mechanical polishing technique, thereby forming the first through vias 129 filling the through holes H1. The device isolation region ISO1 may be covered with the photoresist pattern, and thus, formation of the metal layer may be blocked. The photoresist pattern is formed after forming the seed layer and before plating the metal layer, and defines a region where the metal layer is to be formed. The photoresist pattern may be removed using a chemical mechanical polishing technique, or may be removed through a lift-off process prior to performing the chemical mechanical polishing process. In addition, the seed layer formed in the device isolation region ISO1 may be removed through a selective etching process.

In some exemplary embodiments, a capping layer may be added on the metal layer formed in the through holes H1 or an anti-oxidation treatment, such as ENIG, ENEPIG, or the like, may be performed so as to protect the first through vias 129.

Figure 12A:
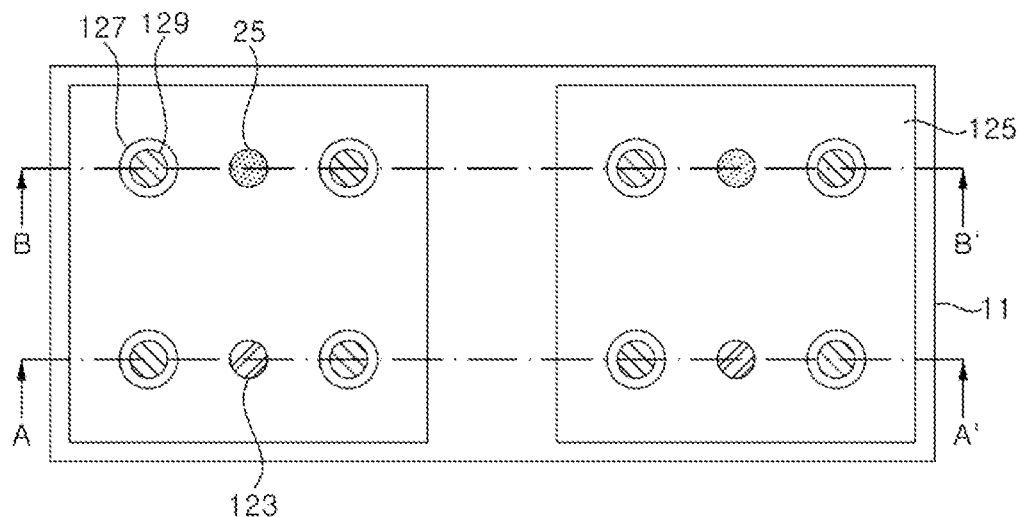
Figure 12B:
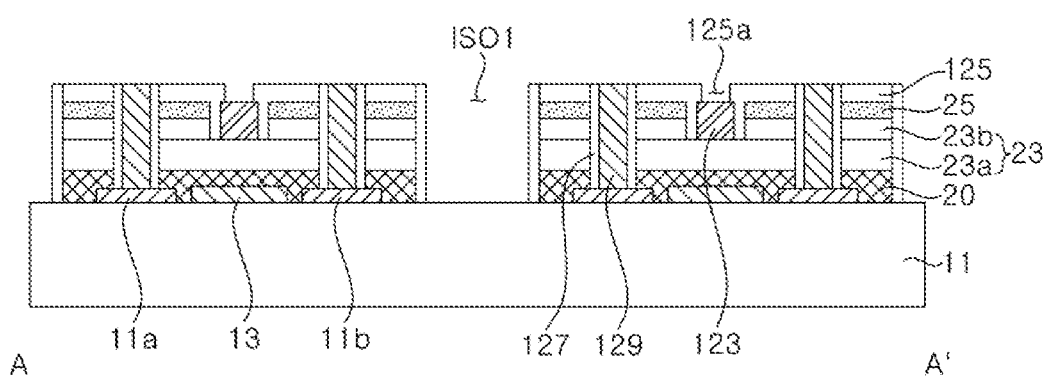
Figure 12C:
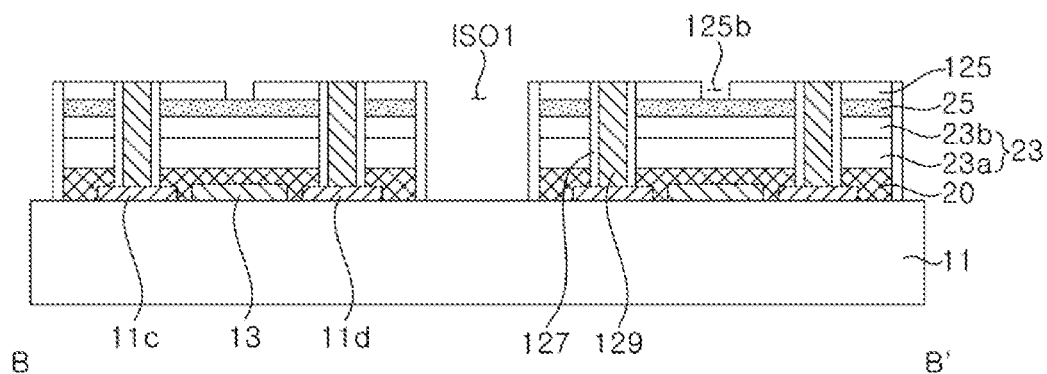

Referring to FIG. 12A, FIG. 12B, and FIG. 12C, the lower insulation layer 125 is patterned to form openings 125a exposing the first ohmic electrode 123 and openings 125b exposing the first transparent electrode 25. The lower insulation layer 125 may be patterned through photolithography and etching processes. The openings 125b may be disposed relatively close to the first through via 129 connected to the pad 11d.

Figure 13A:
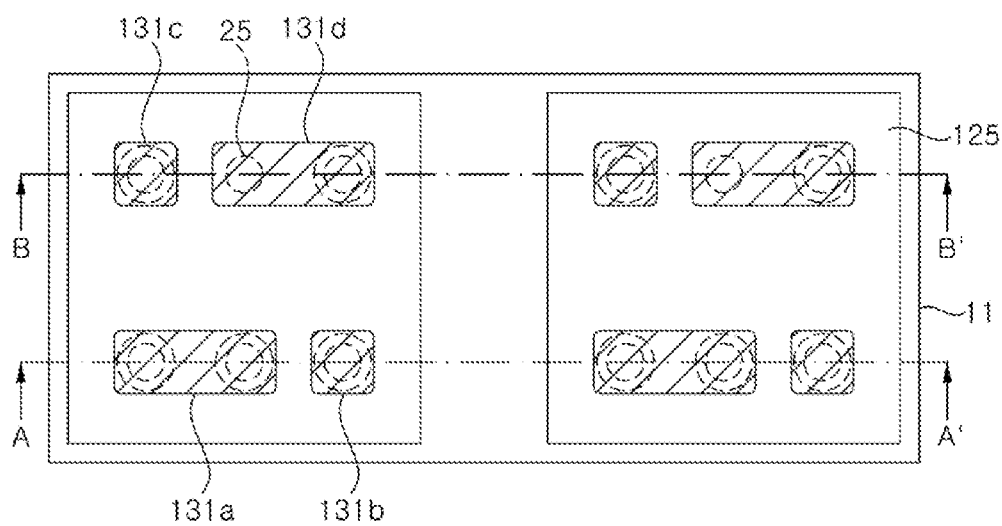
Figure 13B:
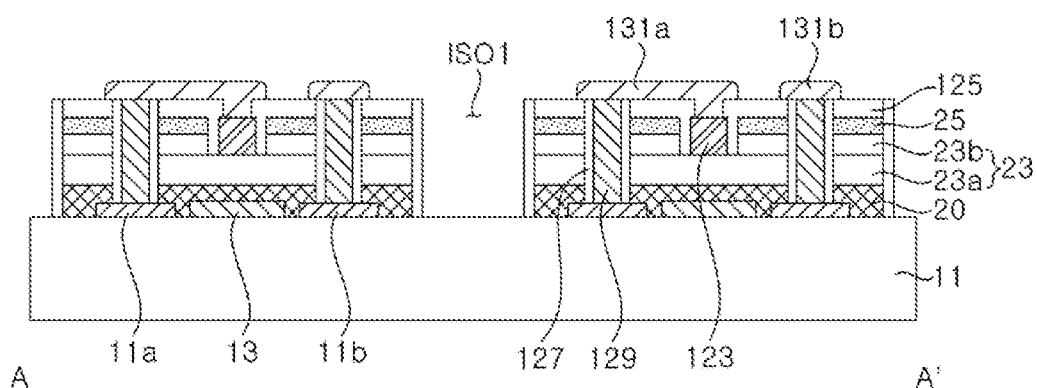
Figure 13C:
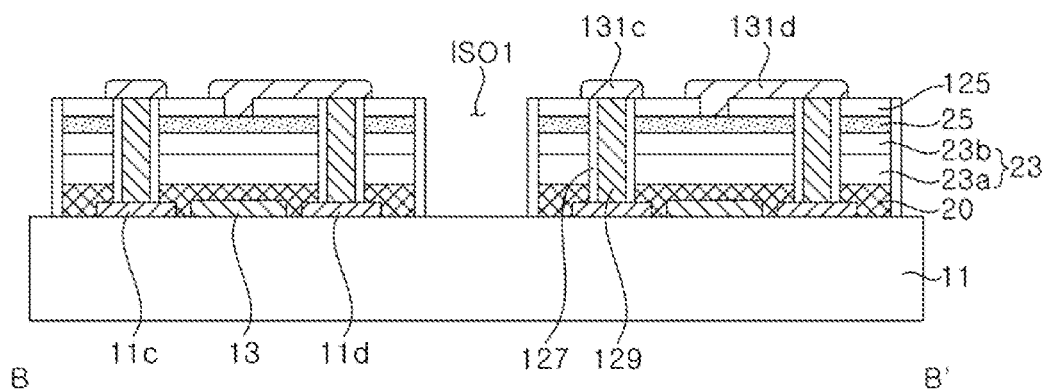

Referring to FIG. 13A, FIG. 13B, and FIG. 13C, first connection pads 131a, 131b, 131c, and 131d are formed on the lower insulation layer 125. The first connection pads 131a, 131b, 131c, and 131d may be formed using photolithography and etching processes, or a lift-off technique.

The first connection pad 131a electrically connects the first through via 129 connected to the common pad 11a to the first ohmic electrode 123 exposed through the opening 125a, and the connection pad 131d electrically connects the first through via 129 connected to the pad 11d to the first transparent electrode 25 exposed through the opening 125b.

The first connection pads 131b and 131c are electrically connected to the first through vias 129 connected to the pads 11b and 11c, respectively.

Figure 14A:
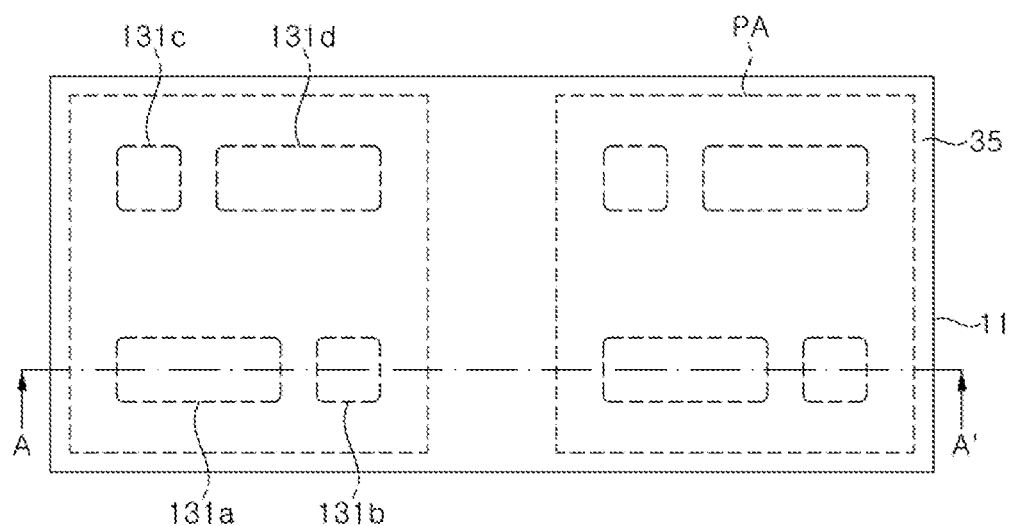
Figure 14B:
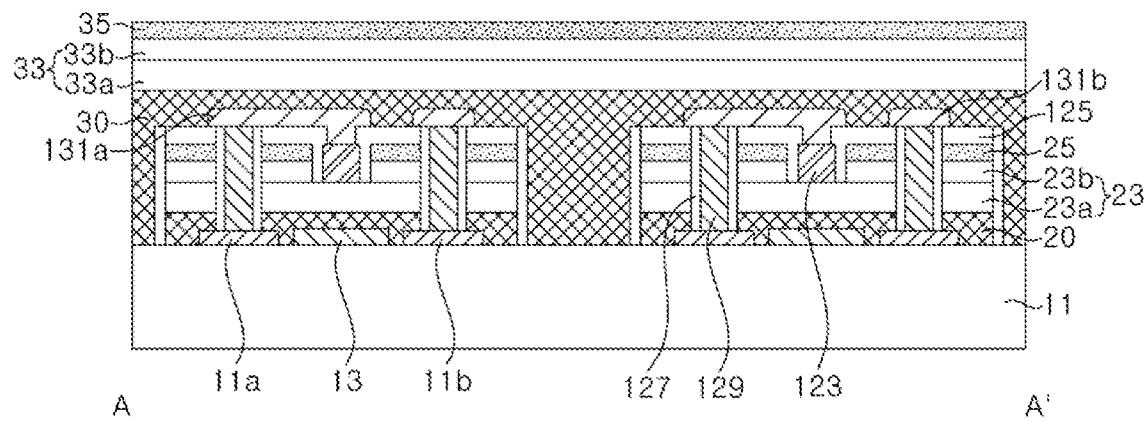

Referring to FIG. 14A and FIG. 14B, the second LED stack 33 is bonded on the first LED stack 23. The second LED stack 33 may be bonded on the first LED stack 23 through a second bonding layer 30. The first conductivity type semiconductor layer 33a may be in contact with the second bonding layer 30, and the second transparent electrode 35 may be disposed on an upper side of the second LED stack 33 to oppose the second bonding layer 30. The second LED stack 33 may be bonded to the first LED stack 23 while being attached to the second temporary substrate 31b. The second temporary substrate 31b and the adhesive 37 may be removed from the second LED stack 33 thereafter.

The second bonding layer 30 may fill the device isolation region ISO1, and may cover the first connection pads 131a, 131b, 131c, and 131d.

Figure 15A:
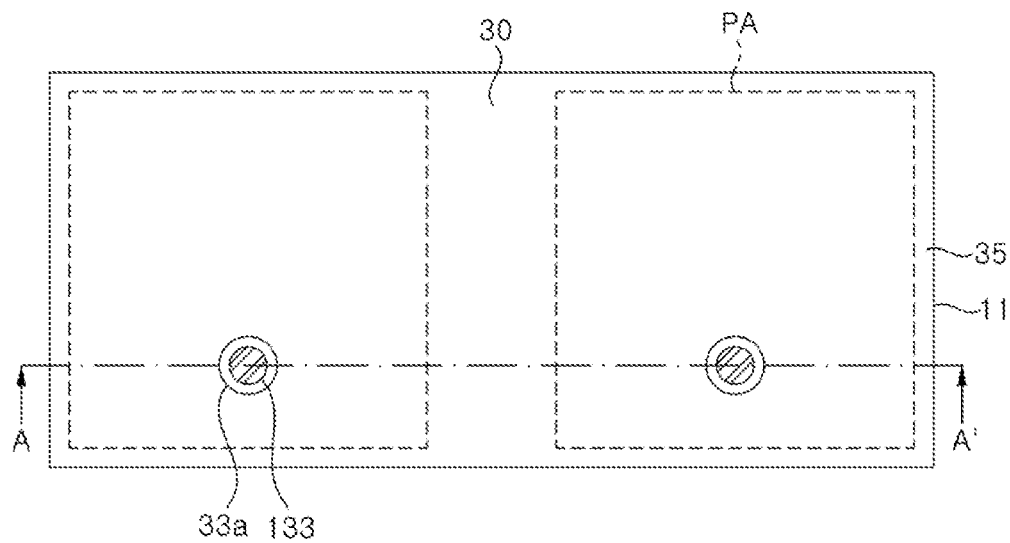
Figure 15B:
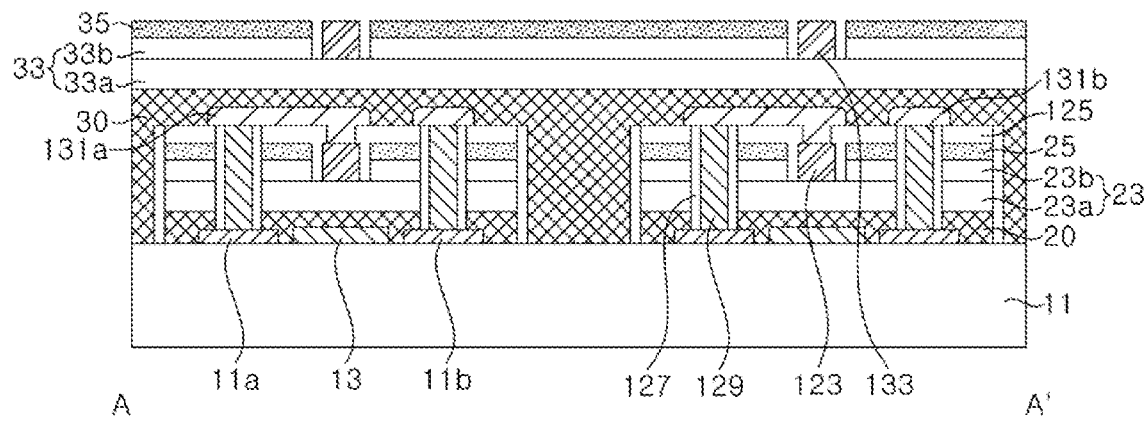

Referring to FIG. 15A and FIG. 15B, the second transparent electrode 35 and the second conductivity type semiconductor layer 33b are patterned using photolithography and etching techniques to expose the first conductivity type semiconductor layer 33a. This process corresponds to, for example, a mesa etching process, and may be performed using a photoresist pattern as an etching mask. For example, after forming the etching mask, the second transparent electrode 35 and the second conductivity type semiconductor layer 33b may be etched. The second transparent electrode 35 and the second conductivity type semiconductor layer 33b may be etched using the same dry etching process, or may be etched using different etching processes from each other. For example, the second transparent electrode 35 may be first etched using a wet etching technique, and then, the second conductivity type semiconductor layer 33b may be etched using a dry etching technique using the same etching mask.

Thereafter, second ohmic electrodes 133 are formed on the exposed first conductivity type semiconductor layer 33a.

Figure 16A:
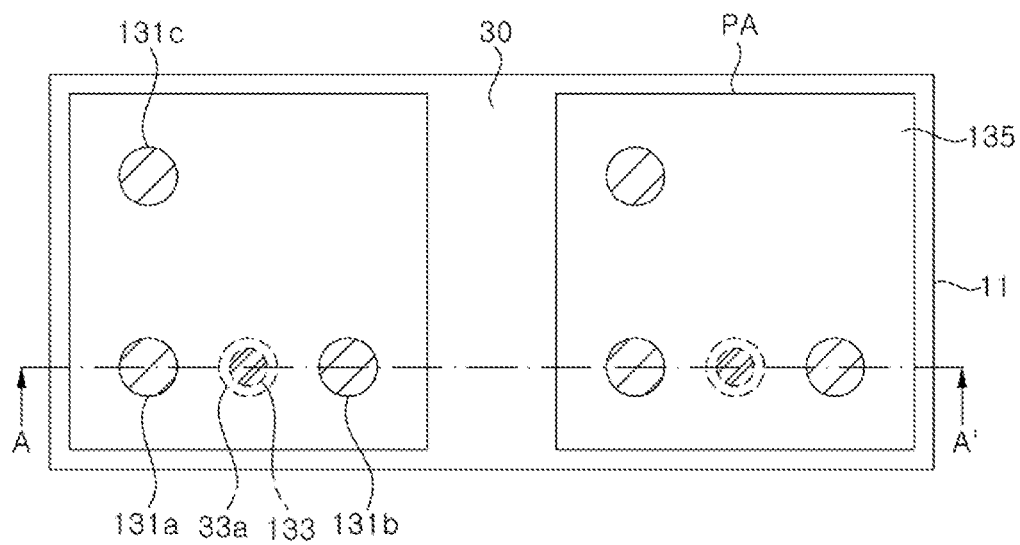
Figure 16B:
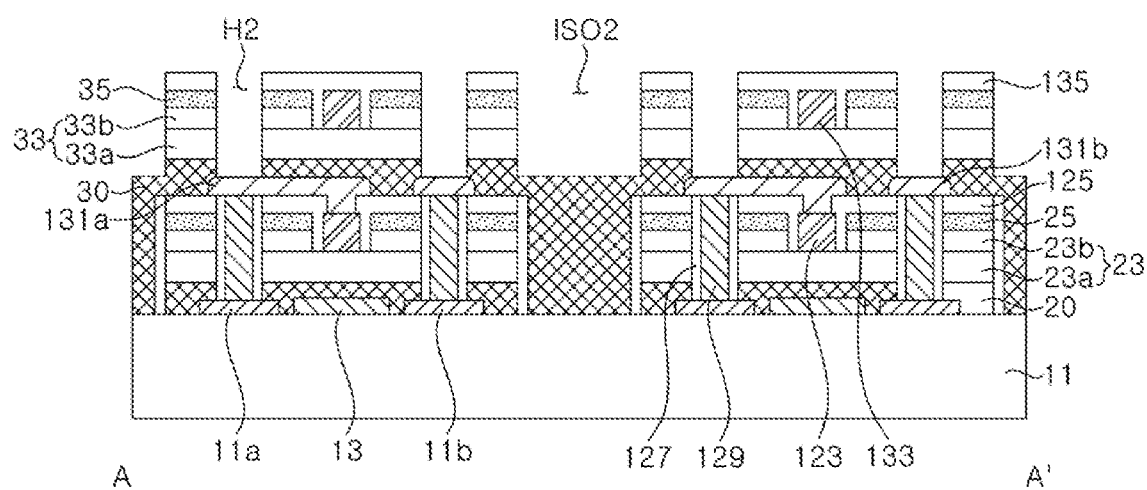

Referring to FIG. 16A and FIG. 16B, an intermediate insulation layer 135 is formed, and through holes H2 are formed. A device isolation region ISO2 may be formed together with the through holes H2.

The intermediate insulation layer 135 covers the second transparent electrode 35 and the second ohmic electrode 133. The intermediate insulation layer 135 may also function as a hard mask for forming through holes H2.

The through holes H2 pass through the intermediate insulation layer 135, the second transparent electrode 35, the second LED stack 33, and the second bonding layer 30, and expose the first connection pads 131a, 131b, and 131c connected to the first through vias 129. The device isolation region ISO2 may be formed together while forming the through holes H2. The device isolation region ISO2 divides regions between the light emitting devices 100. The second bonding layer 30 may be exposed by the device isolation region ISO2. In another exemplary embodiment, the second bonding layer 30 in the isolation region ISO2 may be removed to expose an upper surface of the circuit board 11.

Figure 17A:
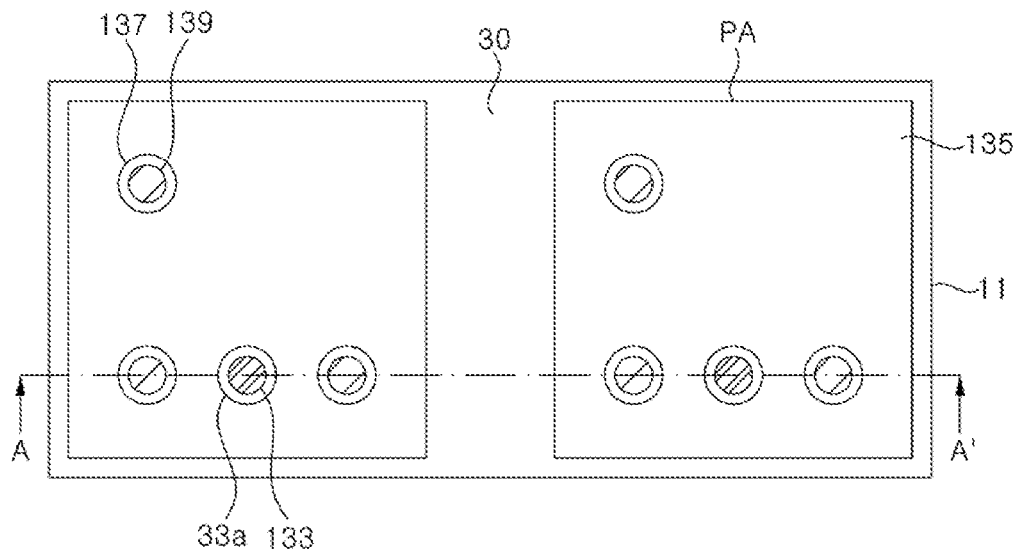
Figure 17B:
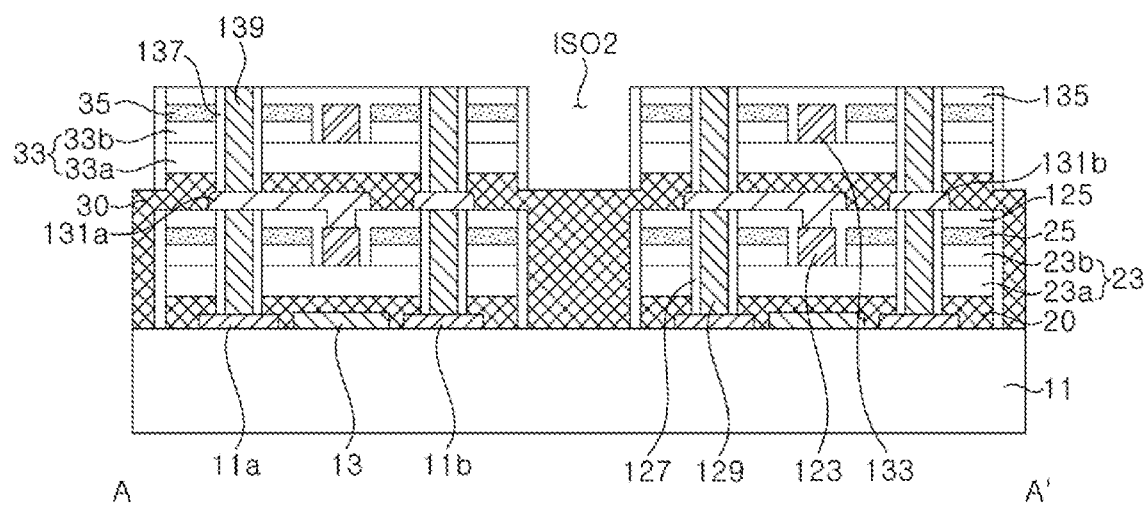

Referring to FIGS. 17A and 17B, a second sidewall insulation layer 137 and second through vias 139 are formed. First, the second sidewall insulation layer 137 is formed on the intermediate insulation layer 135 in which the through holes H2 are formed. The second sidewall insulation layer 137 may be formed using, for example, atomic layer deposition technology. The second sidewall insulation layer 137 may cover an upper surface of the intermediate insulation layer 135, and may further cover sidewalls and bottom surfaces of the through holes H2. The second sidewall insulation layer 137 formed on the bottom surfaces of the through holes H2 may be removed through a blanket etching process to expose the first connection pads 131a, 131b, and 131c. The second sidewall insulation layer 137 covering the upper surface of the intermediate insulation layer 135 may be removed during the blanket etching process. Meanwhile, the second sidewall insulation layer 137 may also be formed on a sidewall of the device isolation region ISO2.

Subsequently, by forming a seed layer on an entire surface thereof and forming a metal layer using a plating technique, a photoresist pattern is removed. The metal layers formed on the upper surface of the intermediate insulation layer 135 are removed using a chemical mechanical polishing technique, thereby forming the second through vias 139 filling the through holes H2. Since a process of forming the second through vias 139 is substantially similar to that of forming the first through vias 129, repeated descriptions thereof will be omitted to avoid redundancy.

In some exemplary embodiment, a capping layer may be added on the metal layer formed in the through holes H2 or an anti-oxidation treatment, such as ENIG, ENEPIG, or the like, may be performed to protect the second through vias 139.

Figure 18A:
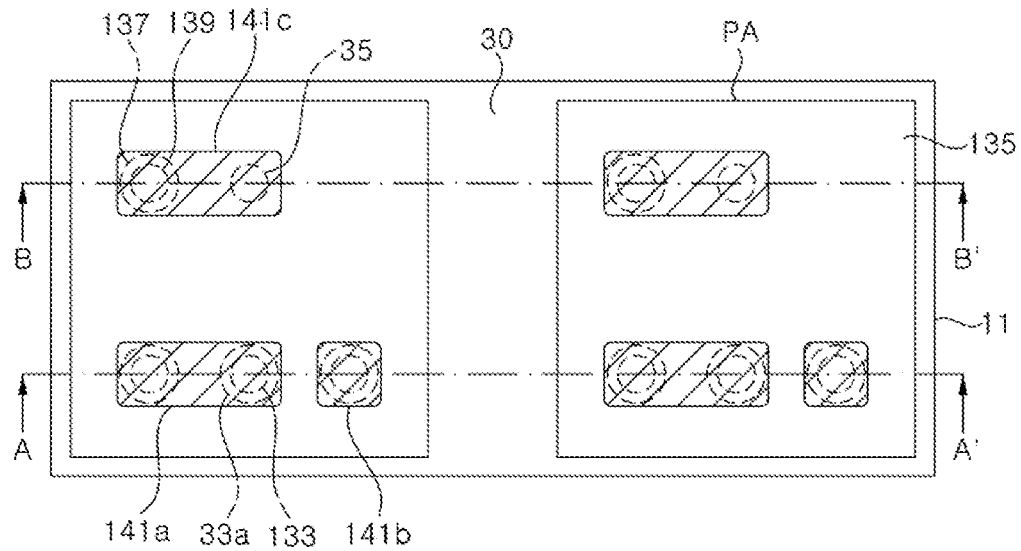
Figure 18B:
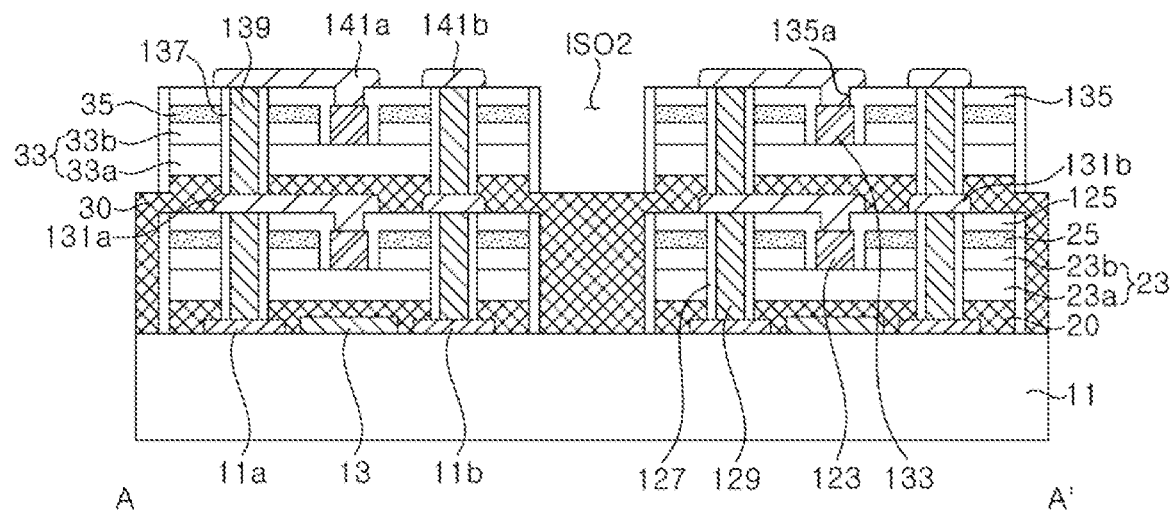
Figure 18C:
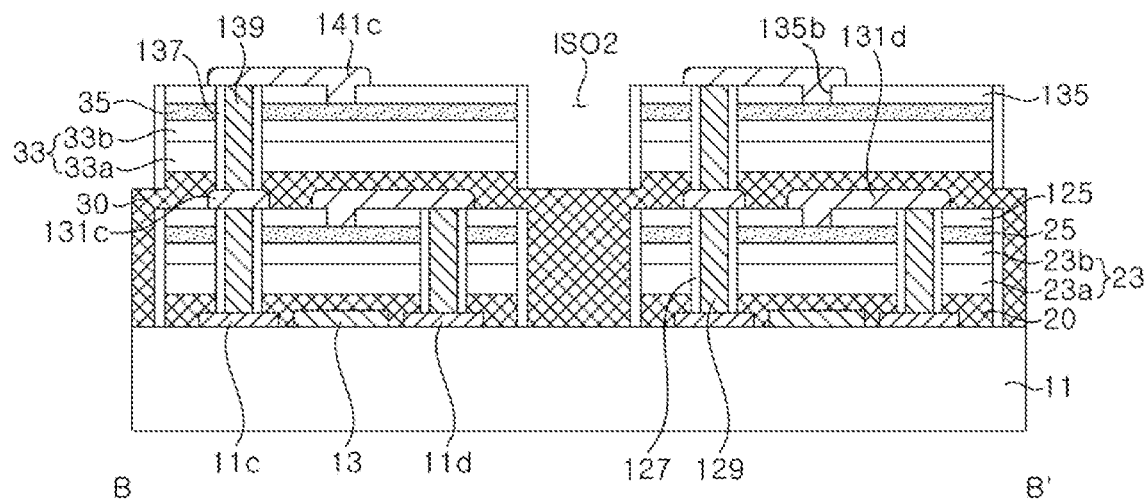

Referring to FIG. 18A, FIG. 18B, and FIG. 18C, the intermediate insulation layer 135 is patterned to form openings 135a exposing the second ohmic electrode 133 and openings 135b exposing the second transparent electrode 35. The intermediate insulation layer 135 may be patterned through photolithography and etching processes. The openings 135b may be disposed relatively close to the second through via 139 electrically connected to the pad 11c.

Subsequently, second connection pads 141a, 141b, and 141c are formed on the intermediate insulation layer 135. The second connection pads 141a, 141b, and 141c may be formed using photolithography and etching processes or a lift-off technique.

The second connection pad 141a electrically connects the second through via 139 connected to the common pad 11a to the second ohmic electrode 133 exposed through the opening 135a, and the connection pad 141c electrically connects the second through via 139 connected to the pad 11c to the second transparent electrode 35 exposed through the opening 135b.

The second connection pad 141b is electrically connected to the second through vias 139 connected to the pad 11b.

Figure 19A:
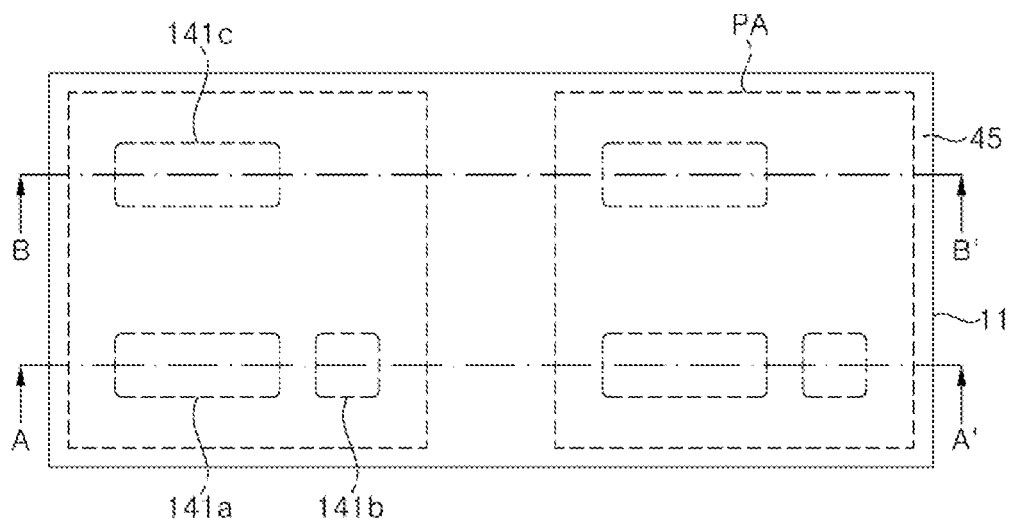
Figure 19B:
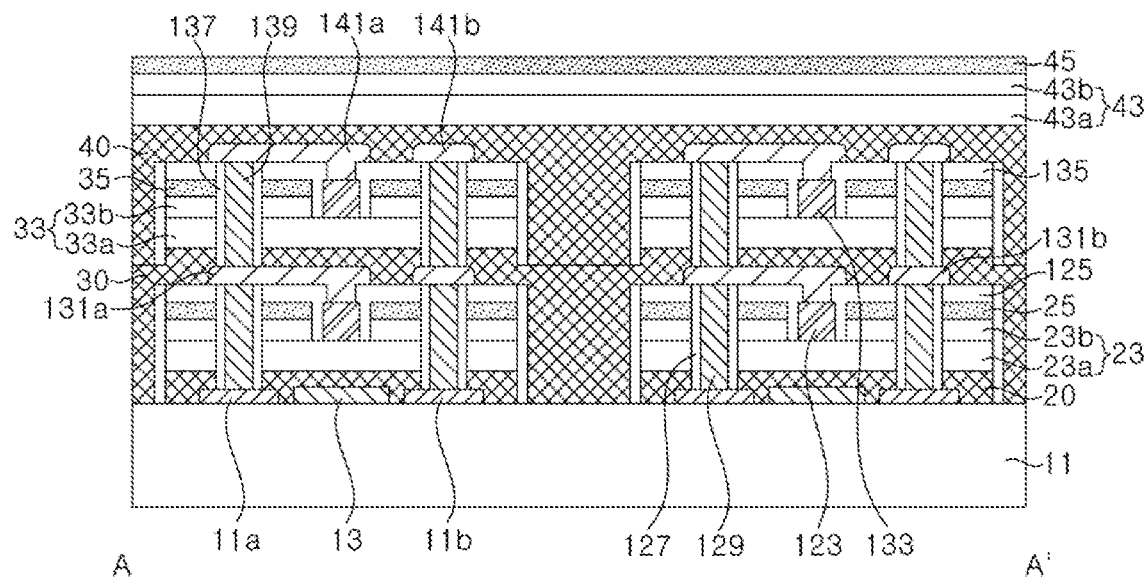

Referring to FIG. 19A and FIG. 19B, the third LED stack 43 is bonded on the second LED stack 33. The third LED stack 43 may be bonded on the second LED stack 33 through a third bonding layer 40. The first conductivity type semiconductor layer 43a may be in contact with the third bonding layer 40, and the third transparent electrode 45 may be disposed on an upper side of the third LED stack 43 to oppose the third bonding layer 40. The third LED stack 43 may be bonded to the second LED stack 33 while being attached to the third temporary substrate 41b. The third temporary substrate 41b and the adhesive 47 may be removed from the third LED stack 43 thereafter.

The third bonding layer 40 may fill the device isolation region ISO2, and may cover the second connection pads 141a, 141b, and 141c.

Figure 20A:
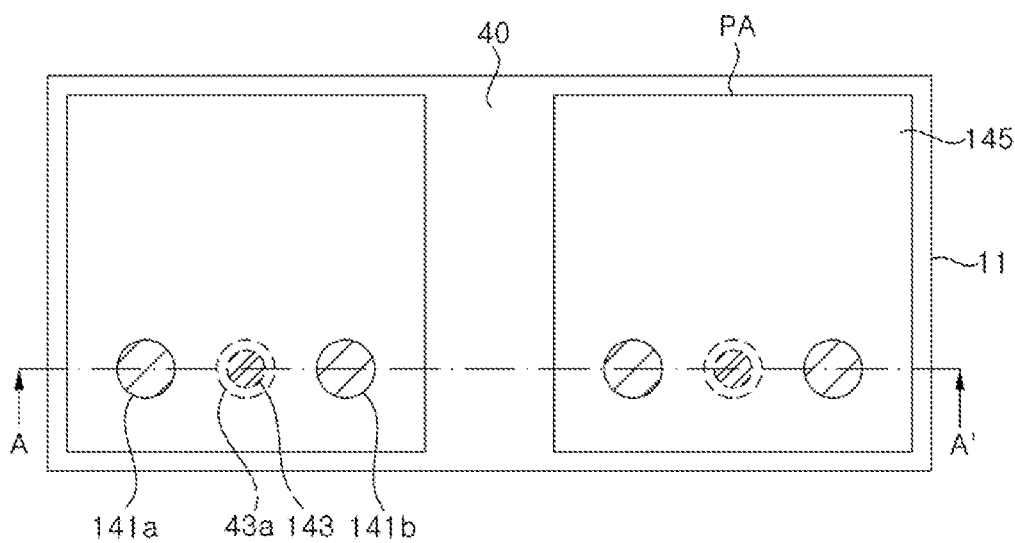
Figure 20B:
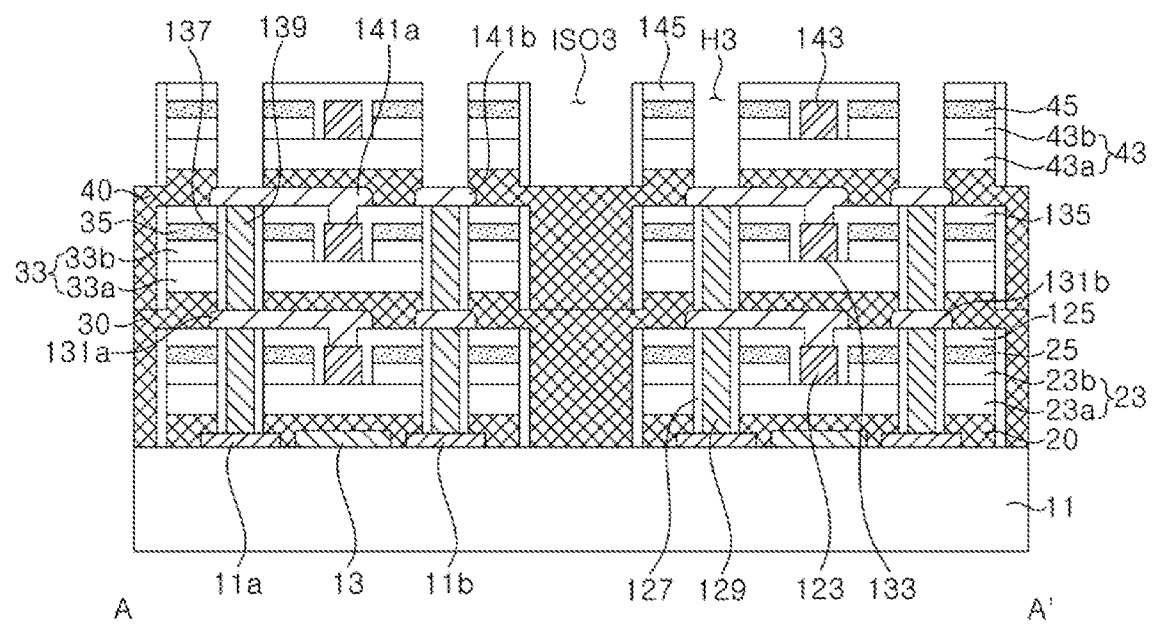

Referring to FIG. 20A and FIG. 20B, the third transparent electrode 45 and the second conductivity type semiconductor layer 43b are patterned using photolithography and etching techniques to expose the first conductivity type semiconductor layer 43a. This process corresponds to, for example, a mesa etching process, and may be performed using a photoresist pattern as an etching mask. For example, after forming the etching mask, the third transparent electrode 45 and the second conductivity type semiconductor layer 43b may be etched. The third transparent electrode 45 and the second conductivity type semiconductor layer 43b may be etched using the same dry etching process, or may be etched using different etching processes from each other. For example, the third transparent electrode 45 may be first etched using a wet etching technique, and then, the second conductivity type semiconductor layer 43b may be etched using a dry etching technique using the same etching mask.

Thereafter, third ohmic electrodes 133 are formed on the exposed first conductivity type semiconductor layer 43a.

Subsequently, an upper insulation layer 145 covering the third transparent electrode 45 and the third ohmic electrodes 133 is formed, and through holes H3 are formed. A device isolation region ISO3 may be formed together with the through holes H3. The upper insulation layer 145 may also function as a hard mask for forming the through holes H3.

The through holes H3 pass through the upper insulation layer 145, the third transparent electrode 45, the third LED stack 43, and the third bonding layer 40, and expose the second connection pads 141a and 141b. The device isolation region ISO3 may be formed together while forming the through holes H3. The device isolation region ISO3 divides regions between the light emitting devices 100. The third bonding layer 40 may be exposed by the device isolation region ISO3. In another exemplary embodiment, the third bonding layer 40 in the isolation region ISO3 may be removed to expose the upper surface of the circuit board 11.

Figure 21A:
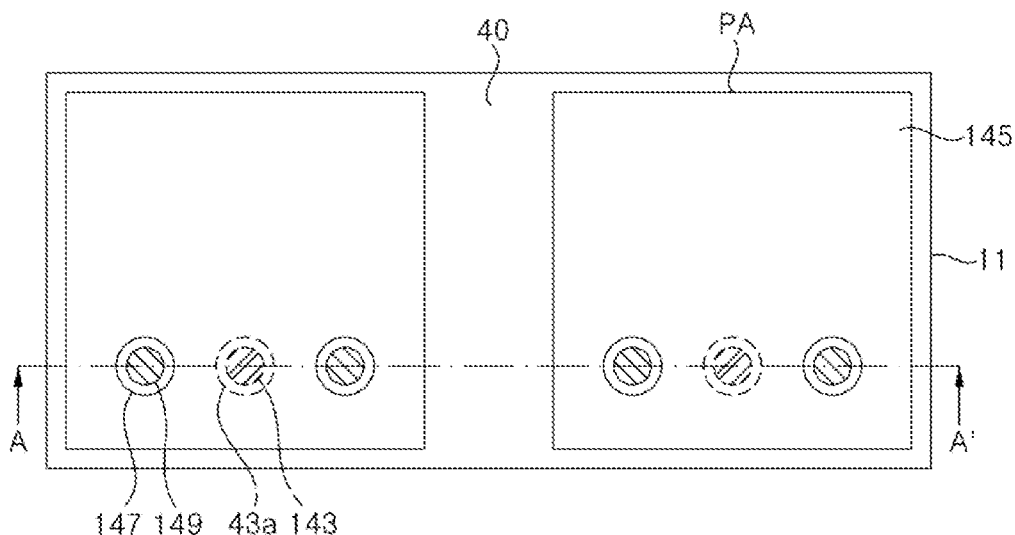
Figure 21B:
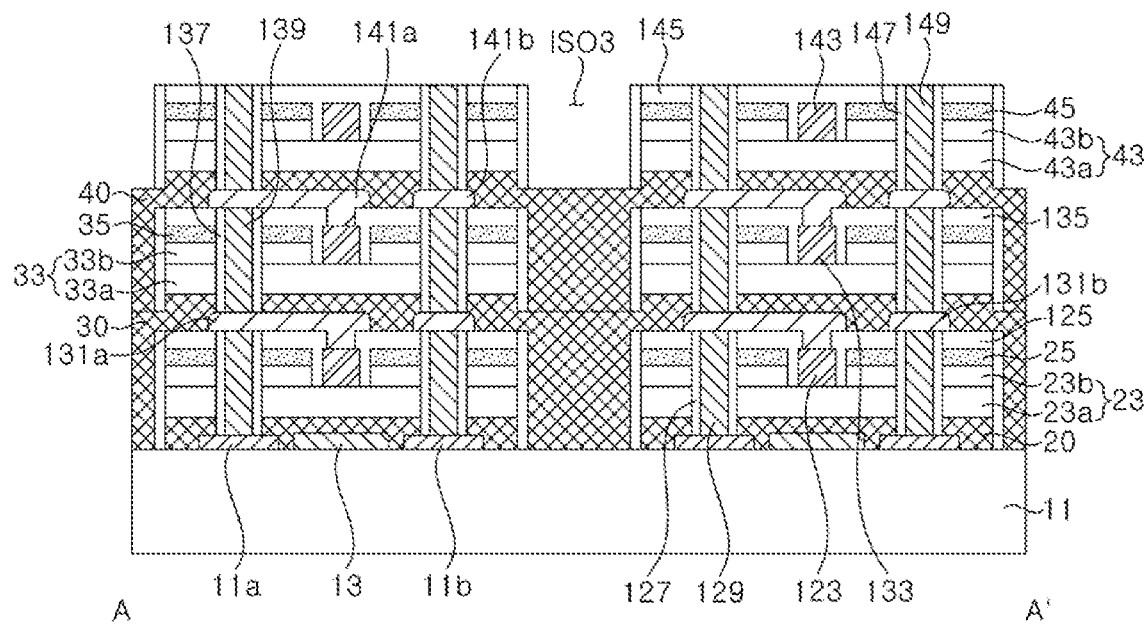
Figure 22A:
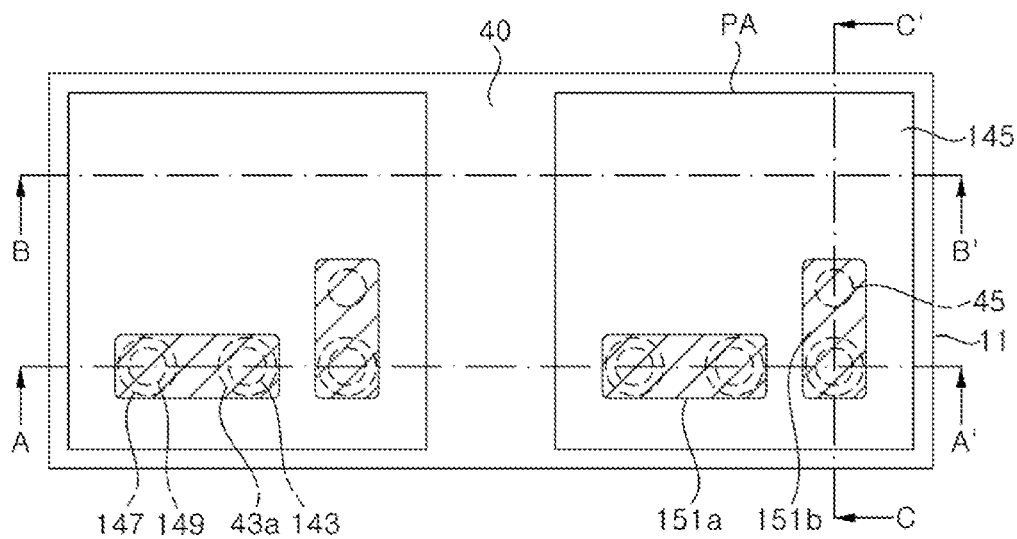
Figure 22B:
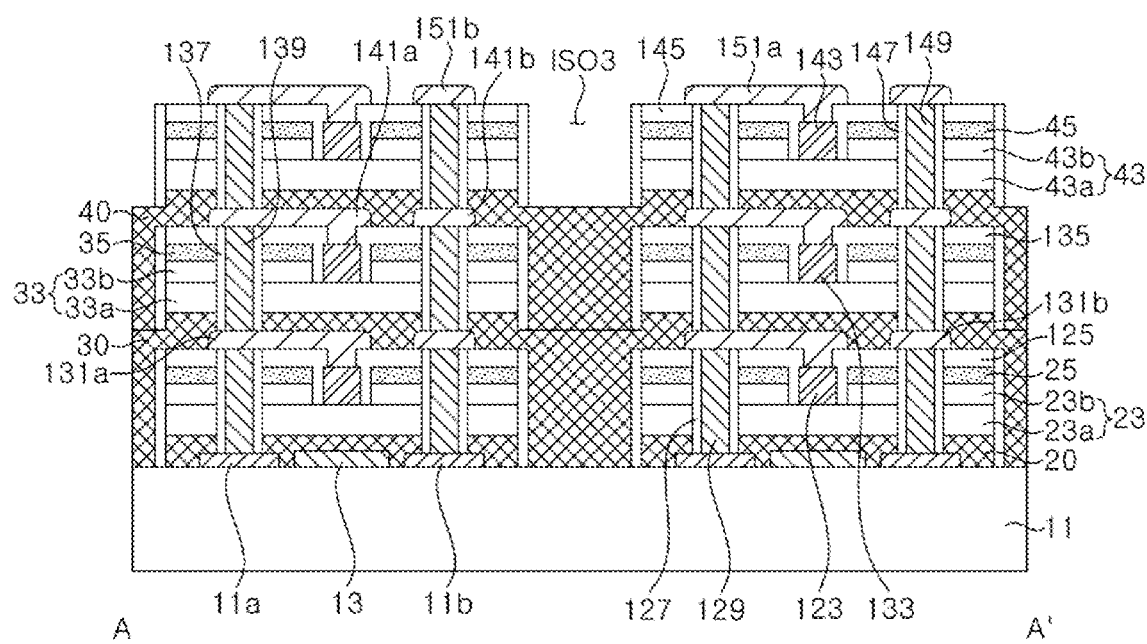
Figure 22C:
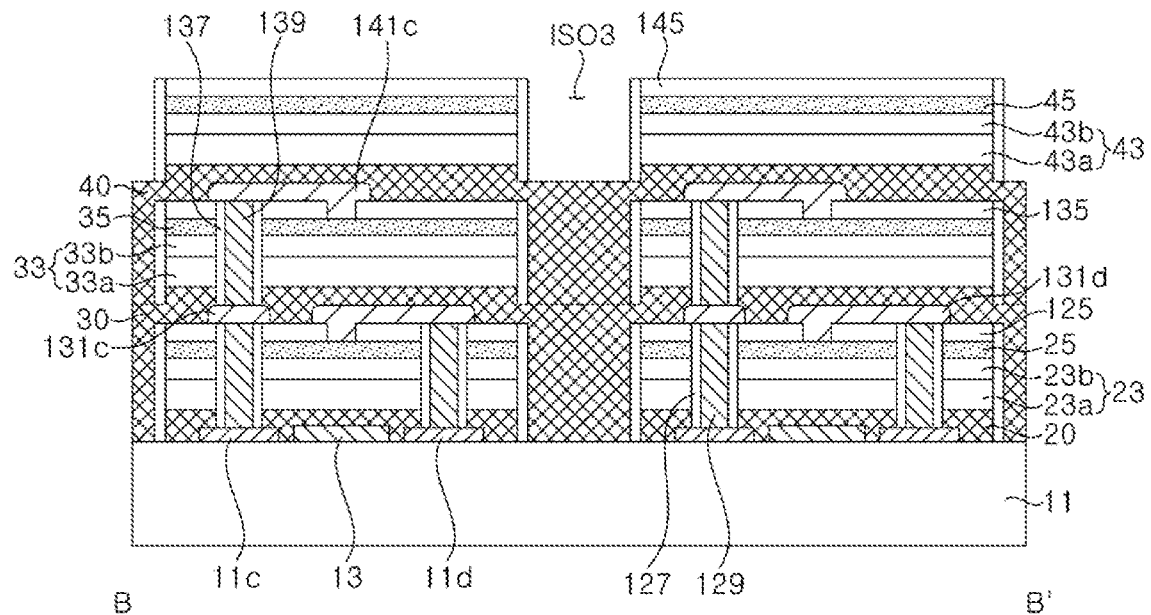
Figure 22D:
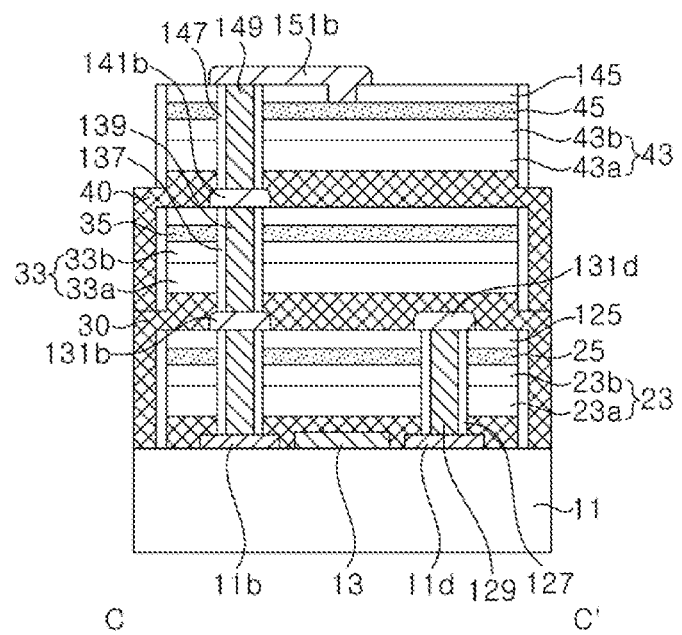

Referring to FIG. 21A and FIG. 21B, a third sidewall insulation layer 147 and third through vias 149 are formed. First, the third sidewall insulation layer 147 is formed on the upper insulation layer 145 in which through holes H3 are formed. The third sidewall insulation layer 147 may be formed using, for example, atomic layer deposition technology. The third sidewall insulation layer 147 may cover an upper surface of the upper insulation layer 145, and may further cover sidewalls and bottom surfaces of the through holes H3. The third sidewall insulation layer 147 formed on the bottom surfaces of the through holes H3 may be removed through a blanket etching process to expose the second connection pads 141a and 141b. The third sidewall insulation layer 147 covering the upper surface of the upper insulation layer 145 may be removed during the blanket etching process. Meanwhile, the third sidewall insulation layer 147 may be formed on a sidewall of the device isolation region ISO3.

Subsequently, by forming a seed layer on an entire surface thereof and forming a metal layer using a plating technique, a photoresist pattern is removed. The metal layers formed on the upper surface of the upper insulation layer 145 are removed using a chemical mechanical polishing technique, thereby forming the third through vias 149 filling the through holes H3. Since a process of forming the third through vias 149 is substantially similar to that of forming the first through vias 129, repeated descriptions thereof will be omitted to avoid redundancy.

In some exemplary embodiments, a capping layer may be added on the metal layer formed in the through holes H3 or an anti-oxidation treatment, such as ENIG, ENEPIG, or the like, may be performed to protect the third through vias 149.

Referring to FIG. 22A, FIG. 22B, FIG. 22C, and FIG. 22D, the upper insulation layer 145 is patterned to form openings exposing the third ohmic electrode 143 and openings exposing the third transparent electrode 45. The upper insulation layer 145 may be patterned through photolithography and etching processes. The openings exposing the third transparent electrode 45 may be disposed relatively close to the third through vias 149 electrically connected to the pad 11b.

Subsequently, third connection pads 151a and 151b are formed on the upper insulation layer 145. The third connection pads 151a and 151b may be formed using photolithography and etching processes or a lift-off technique.

The third connection pad 151a electrically connects the third through via 149 connected to the common pad 11a to the third ohmic electrode 143 exposed through one of the openings, and the third connection pad 151b electrically connects the third through via 149 connected to the pad 11b to the third transparent electrode 45 exposed through another one of the openings.

In this manner, the light emitting devices 100 and the pixel regions PA on the circuit board 11 are formed. Subsequently, the circuit board 11 may be divided into an appropriate size, and accordingly, the display panel may be formed in a desired size. Additionally, the device isolation region ISO3 may be filled with a light blocking material or a light reflecting material.

Figure 23A:
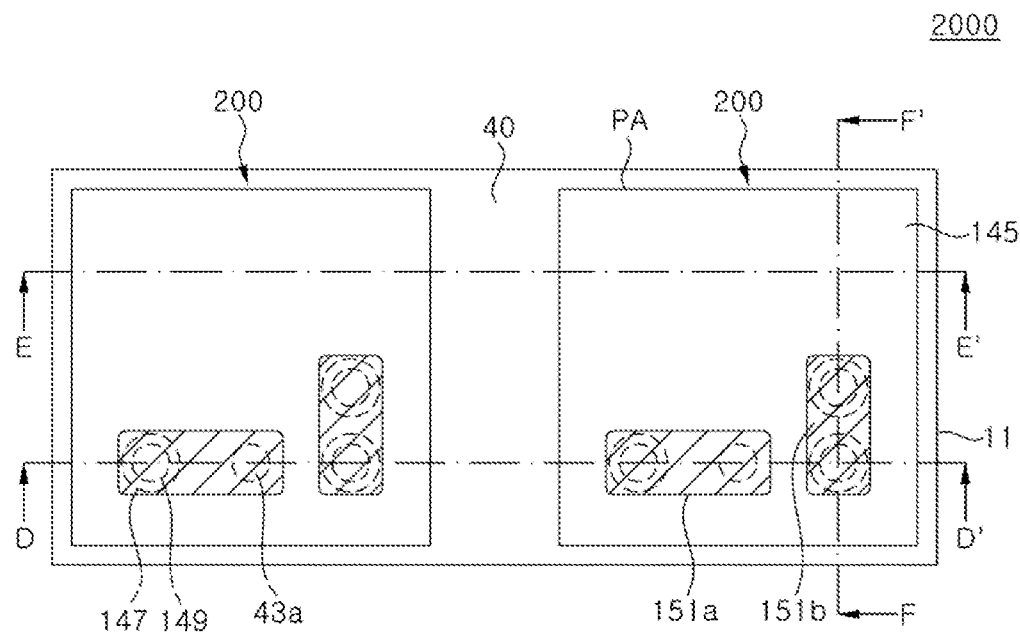
FIG. 23A is a schematic enlarged plan view of a portion of a display panel according to another exemplary embodiment.
Figure 23B:
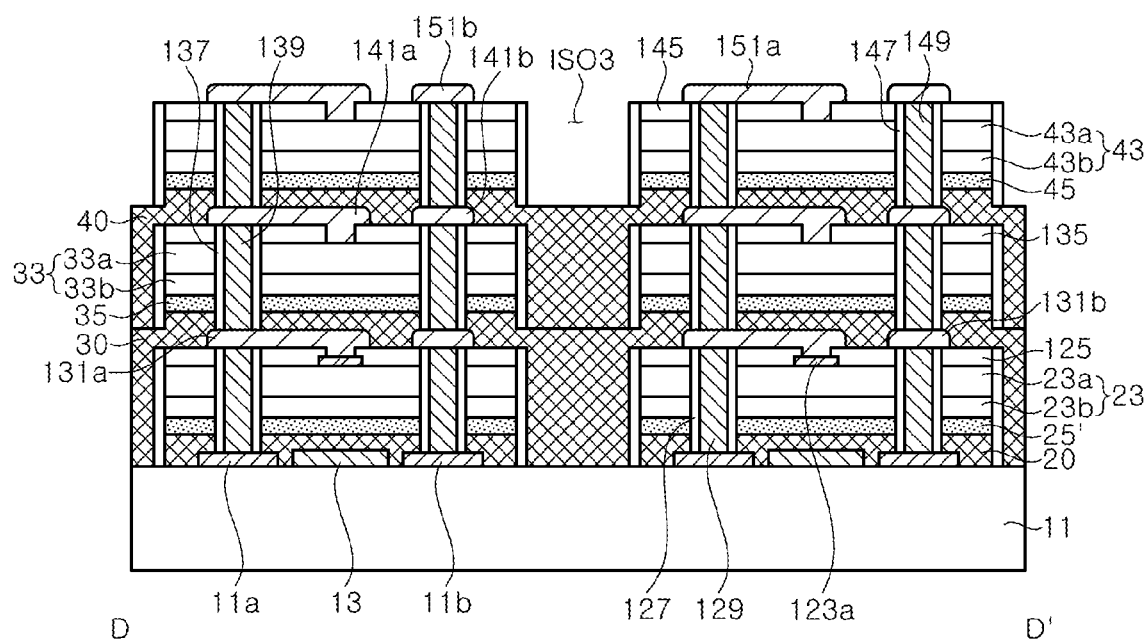
FIG. 23B is a schematic cross-sectional view taken along line D-D' of FIG. 23A.
Figure 23C:
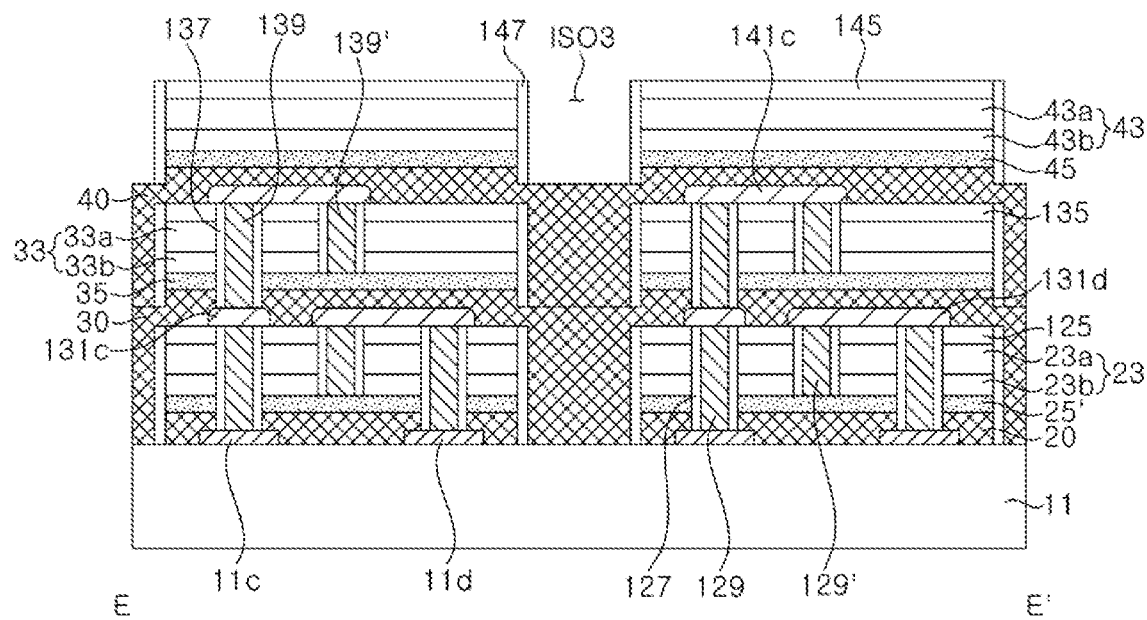
FIG. 23C is a schematic cross-sectional view taken along line E-E' of FIG. 23A.
Figure 23D:
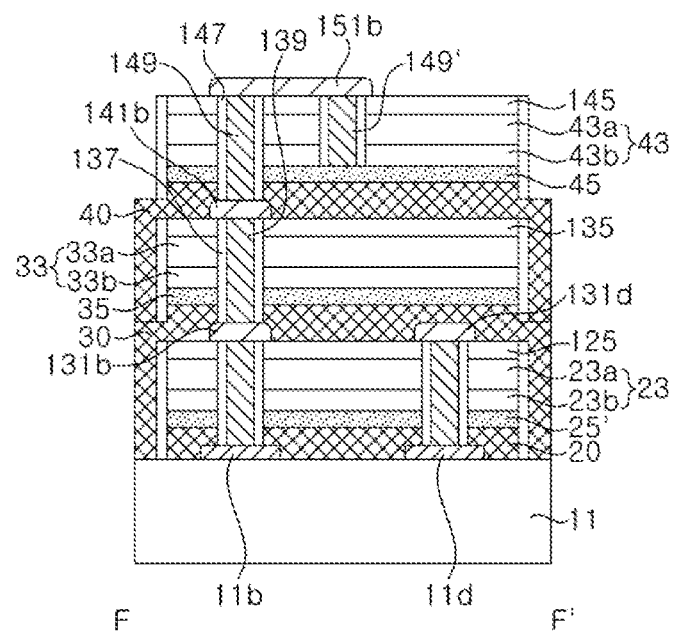
FIG. 23D is a schematic cross-sectional view taken along line F-F' of FIG. 23A.

FIG. 23A is a plan view illustrating a display panel 2000 according to another exemplary embodiment, and FIG. 23B, FIG. 23C, and FIG. 23D are cross-sectional views taken along lines D-D', E-E', and F-F' of FIG. 23A, respectively.

Referring to FIG. 23A, FIG. 23B, FIG. 23C, and FIG. 23D, the display panel 2000 includes light emitting devices 200 disposed on a circuit board 11, and may include a first LED stack 23, a second LED stack 33, a third LED stack 43, a lower electrode 25', a second transparent electrode 35, a third transparent electrode 45, a first ohmic electrode 123a, a first bonding layer 20, a second bonding layer 30, a third bonding layer 40, a lower insulation layer 125, an intermediate insulation layer 135, an upper insulation layer 145, a first sidewall insulation layer 127, a second sidewall insulation layer 137, a third sidewall insulation layer 147, first through vias 129 and 129', second through vias 139 and 139', third through vias 149 and 149', first connection pads 131*a*, 131*b*, 131*c*, and 131*d*, second connection pads 141*a*, 141*b*, and 141*c*, and third connection pads 151*a* and 151*b*.

The display panel 2000 according to the illustrated exemplary embodiment is substantially similar to the display panel 1000 described with reference to FIG. 3A, FIG. 3B, FIG. 3C, and FIG. 3D, but vertical directions of the first conductivity type semiconductor layers 23*a*, 33*a*, and 43*a* and the second conductivity type semiconductor layers 23*b*, 33*b*, and 43*b* are inverted. As such, repeated descriptions of the same elements will be omitted to avoid redundancy, and differences therebetween will be described in detail.

The first, second, and third LED stacks 23, 33, and 43 are stacked in the vertical direction. According to the illustrated exemplary embodiment, the second conductivity type semiconductor layers 23*b*, 33*b*, and 43*b* of each of the LED stacks 23, 33, and 43 are disposed toward the circuit board 11, and the first conductivity type semiconductor layers 23*a*, 33*a*, and 43*a* are disposed toward an emission surface from which light is emitted.

As described above, the first LED stack 23, the second LED stack 33, and the third LED stack 43 may have through holes, and the first, second, and third through vias 129, 139, and 149 may be formed in the through holes. In addition, in the illustrated exemplary embodiment, through holes passing through the first LED stack 23, the second LED stack 33, and the third LED stack 43 are added, and first, second, and third vias 129', 139', and 149' may be formed in these through holes. The first, second, and third through vias 129, 139, and 149 pass through the lower electrode 25', the second transparent electrode 35, and the third transparent electrode 45, respectively, but the first, second, and third through vias 129, 139', and 149, do not penetrate through the lower electrode 25', the second transparent electrode 35, and the third transparent electrode 45, respectively.

The first, second, and third through vias 129, 139, and 149 and the first, second, and third through vias 129, 139', and 149, may be insulated from the LED stacks 23, 33, and 43 by the first, second, and third sidewall insulation layers 127, 137, and 147 in the through holes, respectively.

The first LED stack 23, the second LED stack 33, and the third LED stack 43 may overlap with one another, and may have a light emitting area of a similar size. Furthermore, in each of the LED stacks 23, 33, and 43, the first conductivity type semiconductor layers 23*a*, 33*a*, and 43*a* may have substantially the same area as that of the second conductivity type semiconductor layers 23*b*, 33*b*, and 43*b*, respectively. In particular, according to the illustrated exemplary embodiment, a process of etching a portion of the second conductivity type semiconductor layer may be obviated to form the ohmic electrodes 123, 133, and 143 as compared to that described with reference to FIGS. 3A and 3B.

The lower electrode 25' is in ohmic contact with the second conductivity type semiconductor layer 23*b* of the first LED stack 23. The lower electrode 25' may cover substantially an entire surface of the second conductivity type semiconductor layer 23*b*. In the illustrated exemplary embodiment, since the second conductivity type semiconductor layer 23*b* of the first LED stack 23 is disposed to face the circuit board 11, the lower electrode 25' in ohmic contact with the second conductivity type semiconductor layer 23*b* may not need to transmit light. Moreover, the lower electrode 25' may be formed as a reflection layer that reflects light. For example, the lower electrode 25' may include AuBe or AuZn. When the lower electrode 25' is formed as the reflection layer, even if the reflection layer 13 shown in FIG. 3B and formed on the circuit board 11, light emitted toward the circuit board 11 may be reflected. In another exemplary embodiment, the reflection layer 13 may be used together with the lower electrode 25'.

The second transparent electrode 35 is in ohmic contact with the second conductivity type semiconductor layer 33*b* between the first LED stack 23 and the second LED stack 33, and the third transparent electrode 45 is in ohmic contact with the second conductivity type semiconductor layer 43*b* between the second LED stack 33 and the third LED stack 43.

For example, the second transparent electrode 35 may be formed of a metal layer or a conductive oxide layer that is transparent to red light. Furthermore, the second transparent electrode 35 may be formed of a material that transmits green light, but the inventive concepts are not limited thereto, and may be formed of a material that reflects green light.

The third transparent electrode 45 may be formed of, for example, a metal layer or a conductive oxide layer that is transparent to red light and green light. Further, the third transparent electrode 45 may be formed of a material that is transparent to blue light, but the inventive concepts are not limited thereto, and may be formed of a material that reflects blue light.

The lower electrode 25', the second transparent electrode 35, and the third transparent electrode 45 may be in ohmic contact with a p-type semiconductor layer of each of LED stack 23, 33, and 43 to assist current spread. The conductive oxide layers used for the second and third transparent electrodes 35 and 45 may include $SnO_2$, $InO_2$, ITO, ZnO, IZO, ITZO, or the like.

The first ohmic electrode 123*a* is disposed on the first conductivity type semiconductor layer 23*a*. The first ohmic electrode 123*a* may be formed of, for example, AuGe, AuTe, or the like. The first conductivity type semiconductor layer 23*a* may include an ohmic contact semiconductor layer (see 23*c* of FIG. 25B), such as AlGaAs, so as to lower ohmic resistance. The ohmic contact semiconductor layer 23*c* may be limitedly located under the first ohmic electrode 123', and thus, light absorption by the ohmic contact semiconductor layer 23*c* may be reduced.

The lower insulation layer 125 may cover the first ohmic electrode 123*a* and the first conductivity type semiconductor layer 23*a*. The lower insulation layer 125 may be limitedly located under the first conductivity type semiconductor layer 23*a*, and may not cover a side of the first conductivity type semiconductor layer 23*a*. The lower insulation layer 125 may have an opening exposing the first ohmic electrode 123*a*.

The intermediate insulation layer 135 covers the first conductivity type semiconductor layer 33*a*. The intermediate insulation layer 135 may be limitedly located on the first conductivity type semiconductor layer 33*a*, and may not cover a side surface of the first conductivity type semiconductor layer 33*a*. The intermediate insulation layer 135 may have an opening exposing the first conductivity type semiconductor layer 33*a*.

The upper insulation layer 145 may cover the first conductivity type semiconductor layer 43*a*. The upper insulation layer 145 may be limitedly located over the first conductivity type semiconductor layer 43*a*, and may not cover a side surface of the first conductivity type semiconductor layer 43*a*. The upper insulation layer 145 may have an opening exposing the first conductivity type semiconductor layer 43*a*.

The first bonding layer 20 couples the first LED stack 23 to the circuit board 11. In particular, the first bonding layer 20 may couple the lower electrode 25' of the first LED stack 23 to the circuit board 11. The second bonding layer 30 couples the second LED stack 33 to the first LED stack 23. The second bonding layer 30 may couple the second transparent electrode 35 to the lower insulation layer 125 between the second transparent electrode 35 and the lower insulation layer 125. The third bonding layer 40 couples the third LED stack 43 to the first LED stack 23. The third bonding layer 40 may couple the intermediate insulation layer 135 to the third transparent electrode 45 between the intermediate insulation layer 135 and the third transparent electrode 45.

The first through vias 129 and 129' pass through the first LED stack 23. The first through vias 129 may also pass through the lower insulation layer 125, the lower electrode 25', and the first bonding layer 20, and may be electrically connected to a common pad 11a and individual pads 11b, 11c, and 11d, respectively. The first through via 129' may be connected to the lower electrode 25'.

The first sidewall insulation layer 127 insulates the first through vias 129 and 129' from the first LED stack 23 in the through holes.

The first connection pads 131a, 131b, 131c, and 131d may be located between the first LED stack 23 and the second LED stack 33. The first connection pads 131a, 131b, 131c, and 131d may be disposed on the lower insulation layer 125, and may be covered with the second bonding layer 30.

The first connection pad 131a, as shown in FIG. 23B, electrically connects the first through via 129 electrically connected to the common pad 11a to the first ohmic electrode 123a. The first connection pad 131d, as shown in FIG. 23C, electrically connects the first through via 129 electrically connected to the pad 11d and the first through via 129'.

The first connection pads 131b and 131c cover the first through vias 129 that are electrically connected to the pads 11c and 11d, respectively, and are electrically connected to the first through vias 129.

The second through vias 139 and 139' pass through the second LED stack 33. The second through vias 139 may also pass through the intermediate insulation layer 135, the second transparent electrode 35, and the second bonding layer 30, and may be electrically connected to the first connection pads 131a, 131b, and 131c, respectively. The second through via 139' is electrically connected to the second transparent electrode 35.

The second sidewall insulation layer 137 insulates the second through vias 139 and 139' from the second LED stack 33 in the through holes. The second sidewall insulation layer 137 covers sidewalls of the through holes, and has openings exposing bottoms of the through holes, for example, the first connection pads 131a, 131b, and 131c, and the second transparent electrode 35.

The second connection pads 141a, 141b, and 141c may be located between the second LED stack 33 and the third LED stack 43. The second connection pads 141a, 141b, and 141c may be disposed on the intermediate insulation layer 135, and may be covered with the third bonding layer 40.

The second connection pad 141a, as shown in FIG. 23B, electrically connects the second through via 139 electrically connected to the first connection pad 131a to the first conductivity type semiconductor layer 33a exposed through the opening of the intermediate insulation layer 135. In some exemplary embodiments, a second ohmic electrode may be formed on the first conductivity type semiconductor layer 33a, and the intermediate insulation layer 135 may have an opening exposing the second ohmic electrode. In this case, the second connection pad 141a may electrically connect the second through via 139 to the second ohmic electrode.

The second connection pad 141c, as shown in FIG. 23C, electrically connects the second through via 139 electrically connected to the first connection pad 131c to the second through via 139' electrically connected to the second transparent electrode 35.

The second connection pad 141b covers the second through via 139 electrically connected to the first connection pad 131b, and is electrically connected to the second through via 139.

The third through vias 149 and 149' pass through the third LED stack 43. The third through vias 149 may also pass through the upper insulation layer 145, the third transparent electrode 45, and the third bonding layer 40, and may be electrically connected to the second connection pads 141a and 141b, respectively. The third through via 149' is electrically connected to the third transparent electrode 45.

The third sidewall insulation layer 147 insulates the third through vias 149 and 149' from the third LED stack 43 in the through holes. The third side wall insulation layer 147 covers the sidewalls of the through holes, and has openings exposing the bottoms of the through holes, for example, the second connection pads 141a and 141b and the third transparent electrode 45.

The third connection pad 151a, as shown in FIG. 23B, electrically connects the third through via 139 electrically connected to the second connection pad 141a to the first conductivity type semiconductor layer 43a exposed through the opening of the upper insulation layer 145. In some exemplary embodiments, a third ohmic electrode may be formed on the first conductivity type semiconductor layer 43a, and the upper insulation layer 145 may have an opening exposing the third ohmic electrode. In this case, the third connection pad 151a may electrically connect the third through via 149 to the third ohmic electrode.

The third connection pad 151b, as shown in FIG. 23D, electrically connects the third through via 149 electrically connected to the second connection pad 141b to the third through via 149' electrically connected to the third transparent electrode 45.

The first, second, and third through vias 129, 139, 149, 129',139', and 149' may be formed using the chemical mechanical polishing technique, as described above.

According to the illustrated exemplary embodiment, each of the first conductivity type semiconductor layer 23a of the first LED stack 23, the first conductivity type semiconductor layer 33a of the second LED stack 33, and the first conductivity type semiconductor layers 43a of the third LED stack 43 are electrically connected to the common pad 11a. Meanwhile, the second conductivity type semiconductor layer 23b of the first LED stack 23 is electrically connected to the individual pad 11d, the second conductivity type semiconductor layer 33b of the second LED stack 33 is electrically connected to the individual pad 11c, and the second conductivity type semiconductor layer 43b of the third LED stack 43 is electrically connected to the individual pad 11b. As such, the first LED stack 23 may be driven by supplying power to the pads 11a and 11d, the second LED stack 33 may be driven by supplying power to the pads 11a and 11c, and the third LED stack 43 may be driven by supplying power to the pads 11a and 11b.

According to the illustrated exemplary embodiment, the first through vias 129 passing through the first LED stack 23 may be directly connected to the pads 11a, 11b, 11c, and 11d on the circuit board 11. The first through vias 129 may be formed using Cu CMP technology. Accordingly, the first through vias 129 may be formed on the pads 11a, 11b, 11c, and 11d without using a separate bonding layer. Since the light emitting devices 100 are not transferred to the circuit board 11, but are formed on the circuit board 11, reliability problems that may otherwise occur by transferring LEDs may be prevented.

Hereinafter, a method of manufacturing the display panel 2000 will be described in detail. The method of manufacturing the display described below may be implemented in a manner shown in FIG. 4A or FIG. 4B. A structure of the light emitting device 200 will be also understood in more detail through the manufacturing method described below.

FIG. 24A, FIG. 24B, FIG. 25A, FIG. 25B, FIG. 26A, FIG. 26B, FIG. 26C, FIG. 27A, FIG. 27B, FIG. 27C, FIG. 28A, FIG. 28B, FIG. 29A, FIG. 29B, FIG. 29C, FIG. 30A, FIG. 30B, FIG. 30C, FIG. 31A, FIG. 31B, FIG. 31C, FIG. 32A, FIG. 32B, FIG. 33A, FIG. 33B, FIG. 33C, FIG. 34A, FIG. 34B, FIG. 34C, FIG. 35A, FIG. 35B, FIG. 35C, and FIG. 35D are schematic plan views and cross-sectional views illustrating a method of manufacturing a display panel 2000 according to an exemplary embodiment. Hereinafter, although a region including two light emitting devices 200 is exemplarily illustrated and described, a greater number of light emitting devices 200 may be manufactured on a single circuit board 11.

Figure 24A:
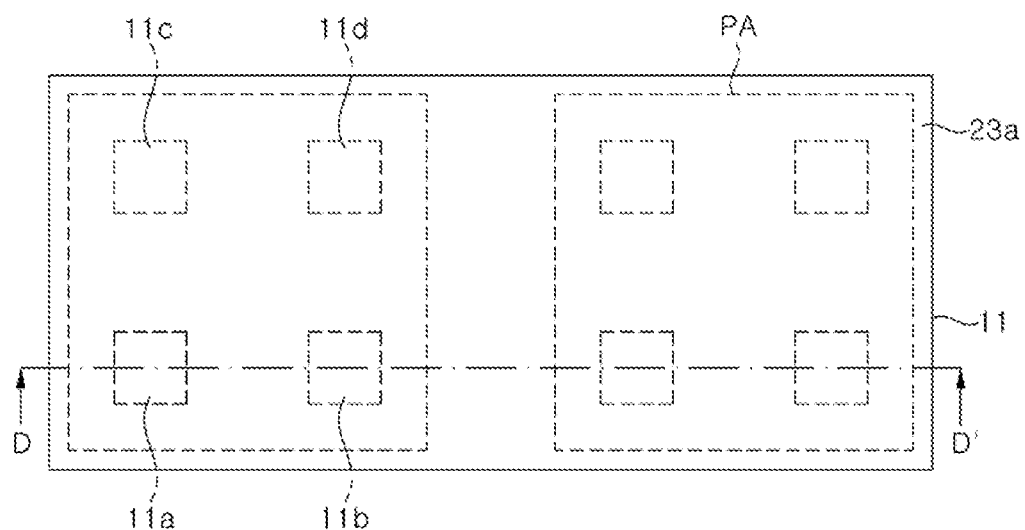
FIG. 24A, FIG. 24B, FIG. 25A, FIG. 25B, FIG. 26A, FIG. 26B, FIG. 26C, FIG. 27A, FIG. 27B, FIG. 27C, FIG. 28A, FIG. 28B, FIG. 29A, FIG. 29B, FIG. 29C, FIG. 30A, FIG. 30B, FIG. 30C, FIG. 31A, FIG. 31B, FIG. 31C, FIG. 32A, FIG. 32B, FIG. 33A, FIG. 33B, FIG. 33C, FIG. 34A, FIG. 34B, FIG. 34C, FIG. 35A, FIG. 35B, FIG. 35C, and FIG. 35D are schematic plan views and cross-sectional views illustrating a method of manufacturing a display panel according to another exemplary embodiment.
Figure 24B:
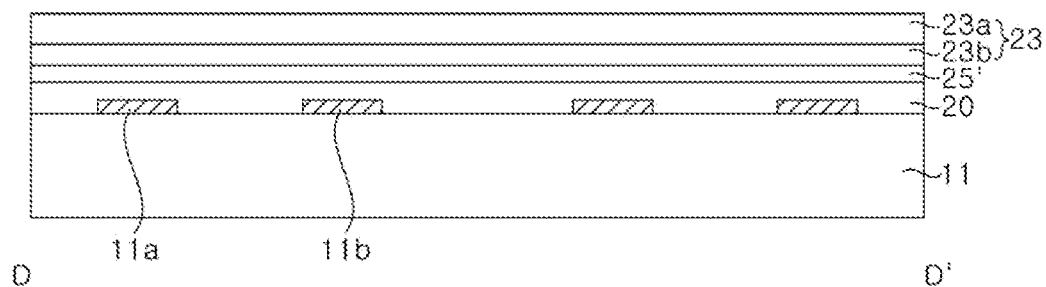

First, referring to FIG. 24A and FIG. 24B, a first LED stack 23 is bonded on the circuit board 11 through a first bonding layer 20.

The circuit board 11 may include circuits for active matrix driving or passive matrix driving therein. The circuit board 11 may be, for example, a silicon-based circuit board 11, and in particular, may include active circuits.

The circuit board 11 includes pads 11a, 11b, 11c, and 11d exposed on an upper surface thereof. The pads 11a, 11b, 11c, and 11d may be disposed in each region in which the light emitting device 100 is to be formed, in particular, in each pixel region PA. The pads 11a, 11b, 11c, and 11d are electrically connected to the active circuits inside the circuit board 11.

The first LED stack 23 may be formed on a first substrate 21a as similarly described above with reference to FIG. 6A. In the illustrated exemplary embodiment, a process of bonding the first LED stack 23 to the first temporary substrate 21b may be omitted, and the first substrate 21a may be removed from the first LED stack 23 after the first LED stack 23 is bonded to the circuit board 11. In addition, a lower electrode 25' may be formed on a second conductivity type semiconductor layer 23b, and the first bonding layer 20 may bond the lower electrode 25' and the circuit board 11.

Figure 25A:
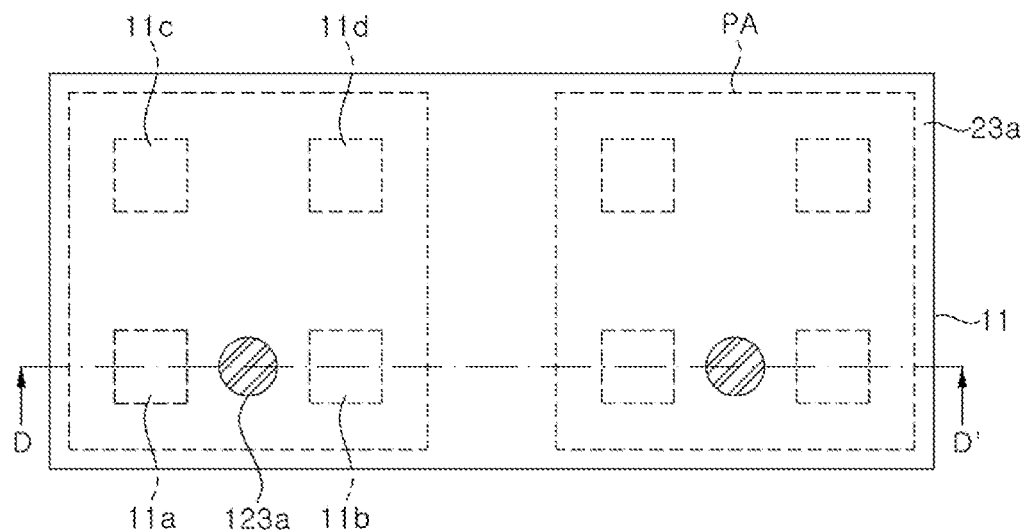
Figure 25B:
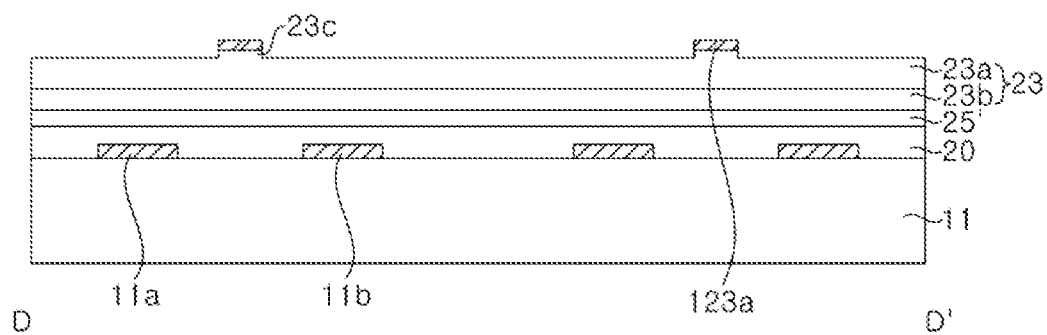

Referring to FIG. 25A and FIG. 25B, a first ohmic electrode 123a may be formed on the first conductivity type semiconductor layer 23a. To improve the ohmic contact characteristics, the first conductivity type semiconductor layer 23a may include an ohmic contact semiconductor layer 23c on a surface thereof, such as AlGaAs, and the first ohmic electrode 123a may contact the ohmic contact semiconductor layer 23c. The ohmic contact semiconductor layer 23c may be removed by etching from the remaining regions except for the ohmic contact semiconductor layer 23c under the first ohmic electrode 123a. In addition, after the ohmic contact semiconductor layer 23c is removed, a surface of the first conductivity type semiconductor layer 23a may be textured to form a roughened surface. In the following drawings, the ohmic contact semiconductor layer 23c is omitted to simplify illustration.

Figure 26A:
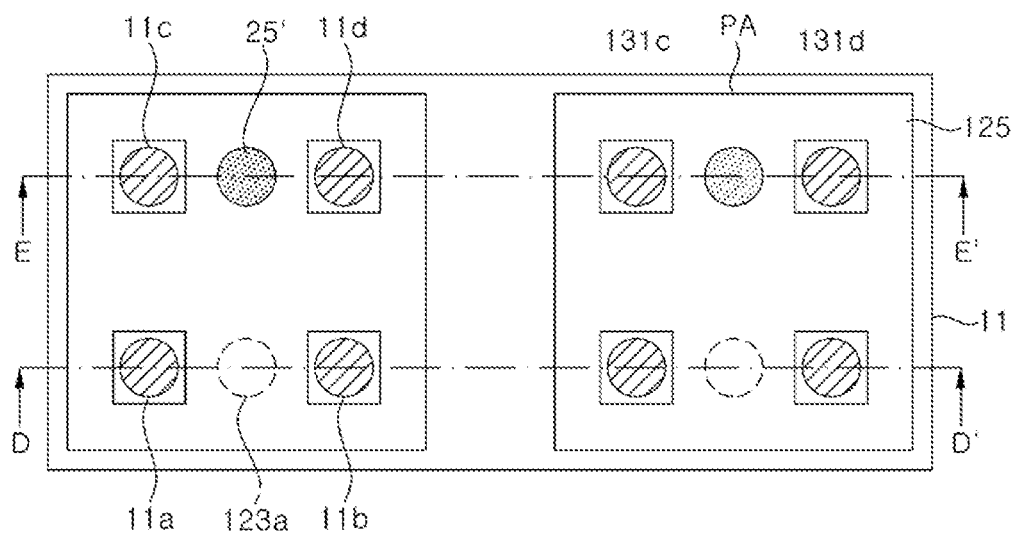
Figure 26B:
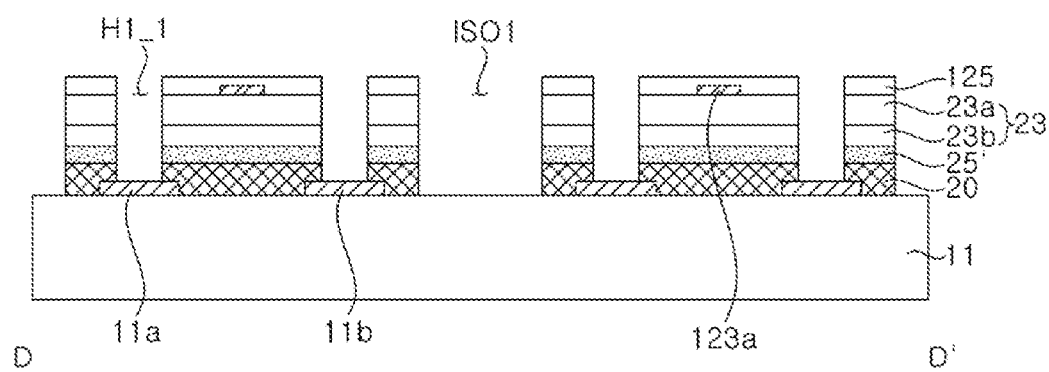
Figure 26C:
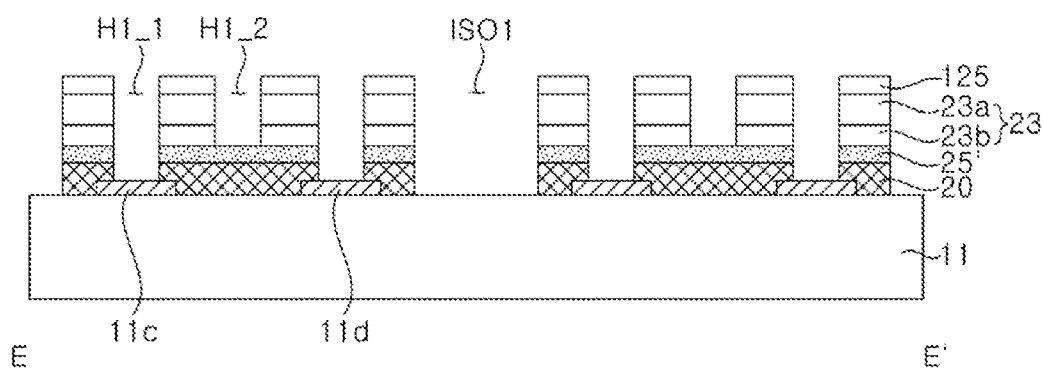

Referring to FIG. 26A, FIG. 26B, and FIG. 26C, a lower insulation layer 125 may be formed, and a device isolation region ISO1 may be formed together with through holes H1_1 and H1_2.

The lower insulation layer 125 covers the first conductivity type semiconductor layer 23a and the first ohmic electrode 123a. The lower insulation layer 125 may also function as a hard mask for forming the through holes H1_1 and H1_2.

The through holes H1_1 pass through the lower insulation layer 125, the first LED stack 23, a first transparent electrode 25, and the first bonding layer 20, and expose the pads 11a, 11b, 11c, and 11d. The through holes H1_1 expose the lower electrode 25' around the pad 11d.

Sizes of the first LED stack 23 and the lower electrode 25' may be determined by the device isolation region ISO1, and accordingly, the lower electrode 25' may be formed over substantially an entire surface of the second conductivity type semiconductor layer 23b of the first LED stack 23.

Figure 27A:
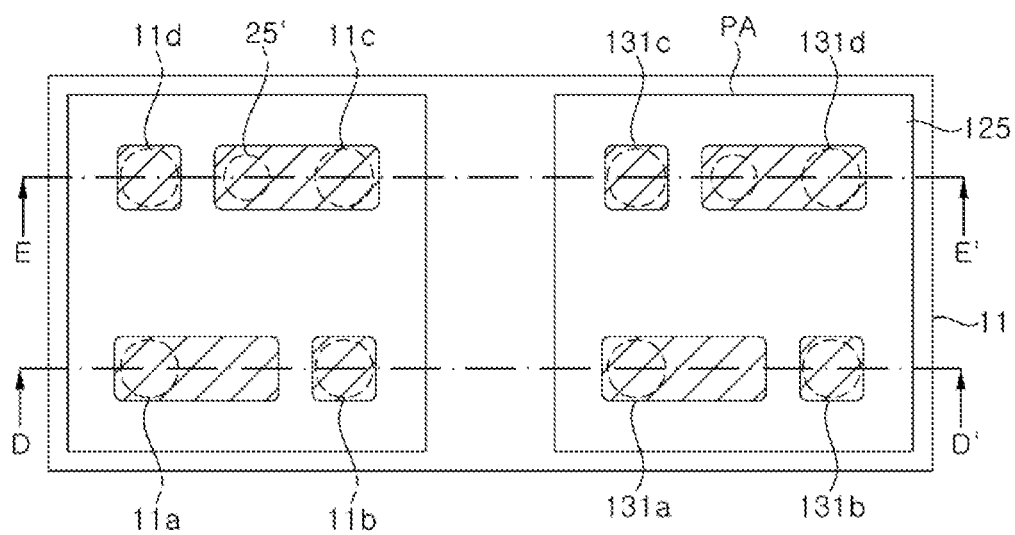
Figure 27B:
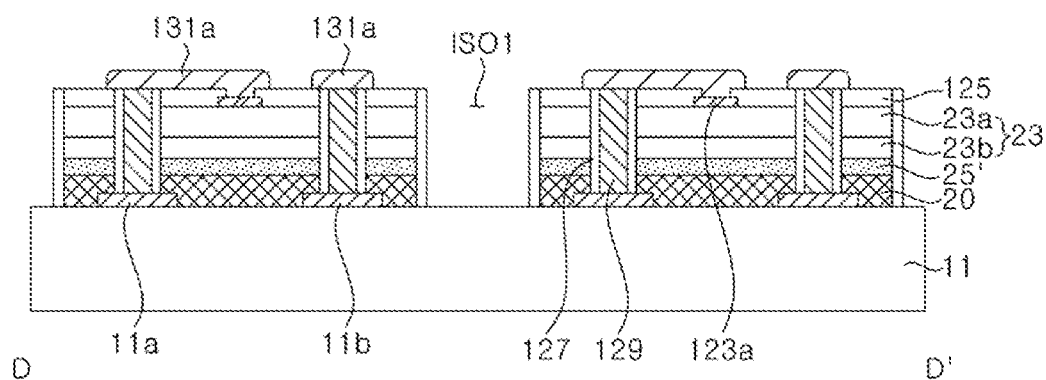
Figure 27C:
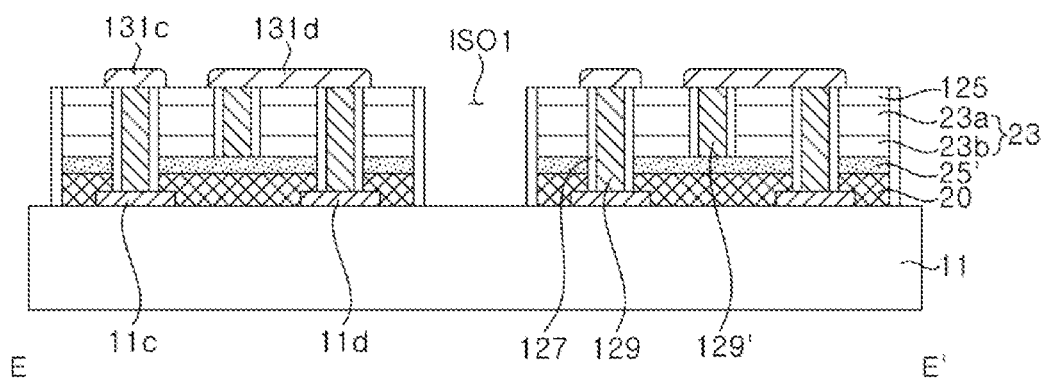

Referring to FIG. 27A, FIG. 27B, and FIG. 27C, a first sidewall insulation layer 127, first through vias 129 and 129', and first connection pads 131a, 131b, 131c, and 131d are formed. After forming the first through vias 129 and 129', an opening exposing the first ohmic electrode 123a is formed in the lower insulation layer 125 before forming the first connection pads 131a, 131b, 131c, and 131d.

Since the first sidewall insulation layer 127, the first through vias 129 and 129', and the first connection pads 131a, 131b, 131c, and 131d are formed in a similar manner already described above with reference to FIGS. 13A to 13C, repeated descriptions thereof will be omitted.

Figure 28A:
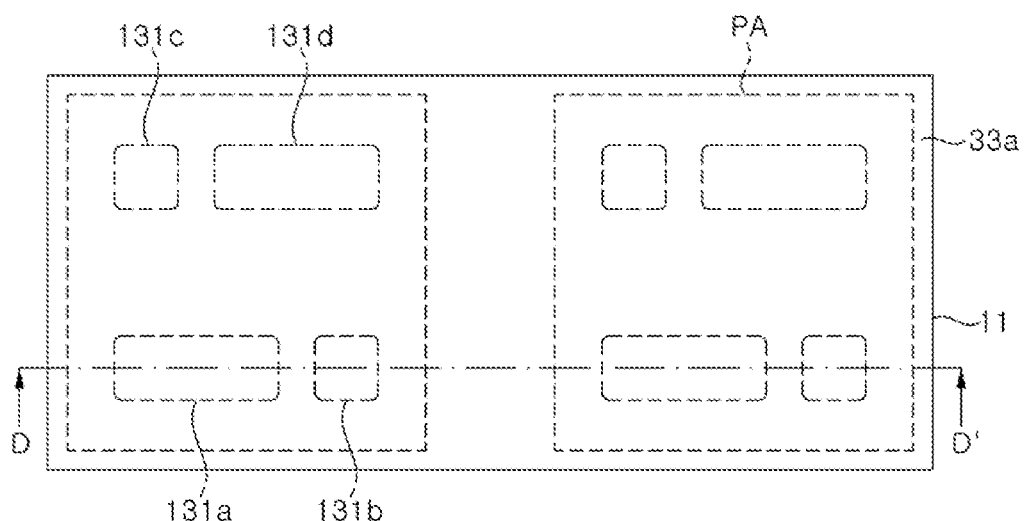
Figure 28B:
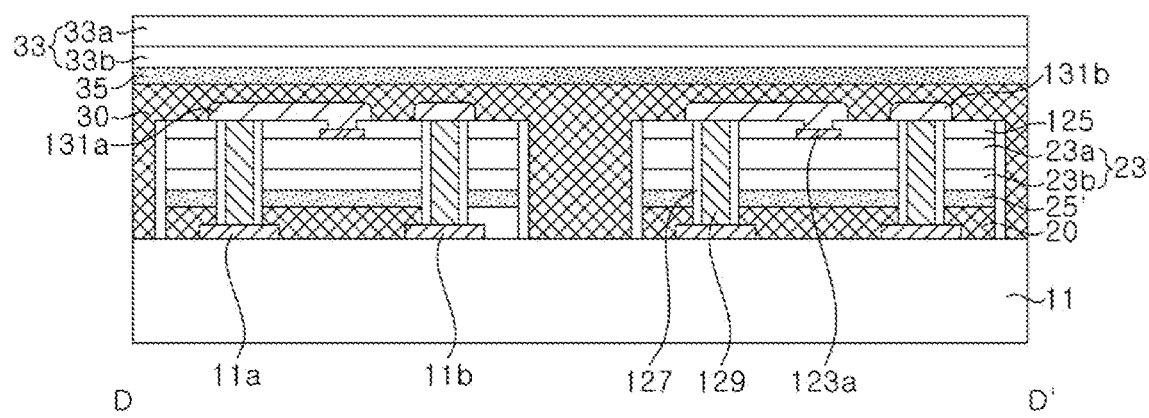

Referring to FIG. 28A and FIG. 28B, a second LED stack 33 is bonded on the first LED stack 23. The second LED stack 33 may be bonded on the first LED stack 23 through a second bonding layer 30. A second transparent electrode 35 may be in contact with the second bonding layer 30, and a first conductivity type semiconductor layer 33a may be disposed on an upper side of the second LED stack 33 to oppose the second bonding layer 30. The second LED stack 33 may be bonded to the first LED stack 23 while being attached to a second substrate (31a in FIG. 6B). The second substrate 31a and or the adhesive 37 (see FIG. 6B) are removed from the second LED stack 33 using, for example, a laser lift-off technique thereafter.

Figure 29A:
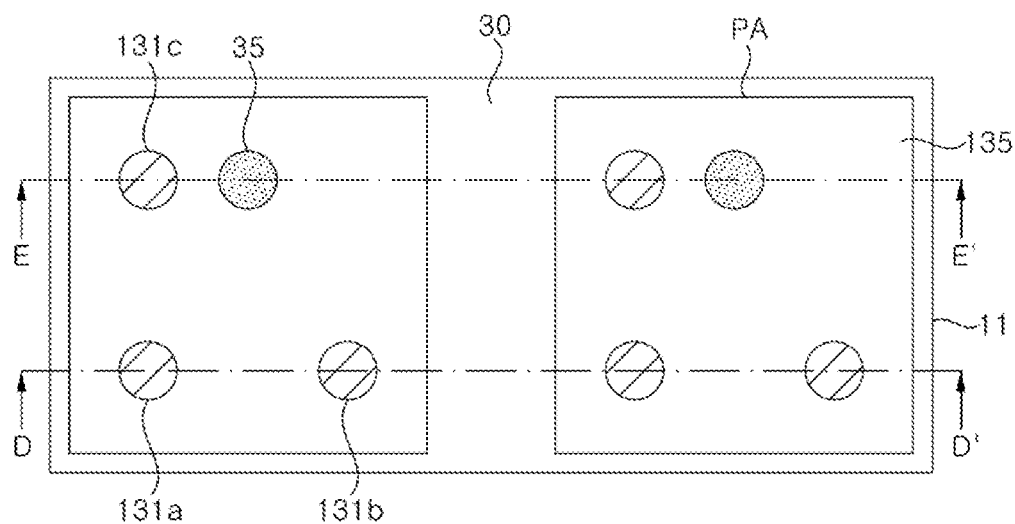
Figure 29B:
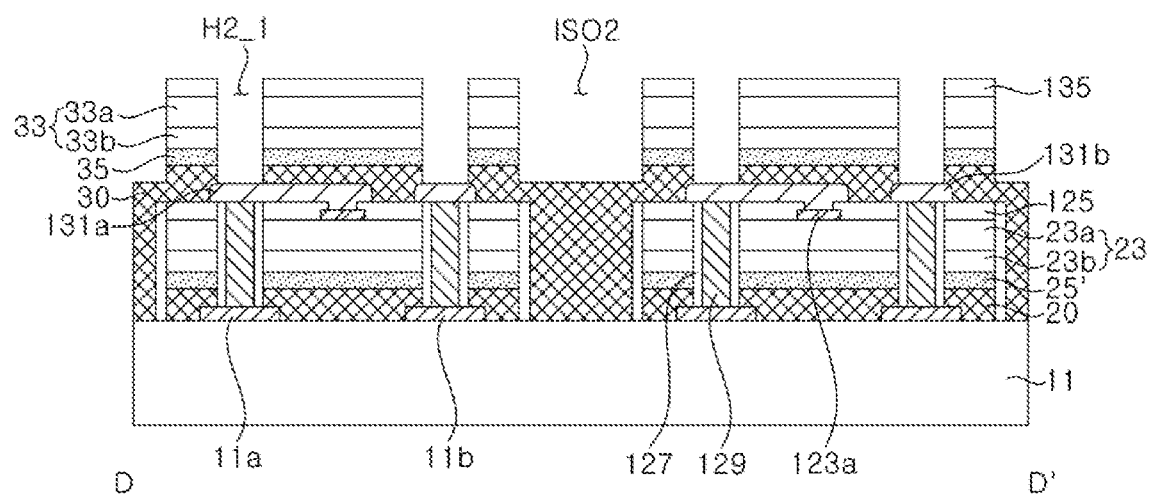
Figure 29C:
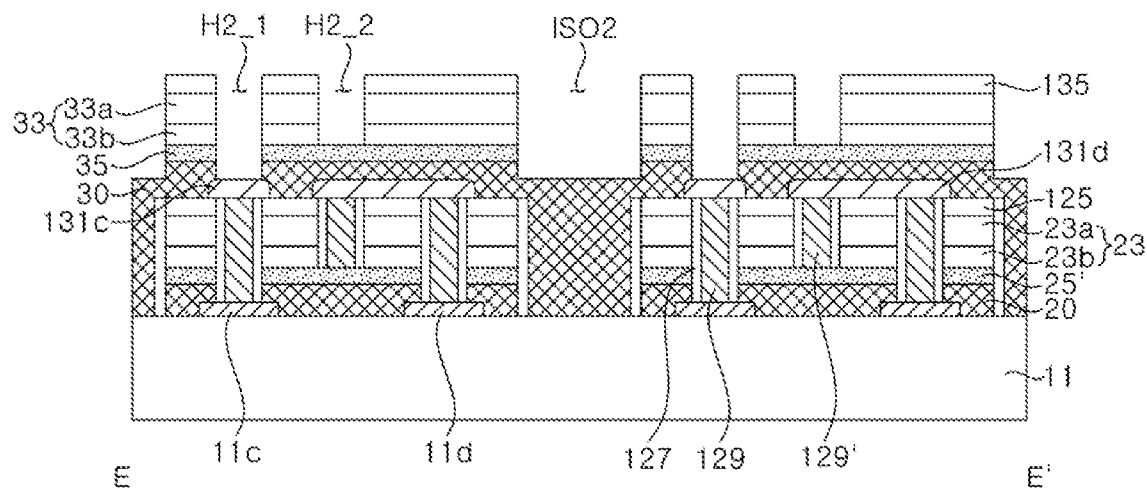

Referring to FIG. 29A, FIG. 29B, and FIG. 29C, an intermediate insulation layer 135 is formed, and through holes H2_1 and H2_2 are formed. A device isolation region ISO2 may be formed together with the through holes H2_1 and H2_2.

The intermediate insulation layer 135 covers the first conductivity type semiconductor layer 33a. The intermediate insulation layer 135 may also function as a hard mask for forming through holes H2_1 and H2_2.

The through holes H2_1 pass through the intermediate insulation layer 135, the second LED stack 33, the second transparent electrode 35, and the second bonding layer 30, and expose the first connection pads 131a, 131b, and 131c connected to the first through vias 129. The through holes H2_2 pass through the intermediate insulation layer 135 and the second LED stack 33, and expose the second transparent electrode 35. The through hole H2_2 may be disposed relatively close to the through hole H2_1 exposing the second connection pad 131c.

Figure 30A:
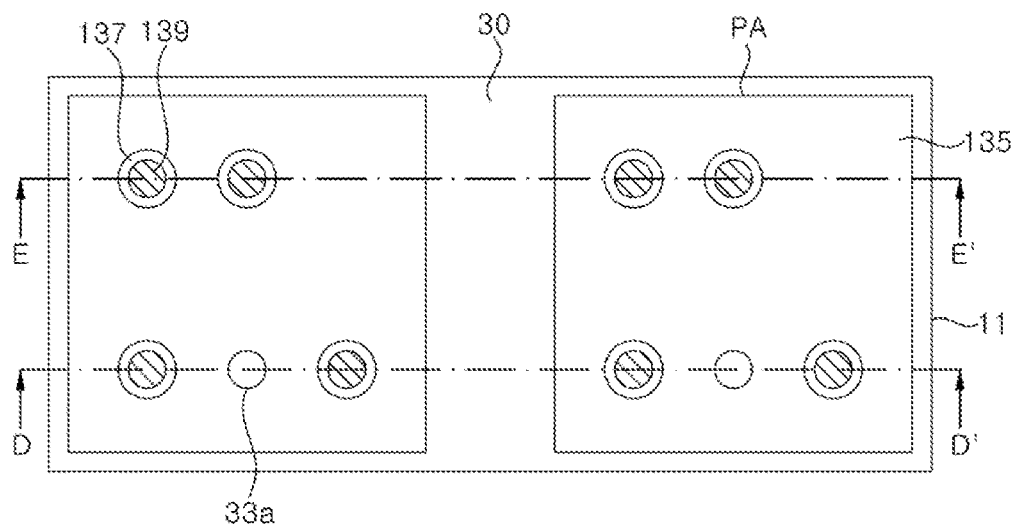
Figure 30B:
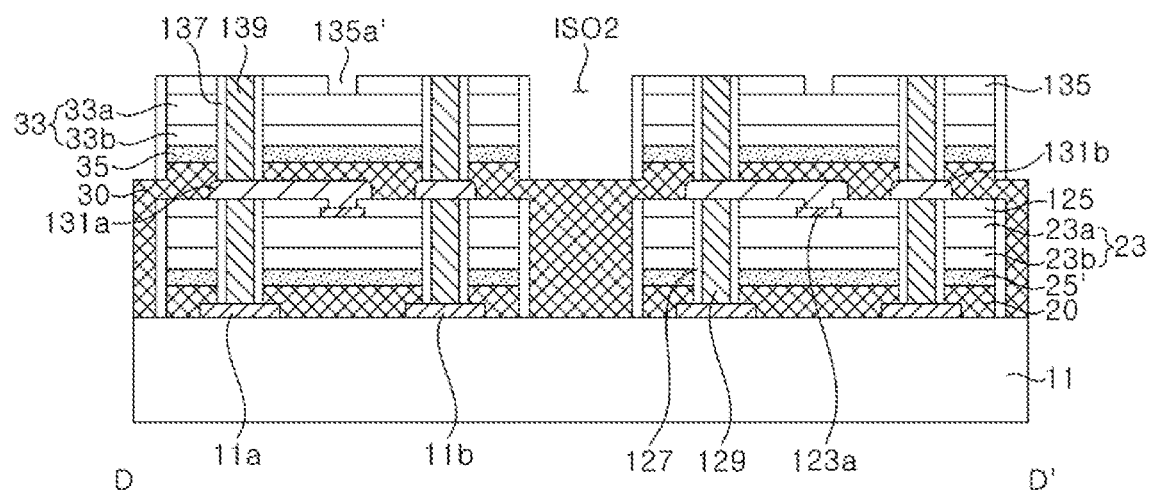
Figure 30C:
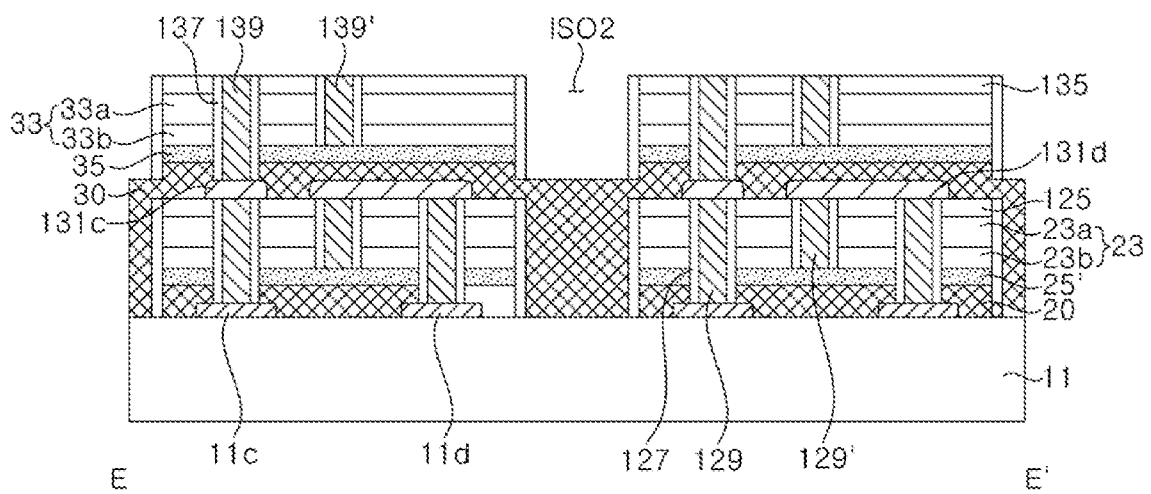

Referring to FIG. 30A, FIG. 30B, and FIG. 30C, a second sidewall insulation layer 137 and second through vias 139 and 139' are formed. Since the processes of forming the second sidewall insulation layer 137 and the through vias 139 and 139' are substantially similar to those already described above with reference to FIGS. 17A and 17B, repeated descriptions thereof will be omitted. The second through vias 139 may be connected to the first connection pads 131a, 131b, and 131c, respectively, and the second through vias 139' may be electrically connected to the second transparent electrode 35.

After the second through vias 139 and 139' are formed, the intermediate insulation layer 135 is patterned to form an opening 135a' exposing the first conductivity type semiconductor layer 33a. The intermediate insulation layer 135 may be patterned through photolithography and etching processes. The opening 135a' may be disposed relatively close to the second through via 139 electrically connected to the common pad 11a.

Figure 31A:
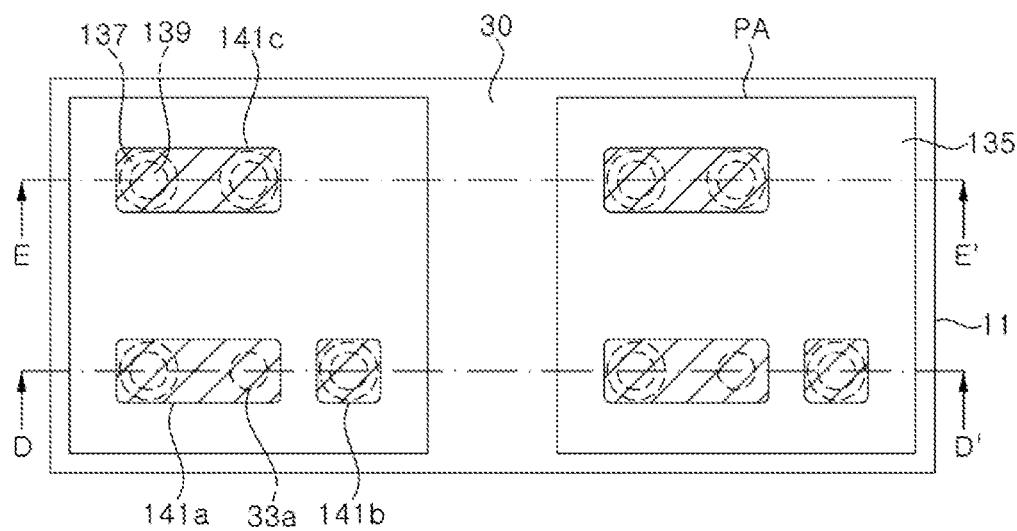
Figure 31B:
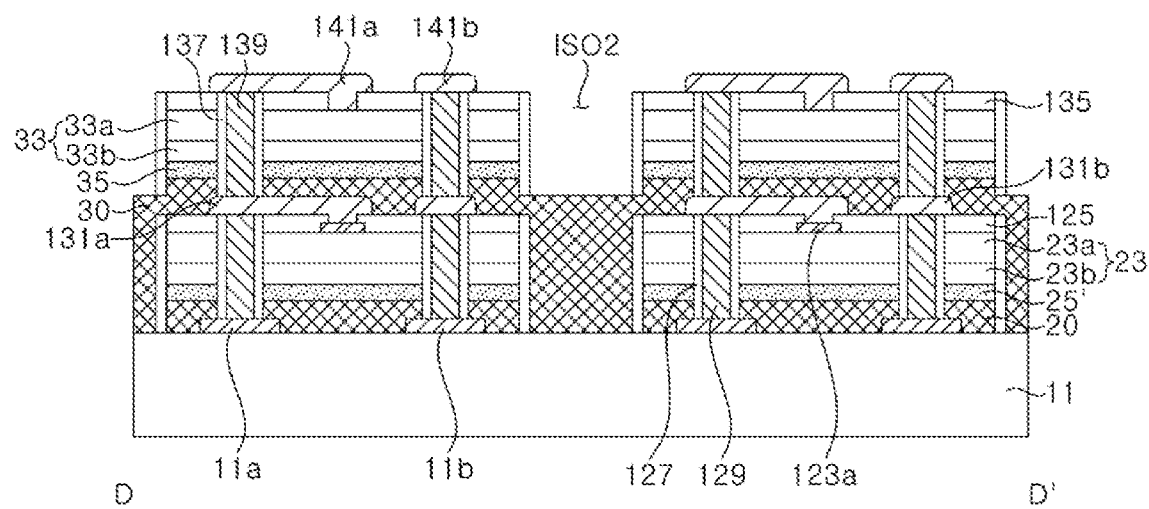
Figure 31C:
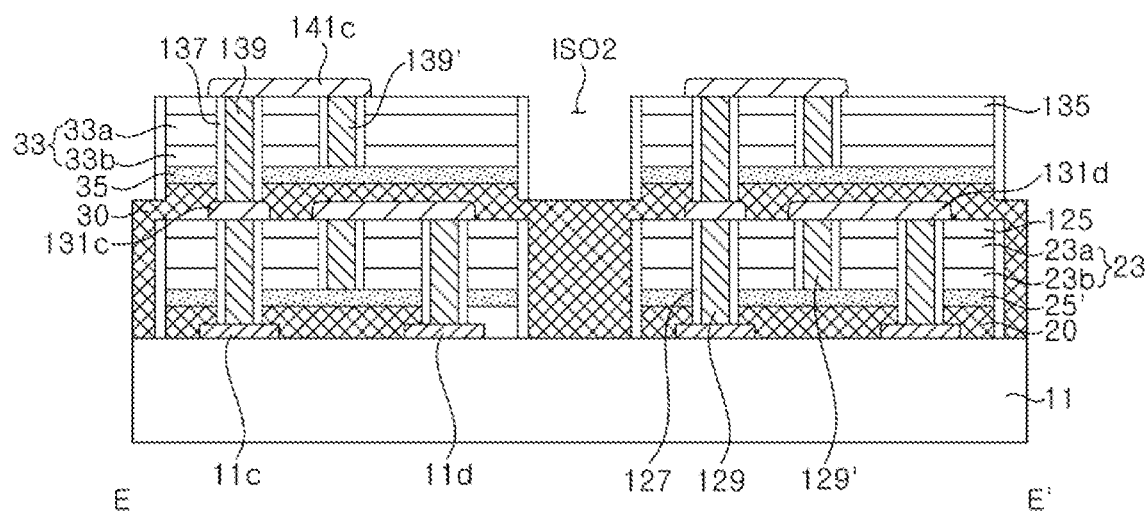

Referring to FIG. 31A, FIG. 31B, and FIG. 31C, second connection pads 141a, 141b, and 141c are formed on the intermediate insulation layer 135. The second connection pads 141a, 141b, and 141c may be formed using photolithography and etching process or a lift-off technique.

The second connection pad 141a electrically connects the second through via 139 connected to the common pad 11a to the first conductivity type semiconductor layer 33a exposed through the opening 135a', and the second connection pad 141c electrically connects the second through via 139 connected to the pad 11c to the second through via 139'. The second connection pad 141b is electrically connected to the second through via 139 connected to the pad 11b.

To lower the ohmic contact resistance of the first conductivity type semiconductor layer 33a, before forming the intermediate insulation layer 135 or after forming the opening 135a' in the intermediate insulation layer 135, an ohmic layer that is in ohmic contact with the first conductivity type semiconductor layer 33a may be further formed. In this case, the second connection pad 141a may electrically connect the second through via 139 to the ohmic layer.

Figure 32A:
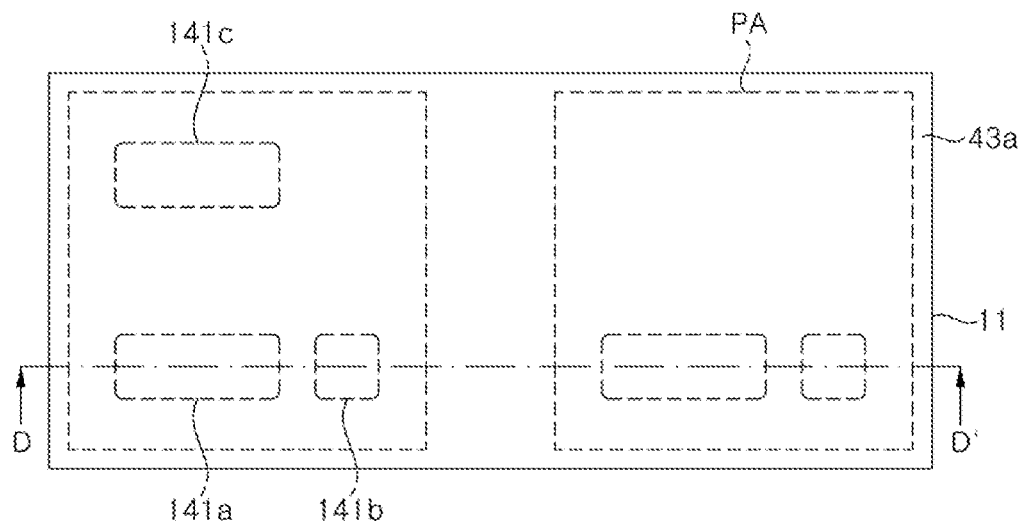
Figure 32B:
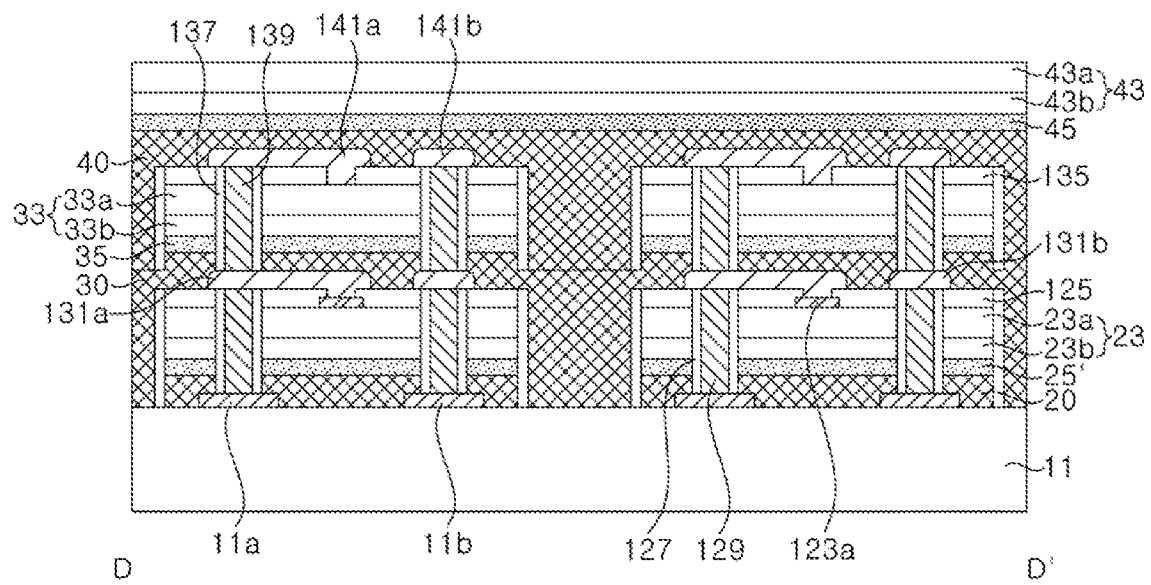

Referring to FIG. 32A and FIG. 32B, a third LED stack 43 is bonded on the second LED stack 33. The third LED stack 43 may be bonded on the second LED stack 33 through a third bonding layer 40. A third transparent electrode 45 may be in contact with the third bonding layer 40, and a first conductivity type semiconductor layer 43a may be disposed on an upper side of the third LED stack 43 to oppose the third bonding layer 40. The third LED stack 43 may be bonded to the second LED stack 33 while being attached to a third substrate 41a. The third substrate 41a and/or the adhesive 47 (see FIG. 6C) may be removed from the third LED stack 43.

Figure 33A:
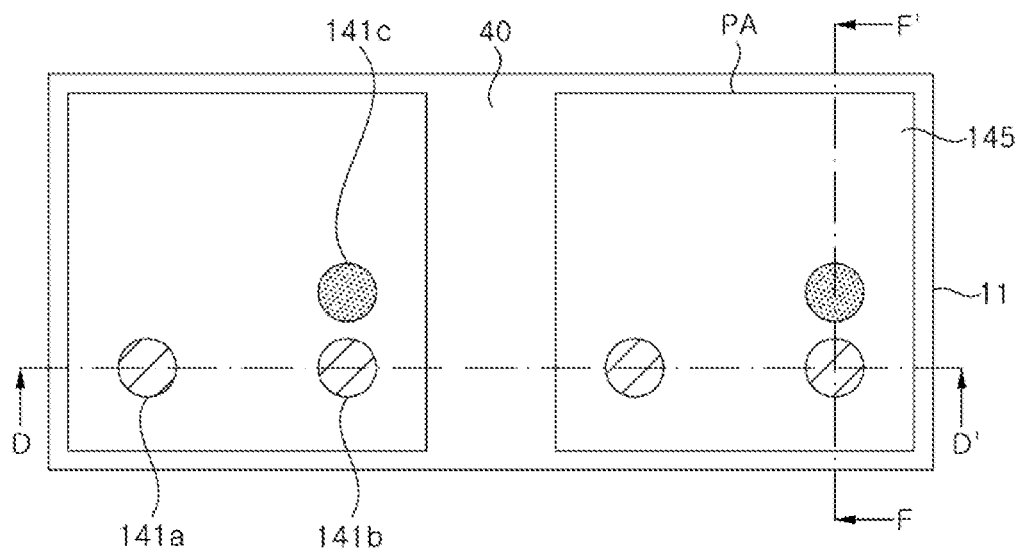
Figure 33B:
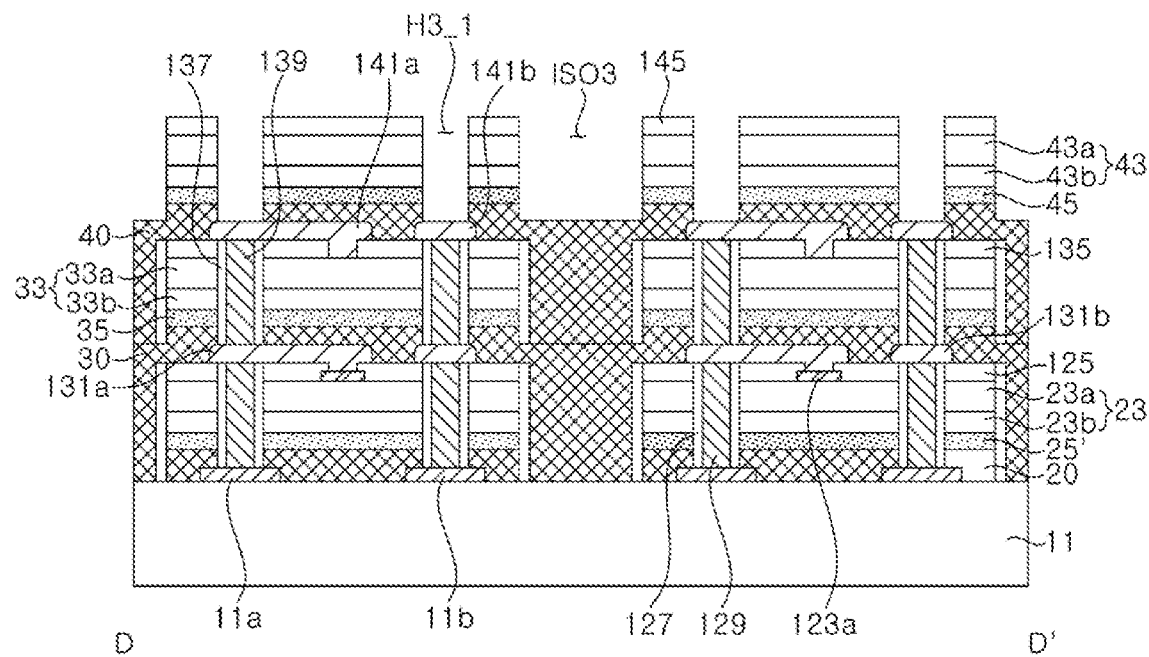
Figure 33C:
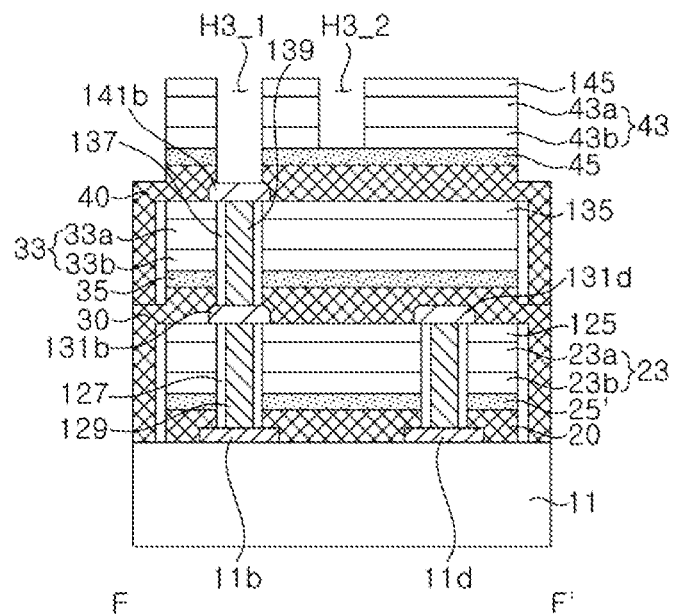

Referring to FIG. 33A, FIG. 33B, and FIG. 33C, an upper insulation layer 145 covering the first conductivity type semiconductor layer 33a is formed, and through holes H3_1 and H3_2 are formed. A device isolation region ISO3 may be formed together with the through holes H3_1 and H3_2. The upper insulation layer 145 may also function as a hard mask for forming through holes H3_1 and H3_2.

The through holes H3_1 pass through the upper insulation layer 145, the third LED stack 43, the third transparent electrode 45, and the third bonding layer 40, and expose the second connection pads 141a and 141b. The through hole H3_2 passes through the upper insulation layer 145 and the third LED stack 43, and exposes the third transparent electrode 45. The through holes H3_2 may be disposed relatively close to the third through via 149 electrically connected to the second connection pad 141b. The through holes H3_1 and the through holes H3_2 may be formed using different photoresist patterns from each other.

Figure 34A:
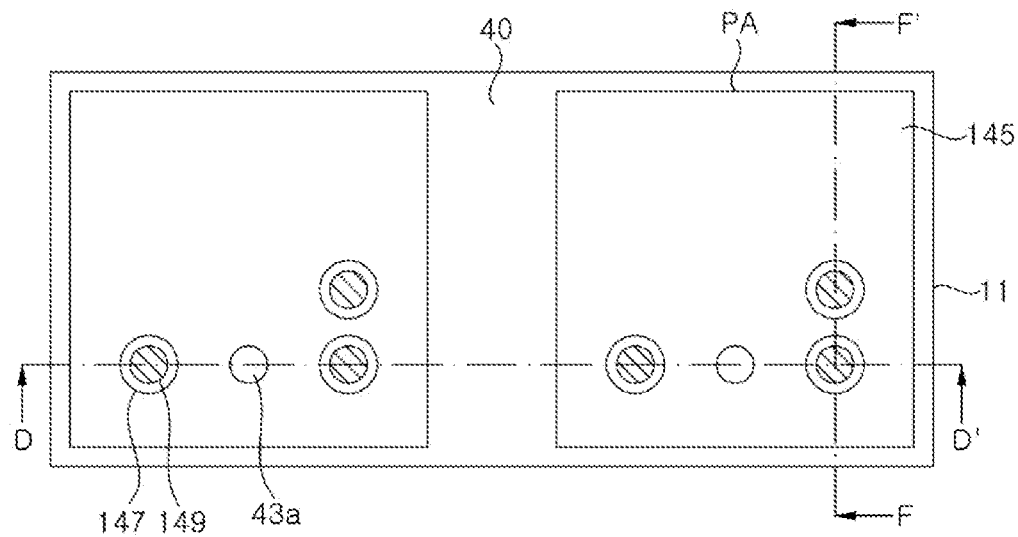
Figure 34B:
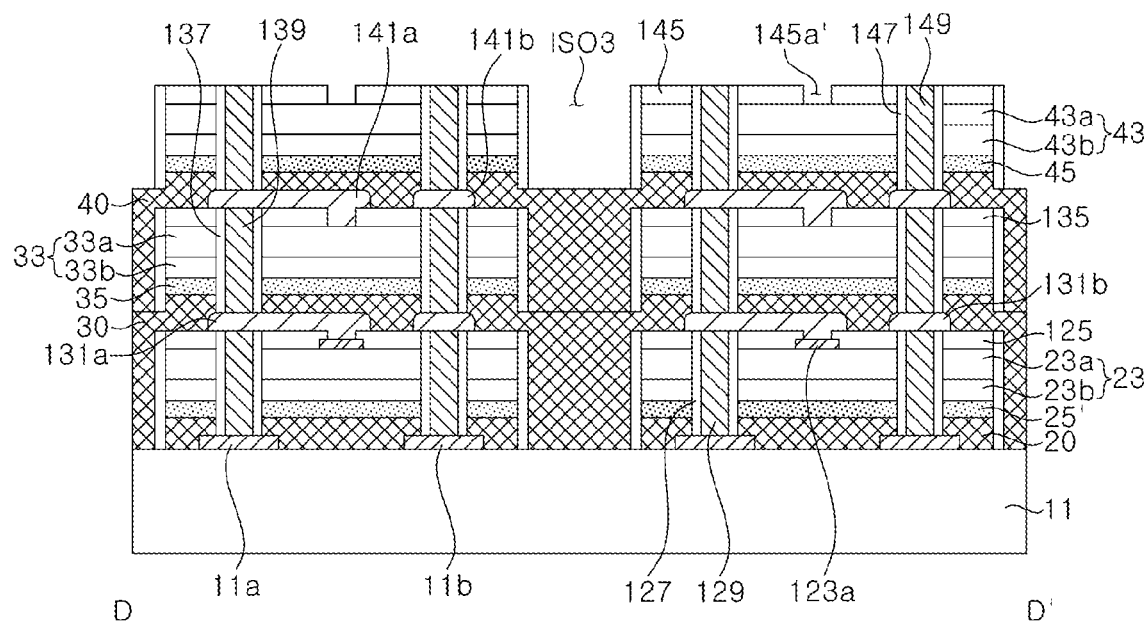
Figure 34C:
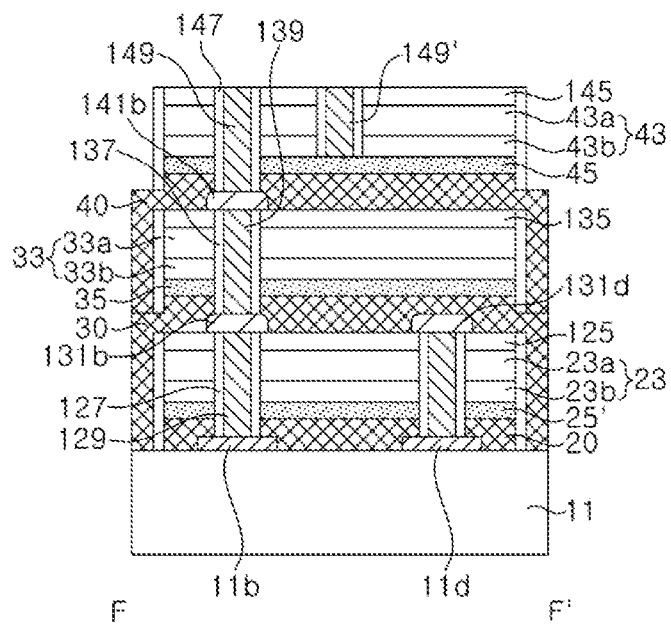
Figure 35A:
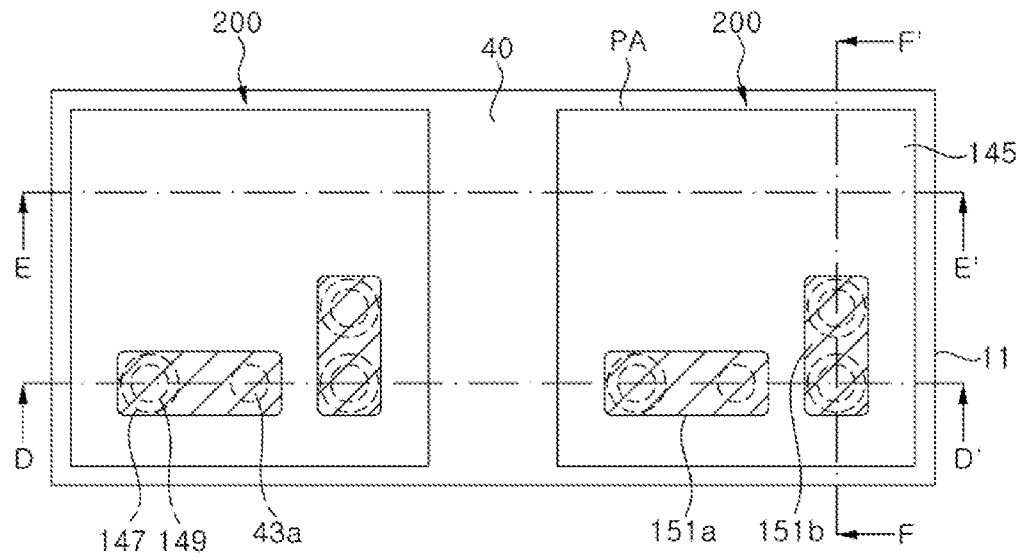
Figure 35B:
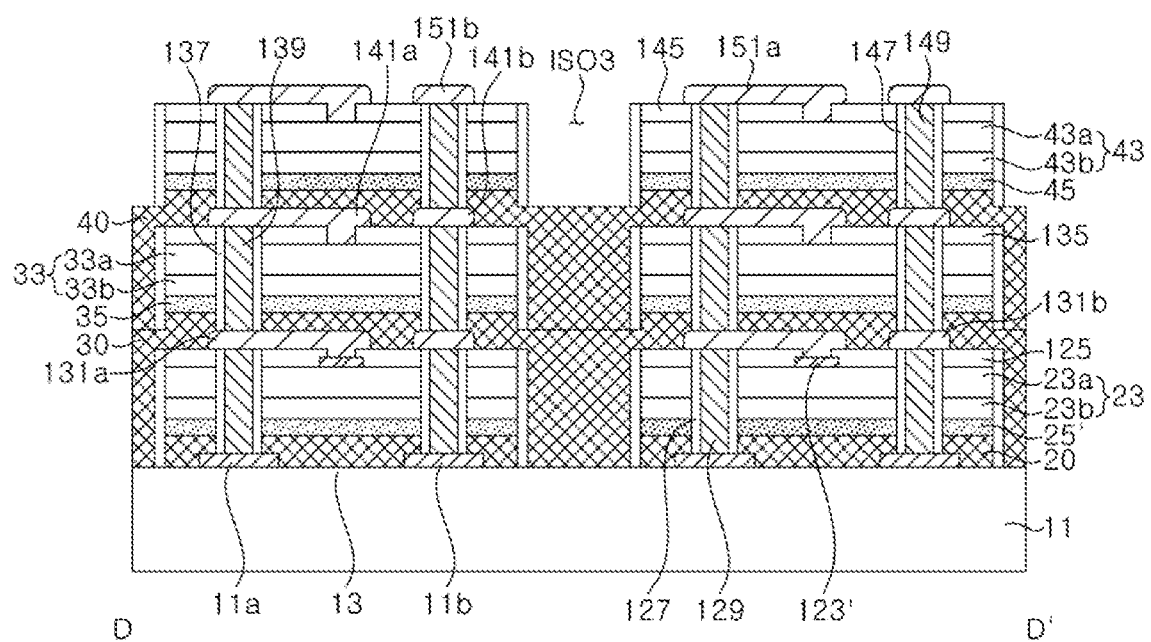
Figure 35C:
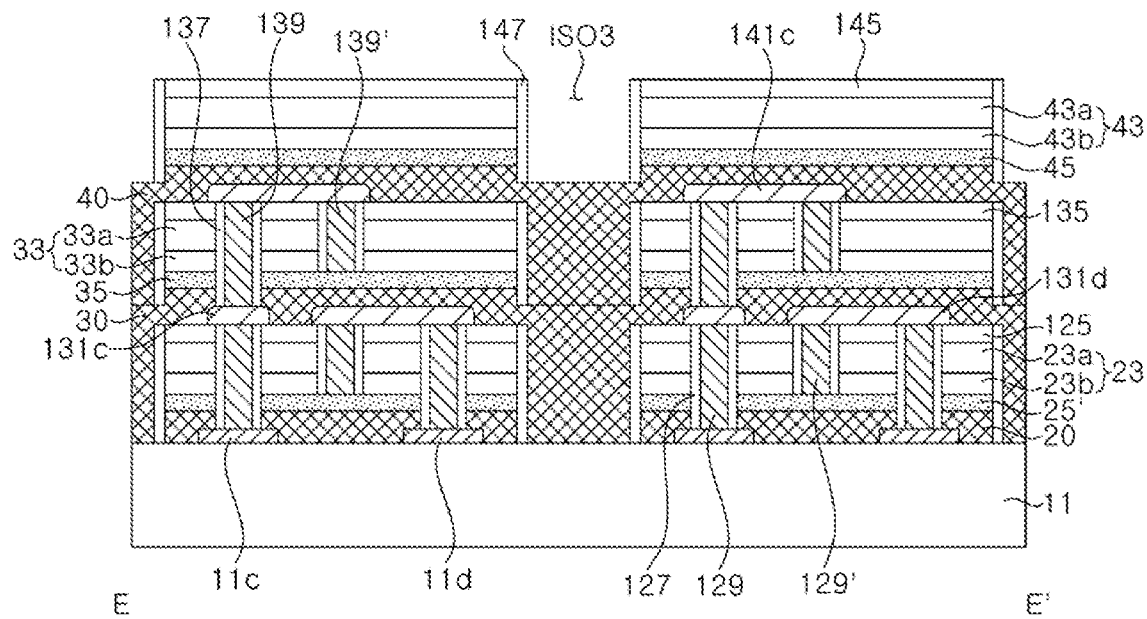
Figure 35D:
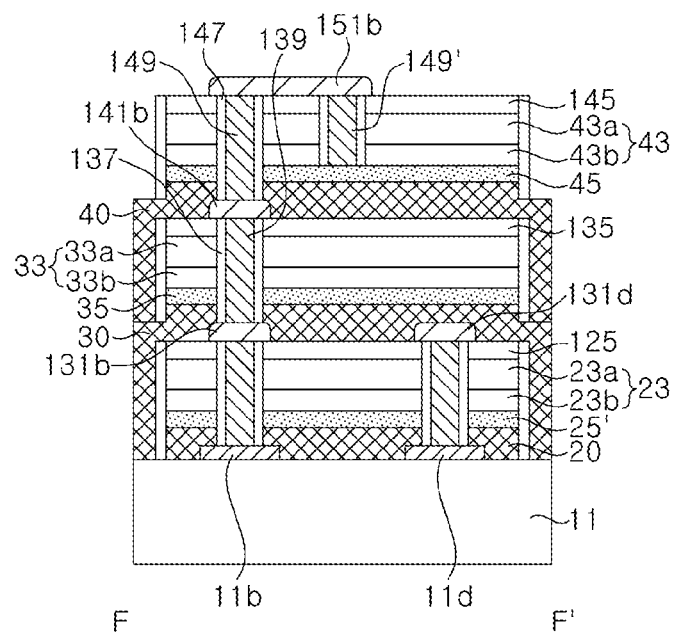

Referring to FIG. 34A, FIG. 34B, and FIG. 34C, a third sidewall insulation layer 147 and third through vias 149 and 149' are formed, and an opening 145a' exposing the first conductivity type semiconductor layer 43a is formed on the upper insulation layer 145. Since the processes of forming the third sidewall insulation layer 147, the third through vias 149 and 149', and the openings 145a' are substantially similar to those of forming the second sidewall insulation layer 137, the second through vias 139 and 139', and the opening 135a, repeated descriptions thereof will be omitted. However, the opening 145a' may be disposed relatively close to the third through via 149 electrically connected to the second connection pad 141a.

Referring to FIG. 35A, FIG. 35B, FIG. 35C, and FIG. 35D, third connection pads 151a and 151b are formed on the upper insulation layer 145. The third connection pads 151a and 151b may be formed using photolithography and etching processes or a lift-off technique.

The third connection pad 151a electrically connects the third through via 149 connected to the common pad 11a to the first conductivity type semiconductor layer 43a exposed through the opening 145a', and the third connection pad 151b electrically connects the third through via 149 connected to the pad 11b to the third through via 149' connected to the third transparent electrode 45.

As such, the light emitting devices 200 disposed on the circuit board 11, in particular, the pixel regions are formed. Subsequently, the circuit board 11 may be divided into an appropriate size, and accordingly, the display panel 2000 may be formed. Additionally, the device isolation region ISO3 may be filled with a light blocking material or a light reflecting material.

Figure 36A:
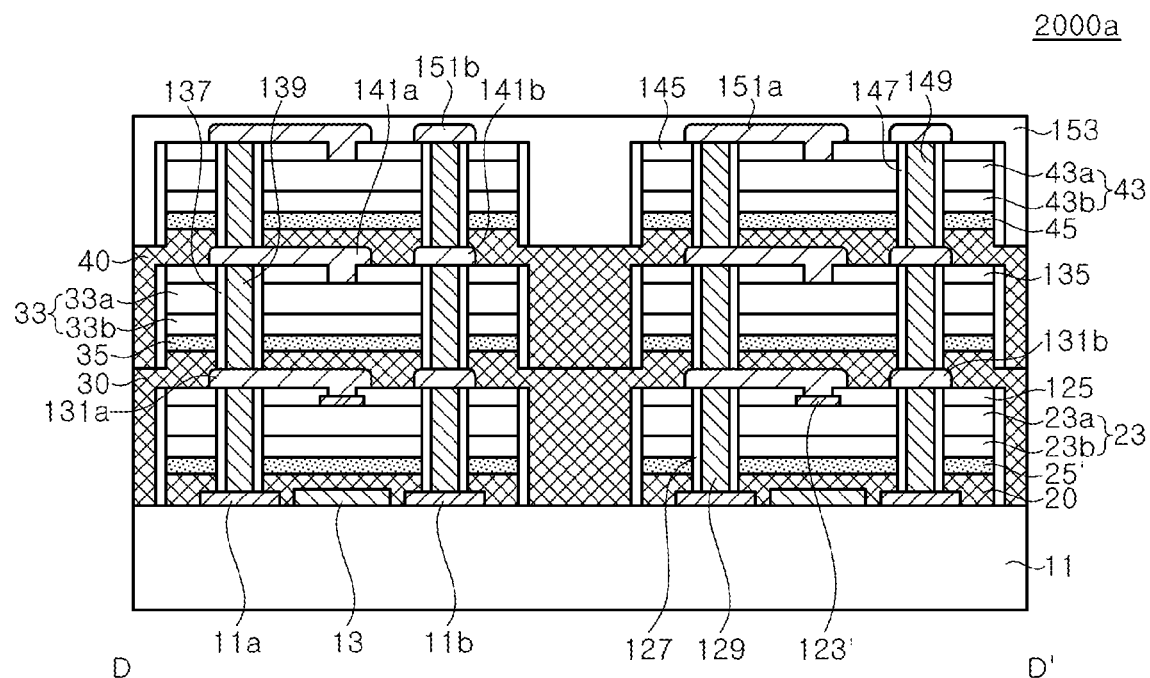
FIG. 36A, FIG. 36B, and FIG. 36C are schematic enlarged cross-sectional views of portions of a display panel according to another exemplary embodiment.
Figure 36B:
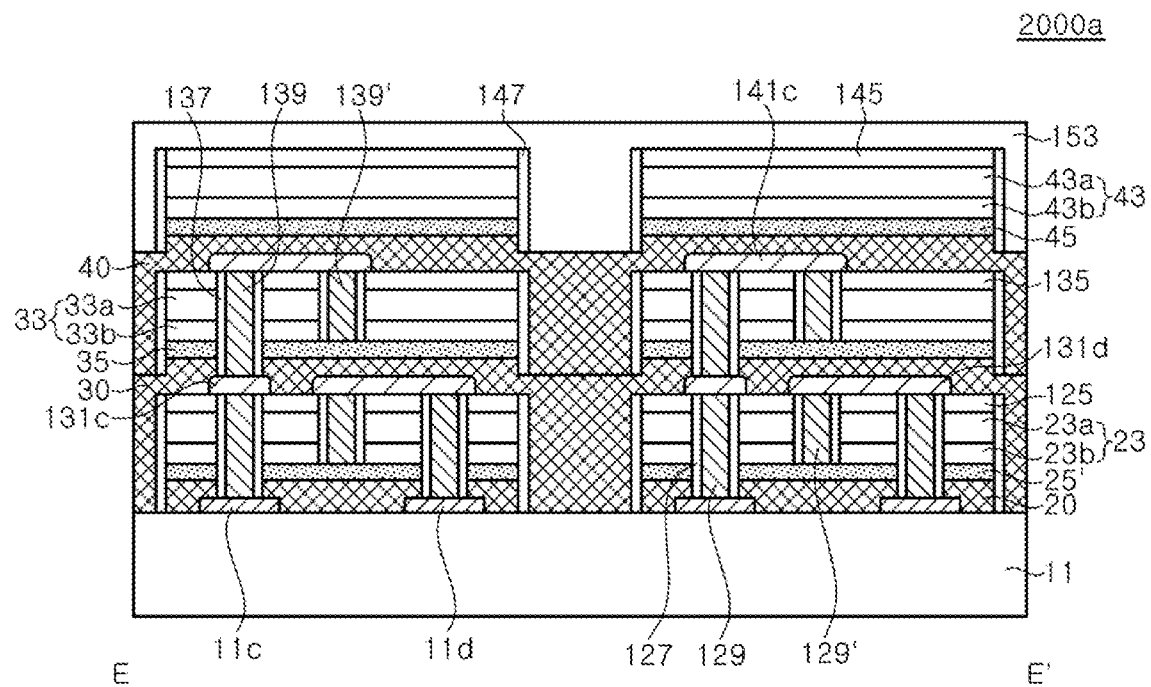
Figure 36C:
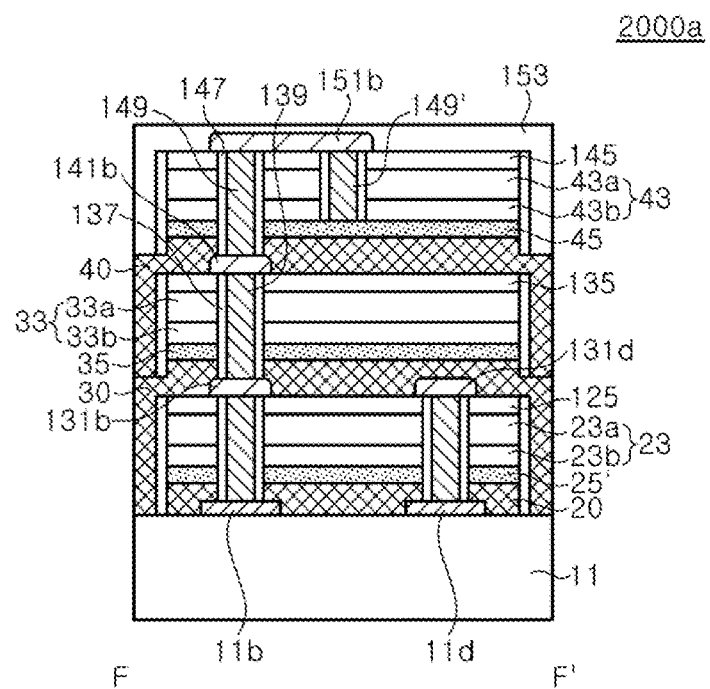

FIG. 36A, FIG. 36B, and FIG. 36C are schematic cross-sectional views illustrating a display panel 2000a according to another exemplary embodiment. FIG. 36A, FIG. 36B, and FIG. 36C correspond to cross-sectional views taken along lines D-D', E-E', and F-F' of FIG. 23A, respectively.

Referring to FIG. 36A, FIG. 36B, and FIG. 36C, the display panel 2000a according to the illustrated exemplary embodiment is substantially similar to the display panel 2000 described with reference to FIG. 23A, FIG. 23B, FIG. 23C, and FIG. 23D, but the display panel 2000a further includes a light absorbing layer 153.

The light absorbing layer 153 covers the third LED stack 43. The light absorbing layer 153 may also cover the upper insulation layer 145, the side wall insulation layer 147, and the third bonding layer 40. In particular, as illustrated in FIG. 36A, FIG. 36B, and FIG. 36C, the light absorbing layer 153 may cover substantially an entire upper surface of the display panel 2000a.

The light absorbing layer 153 may fill the device isolation region (ISO3 in FIG. 23B). A thickness of the light absorbing layer 153 disposed over the third LED stack 43 is less than a width of the device isolation region ISO3, and thus, absorption of light directed upward from the third LED stack 43 may be relatively smaller than absorption of light emitted from the side of the third LED stack 43.

The light absorbing layer 153 reduces light interference between adjacent sub-pixels, thereby improving the contrast of the display panel 2000a.

The light absorbing layer 153 may be formed of a black material, such as PDMA or black epoxy molding compound (EMC). For example, as described with reference to FIG. 35A, FIG. 35B, FIG. 35C, and FIG. 35D, after the third connection pads 151a and 151b are formed, the light absorbing layer 153 may be formed by applying a black material to cover the upper insulation layer 145, the side wall insulation layer 147, and the third connection pads 151a and 151b, and curing the black material.

Figure 37:
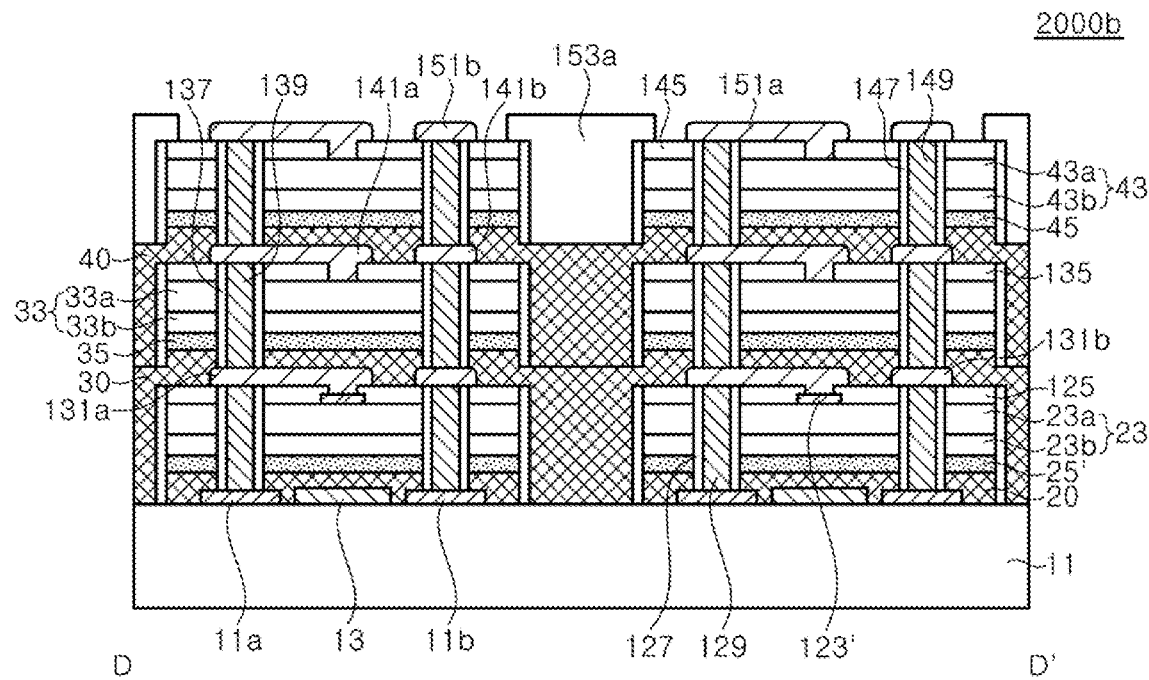
FIG. 37 is a schematic enlarged cross-sectional view of a portion of a display panel according to another exemplary embodiment.

FIG. 37 is a schematic cross-sectional view illustrating a display panel 2000b according to another exemplary embodiment.

The display panel 2000b according to the illustrated exemplary embodiment is substantially similar to the display panel 2000a described with reference to FIG. 36A, FIG. 36B, and FIG. 36C, except that a light absorbing layer 153a is patterned. Hereinafter, the display panel 2000b will be described with reference to FIG. 37, which may correspond to FIG. 36A.

Referring to FIG. 37, the light absorbing layer 153a may cover the third LED stack 43, which is similar to the light absorbing layer 153 described above, and may further cover the upper insulation layer 145 and the side wall insulation layer 147. Moreover, the light absorbing layer 153a may fill the device isolation region ISO3. However, the light absorbing layer 153a according to the illustrated exemplary embodiment may be patterned to have an opening defining a light emission region. As such, light interference between sub-pixels may be reduced to improve contrast, and light loss which may otherwise occur when the absorbing layer 153a absorbs light emitted upward through the third LED stack 43 can be reduced.

Figure 38:
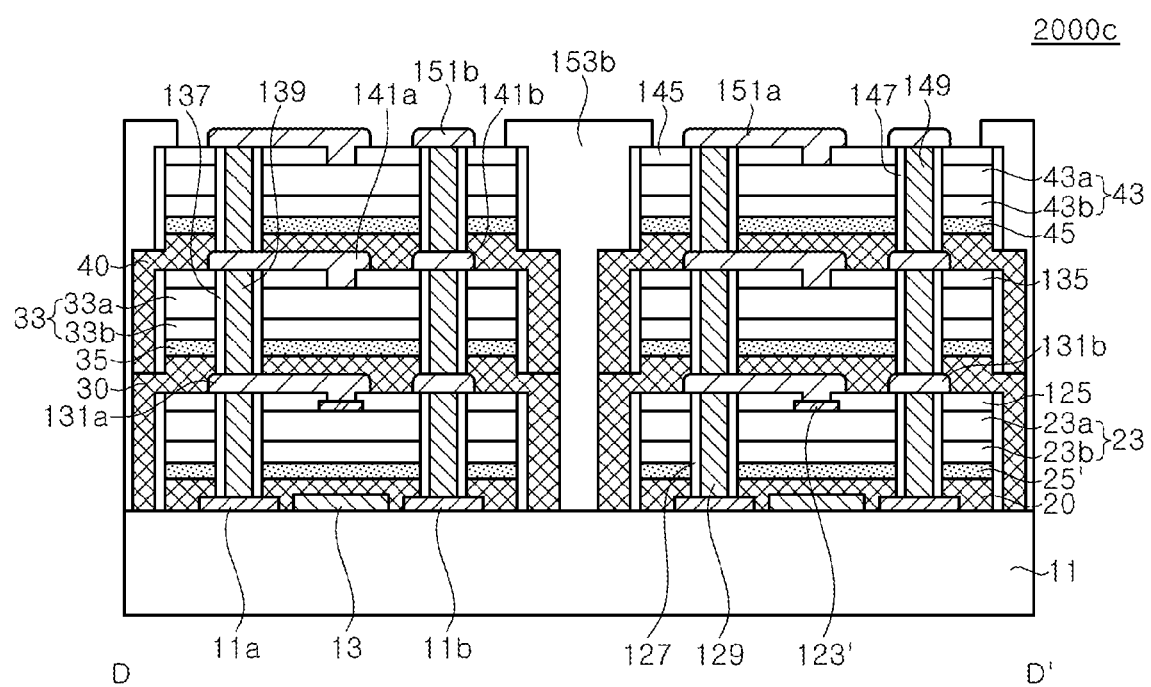
FIG. 38 is a schematic enlarged cross-sectional view of a portion of a display panel according to another exemplary embodiment.

FIG. 38 is a schematic cross-sectional view illustrating a display panel 2000c according to another exemplary embodiment.

The display panel 2000c according to the illustrated exemplary embodiment is substantially similar to the display panel 2000a described with reference to FIG. 36A, FIG. 36B, and FIG. 36C, except that a light absorbing layer 153b is formed in a region between sub-pixels. Hereinafter, the display panel 2000c will be described with reference to FIG. 38, which corresponds to FIG. 36A.

Referring to FIG. 38, the light absorbing layer 153b may cover the third LED stack 43, the upper insulation layer 145, and the side wall insulation layer 147, and fill the device isolation region ISO3, which is similar to the light absorbing layer 153 described above. In addition, the light absorbing layer 153b may be formed through the second bonding layer 30 and the third bonding layer 40 in a region between sub-pixels. As such, light interference between sub-pixels may be reduced, thereby improving contrast.

Furthermore, the light absorbing layer 153b, as described with reference to FIG. 37, may be patterned to have an opening defining a light emission region. As such, light loss which may otherwise occur when the absorbing layer 153b absorbs light emitted upward through the third LED stack 43 can be reduced.

The light absorbing layer 153b may be formed by partially removing the second bonding layer 30 and the third bonding layer 40 in a region between sub-pixel regions, then applying a black material, and curing it.

Although the display panels 2000a, 2000b, and 2000c of FIG. 36A, FIG. 36B, FIG. 36C, FIG. 37, and FIG. 38 according to the exemplary embodiments additionally include the light absorbing layers 153, 153a, and 153b from the display panel 2000 described with reference to FIG. 23A, FIG. 23B, FIG. 23C, and FIG. 23D, the light absorbing layers 153, 153a, and 153b may be also added to the display panel 1000 described with reference to FIG. 3A, FIG. 3B, FIG. 3C, and FIG. 3D.

According to the exemplary embodiments, although the light absorbing layers 153, 153a, and 153b are illustrated as being formed on two sub-pixels, the light absorbing layers 153, 153a, and 153b may be also formed on other sub-pixels, which are adjacent to these two sub-pixels. In addition, the light absorbing layers 153, 153a, and 153b may contact a light absorbing layer covering adjacent sub-pixels. Furthermore, the light absorbing layers 153, 153a, and 153b may be formed continuously on the display panels 2000, 2000a, 2000b, and 2000c by covering the region between sub-pixels.

According to the exemplary embodiments, since the first, second, and third LED stacks are stacked one above another, a light emitting area of each sub-pixel may be increased without increasing the pixel area.

In addition, since the first through vias pass through the first LED stack and are connected to the pads on the circuit board, the first through vias may be formed on the circuit board. In this manner, a process of transferring light emitting devices onto the circuit board using a bonding pad, such as a bump pad, may be obviated. As such, a reliability problem that may otherwise be generated in a mounting process of the light emitting device may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
   a circuit board having pads thereon;
   a light absorption layer; and
   a plurality of pixel regions arranged on the circuit board, each of the pixel regions comprising:
      a first LED stack disposed on the circuit board and including first and second conductivity type semiconductor layers;
      a first bonding layer disposed between the first LED stack and the circuit board;
      a second LED stack disposed on the first LED stack and including first and second conductivity type semiconductor layers;
      a third LED stack disposed on the second LED stack and including first and second conductivity type semiconductor layers;
      a first through-via electrically connected to the second conductivity type semiconductor layer of the first LED stack;
      a second through-via electrically connected to the second conductivity type semiconductor layer of the second LED stack; and
      a third through-via electrically connected to the second conductivity type semiconductor layer of the third LED stack,
   wherein the first through-via is connected to one of the pads of the circuit board,
   wherein the light absorption layer covers upper sides of the plurality of pixel regions and extends to a region between the plurality of pixel regions to physically connect the plurality of pixel regions,
   wherein a light emitted from the upper sides of the plurality of pixel regions enters into the light absorption layer, and
   wherein the light absorption layer covers substantially an entire upper surface of the circuit board.

2. The display panel of claim 1, further comprising a reflection layer disposed between the first LED stack and the circuit board.

3. The display panel of claim 2, wherein the reflection layer is spaced apart from the pads, and is located in a region surrounded by the pads of the circuit board under the first LED stack.

4. The display panel of claim 1, further comprising:
a second bonding layer disposed between the first LED stack and the second LED stack; and
a third bonding layer disposed between the second LED stack and the third LED stack, wherein:
the second through-via passes through the second bonding layer; and
the third through-via passes through the third bonding layer.

5. The display panel of claim 1, further comprising first connection pads disposed between the first LED stack and the second LED stack, wherein:
the first through-via is formed in plural;
a first one of the first connection pads electrically connects a first one of the first through-vias to the first conductivity type semiconductor layer of the first LED stack; and
a second one of the first connection pads electrically connects a second one of the first through-vias to the second conductivity type semiconductor layer of the first LED stack.

6. The display panel of claim 5, further comprising a first ohmic electrode in ohmic contact with the first conductivity type semiconductor layer of the first LED stack, wherein the first one of the first connection pads is electrically connected to the first conductivity type semiconductor layer of the first LED stack through the first ohmic electrode.

7. The display panel of claim 6, further comprising a first transparent electrode in ohmic contact with the second conductivity type semiconductor layer of the first LED stack between the first LED stack and the second LED stack, wherein the second one of the first connection pads is electrically connected to the second conductivity type semiconductor layer of the first LED stack through the first transparent electrode.

8. The display panel of claim 6, further comprising a lower electrode in ohmic contact with the second conductivity type semiconductor layer of the first LED stack between the first LED stack and the circuit board, wherein the second one of the first connection pads is electrically connected to the second conductivity type semiconductor layer of the first LED stack through the lower electrode.

9. The display panel of claim 8, wherein the lower electrode includes a reflection layer covering substantially an entire surface of the second conductivity type semiconductor layer of the first LED stack.

10. The display panel of claim 8, wherein: a third one of the first through-vias passes through the first LED stack and electrically connected to the lower electrode; and the second one of the first connection pads is connected to the third one of the first through-vias.

11. The display panel of claim 5, further comprising second connection pads disposed between the second LED stack and the third LED stack, wherein:
the second through-via is formed in plural;
a first one of the second connection pads electrically connects a first one of the second through-vias to the first conductivity type semiconductor layer of the second LED stack; and
a second one of the second connection pads electrically connects a second one of the second through-vias to the second conductivity type semiconductor layer of the second LED stack.

12. The display panel of claim 11, further comprising a second ohmic electrode in ohmic contact with the first conductivity type semiconductor layer of the second LED stack, wherein the first one of the second connection pads is electrically connected to the first conductivity type semiconductor layer of the second LED stack through the second ohmic electrode.

13. The display panel of claim 11, further comprising a second transparent electrode in ohmic contact with the second conductivity type semiconductor layer of the second LED stack, wherein the second one of the second connection pads is electrically connected to the second conductivity type semiconductor layer of the second LED stack through the second transparent electrode.

14. The display panel of claim 13, wherein: the second transparent electrode is disposed between the first LED stack and the second LED stack; a third one of the second through-vias passes through the second LED stack and is electrically connected to the second transparent electrode; and the second one of the second connection pads is connected to the third one of the second through-vias.

15. The display panel of claim 5, further comprising third connection pads disposed on the third LED stack wherein:
the third through-via is formed in plural;
a first one of the third connection pads electrically connects a first one of the third through-vias to the first conductivity type semiconductor layer of the third LED stack; and
a second one of the third connection pads electrically connects a second one of the third through-vias to the second conductivity type semiconductor layer of the third LED stack.

16. The display panel of claim 15, further comprising a third ohmic electrode in ohmic contact with the first conductivity type semiconductor layer of the third LED stack, wherein the first one of the third connection pads is electrically connected to the first conductivity type semiconductor layer of the third LED stack through the third ohmic electrode.

17. The display panel of claim 15, further comprising a third transparent electrode in ohmic contact with the second conductivity type semiconductor layer of the third LED stack, wherein the second one of the third connection pads is electrically connected to the second conductivity type semiconductor layer of the third LED stack through the third transparent electrode.

18. The display panel of claim 17, wherein: the third transparent electrode is disposed between the second LED stack and the third LED stack; a third one of the third through-vias passes through the third LED stack and is electrically connected to the third transparent electrode; and the second one of the third connection pads is connected to the third one of the through-vias.

19. The display panel of claim 1, further comprising: a lower insulation layer disposed between the first LED stack and the second LED stack; an intermediate insulation layer disposed between the second LED stack and the third LED stack; and an upper insulation layer disposed on the third LED stack, wherein the lower insulation layer, the intermediate insulation layer, and the upper insulation layer are disposed in upper regions of the first LED stack, the second LED stack, and the third LED stack, respectively.

20. The display panel of claim 1, wherein: the first, second, and third LED stacks are configured to be driven independently; light generated in the first LED stack is configured to be emitted to the outside through the second LED stack and the third LED stack; and light generated in the second LED stack is configured to be emitted to the outside through the third LED stack.

21. The display panel of claim 20, wherein the circuit board includes active circuits for active matrix driving.

22. A display apparatus, comprising:
   a display panel comprising a circuit board having pads thereon and a plurality of pixel regions arranged on the circuit board, each of the pixel regions comprising:
      a first LED stack disposed on the circuit board and including first and second conductivity type semiconductor layers;
      a first bonding layer disposed between the first LED stack and the circuit board;
      a second LED stack disposed on the first LED stack and including first and second conductivity type semiconductor layers;
      a third LED stack disposed on the second LED stack and including first and second conductivity type semiconductor layers;
      a first through-via electrically connected to the second conductivity type semiconductor layer of the first LED stack;
      a second through-via electrically connected to the second conductivity type semiconductor layer of the second LED stack; and
      a third through-via electrically connected to the second conductivity type semiconductor layer of the third LED stack; and
      a light absorption layer,
   wherein the first through-via is connected to one of the pads on the circuit board,
   wherein the light absorption layer covers upper sides of the plurality of pixel regions and extends to a region between the plurality of pixel regions to physically connect the plurality of pixel regions,
   wherein a light emitted from the upper sides of the plurality of pixel regions enters into the light absorption layer, and
   wherein the light absorption layer covers substantially an entire upper surface of the circuit board.

* * * * *